(12) United States Patent
Deliwala

(10) Patent No.: US 6,608,945 B2
(45) Date of Patent: Aug. 19, 2003

(54) SELF-ALIGNING MODULATOR METHOD AND ASSOCIATED APPARATUS

(75) Inventor: Shrenik Deliwala, Orefield, PA (US)

(73) Assignee: Optronx, Inc., Allentown, PA (US)

( * ) Notice: Subject to any disclaimer, the term of this patent is extended or adjusted under 35 U.S.C. 154(b) by 219 days.

(21) Appl. No.: 09/859,769

(22) Filed: May 17, 2001

(65) Prior Publication Data

US 2003/0026514 A1 Feb. 6, 2003

(51) Int. Cl.[7] .............................................. G02F 1/035
(52) U.S. Cl. .................... 385/2; 385/3; 385/8; 385/15; 385/27; 385/40; 385/50; 356/477; 359/161
(58) Field of Search .............................. 385/2, 3, 8, 10, 385/11, 15, 24, 27, 36, 40, 50; 356/477, 161

(56) References Cited

U.S. PATENT DOCUMENTS

| | | | |
|---|---|---|---|
| 4,000,937 A | * 1/1977 | Kaminow | ........................ 385/8 |
| 4,261,638 A | 4/1981 | Wagner | |
| 4,422,088 A | 12/1983 | Gfeller | |
| 4,677,783 A | 7/1987 | Cratsa | |
| 4,695,120 A | 9/1987 | Holder | |
| 4,705,346 A | * 11/1987 | Miyawaki | .................... 385/130 |
| 4,728,167 A | 3/1988 | Soref et al. | |
| 4,737,014 A | * 4/1988 | Green | ......................... 385/123 |
| 4,758,092 A | 7/1988 | Heinrich et al. | |
| 4,761,620 A | 8/1988 | Bar-Joseph et al. | |
| 4,787,691 A | 11/1988 | Lorenzo et al. | |
| 4,865,427 A | 9/1989 | Kingston et al. | |
| 4,871,224 A | 10/1989 | Karstensen et al. | |
| 4,904,039 A | 2/1990 | Soref | ......................... 385/14 X |
| 4,917,450 A | 4/1990 | Pocholle et al. | |
| 4,939,793 A | 7/1990 | Stewart | |

(List continued on next page.)

FOREIGN PATENT DOCUMENTS

| | | | |
|---|---|---|---|
| JP | 61-11708 | 1/1986 | ................ 385/14 X |
| JP | 2000-304956 | 11/2000 | ................ 385/14 X |
| WO | WO-98/35253 A1 | 8/1998 | |
| WO | WO-99/12062 A1 | 3/1999 | |
| WO | WO-99/15856 A1 | 4/1999 | |

(List continued on next page.)

OTHER PUBLICATIONS

Michael C. Parker et al., Applications of Active Arrayed–Waveguide Gratings in Dynamic WDM Networking and Routing, Journal of Lightwave Technology, vol. 18, No. 12, Dec. 2000.

(List continued on next page.)

*Primary Examiner*—Akm E. Ullah
*Assistant Examiner*—Jennifer Doan
(74) *Attorney, Agent, or Firm*—Morgan, Lewis & Bockius LLP

(57) ABSTRACT

A self-aligned optical modulator that modulates an input optical signal in order to generate a modulated output optical signal includes an optical modulator device including a waveguide, a first modulating electrode, a second modulating electrode, and a two-dimensional electron (hole) gas (2DEG) proximate the first modulating electrode, the waveguide includes an input port wherein the input optical signal is introduced into the waveguide, an output port wherein the modulated output optical signal exits the waveguide, and a region of modulating propagation constant disposed along a first length of the waveguide and between the input port and the output port, wherein the input optical signal is guided by total internal reflection in the waveguide, and the waveguide is formed at least in part from an active semiconductor. The first modulating electrode is positioned proximate a first surface of the region of modulating propagation constant and electrically separated from an active semiconductor.

57 Claims, 29 Drawing Sheets

U.S. PATENT DOCUMENTS

| | | |
|---|---|---|
| 4,966,430 A | 10/1990 | Weidel |
| 5,004,447 A | 4/1991 | Soref |
| 5,013,113 A | 5/1991 | Soref |
| 5,061,027 A | 10/1991 | Richard |
| 5,140,651 A | 8/1992 | Soref et al. |
| 5,153,770 A | 10/1992 | Harris |
| 5,157,538 A | 10/1992 | Soref |
| 5,159,700 A | 10/1992 | Reid et al. |
| 5,198,684 A | 3/1993 | Sudo |
| 5,260,592 A | 11/1993 | Mead et al. |
| 5,354,709 A | 10/1994 | Lorenzo et al. |
| 5,355,237 A | 10/1994 | Lang et al. ............. 359/130 |
| 5,400,419 A | 3/1995 | Heinen |
| 5,432,630 A | 7/1995 | Lebby et al. |
| 5,434,434 A | 7/1995 | Kasahara et al. |
| 5,444,567 A | 8/1995 | Kataoka |
| 5,459,799 A | 10/1995 | Weber |
| 5,485,021 A | 1/1996 | Abe |
| 5,502,779 A | 3/1996 | Magel |
| 5,514,885 A | 5/1996 | Myrick |
| 5,528,707 A * | 6/1996 | Sullivan et al. ............. 385/2 |
| 5,559,912 A | 9/1996 | Agahi et al. ............. 385/42 |
| 5,568,574 A | 10/1996 | Tanguay, Jr. et al. |
| 5,605,856 A | 2/1997 | Goosen et al. |
| 5,625,636 A | 4/1997 | Bryan et al. |
| 5,625,729 A | 4/1997 | Brown |
| 5,629,838 A | 5/1997 | Knight et al. |
| 5,638,469 A | 6/1997 | Feldman et al. |
| 5,682,455 A | 10/1997 | Kovacic et al. |
| 5,696,862 A | 12/1997 | Hauer et al. |
| 5,710,846 A | 1/1998 | Wayman et al. |
| 5,757,986 A | 5/1998 | Crampton et al. |
| 5,802,223 A * | 9/1998 | Nashimoto ............. 385/8 |
| 5,835,646 A | 11/1998 | Yishimura et al. |
| 5,838,870 A | 11/1998 | Soref ............. 385/131 |
| 5,844,822 A | 12/1998 | Yoshida ............. 364/578 |
| 5,864,642 A | 1/1999 | Chun et al. |
| 5,872,360 A | 2/1999 | Paniccia et al. |
| 5,875,271 A | 2/1999 | Laughlin |
| 5,878,175 A | 3/1999 | Sonoda et al. |
| 5,880,491 A | 3/1999 | Soref et al. |
| 5,908,305 A | 6/1999 | Crampton et al. |
| 5,926,601 A | 7/1999 | Tai et al. |
| 6,002,515 A | 12/1999 | Mizuuchi et al. |
| 6,016,374 A | 1/2000 | Adams et al. |
| 6,055,342 A * | 4/2000 | Yi et al. ............. 385/2 |
| 6,075,908 A | 6/2000 | Paniccia et al. |
| 6,088,496 A | 7/2000 | Asghari |
| 6,108,472 A | 8/2000 | Rickman et al. ............. 385/48 |
| 6,114,994 A | 9/2000 | Soref et al. |
| 6,122,419 A | 9/2000 | Kurokawa et al. |
| 6,163,632 A | 12/2000 | Rickman et al. |
| 6,166,846 A | 12/2000 | Maloney |
| 6,169,833 B1 | 1/2001 | Goossen et al. |
| 6,177,685 B1 | 1/2001 | Teraguchi et al. |
| 6,188,818 B1 | 2/2001 | Han et al. |
| 6,208,773 B1 | 3/2001 | Wickham et al. |
| 6,215,577 B1 | 4/2001 | Koehl et al. |
| 6,221,565 B1 | 4/2001 | Jain et al. |
| 6,222,689 B1 | 4/2001 | Higuchi et al. |
| 6,222,951 B1 | 4/2001 | Huang ............. 385/14 |
| 6,233,070 B1 | 5/2001 | Lu et al. |
| 6,236,778 B1 | 5/2001 | Laughlin |
| 6,242,324 B1 | 6/2001 | Kub et al. |
| 6,268,953 B1 | 7/2001 | Maloney |
| 6,282,357 B1 | 8/2001 | Kadota et al. |
| 6,316,281 B1 | 11/2001 | Lee et al. |
| 2001/0031112 A1 | 10/2001 | Frish et al. |
| 2001/0031113 A1 | 10/2001 | Frish et al. |
| 2002/0048422 A1 | 4/2002 | Cotteverte et al. ............. 383/4 |

FOREIGN PATENT DOCUMENTS

| | | |
|---|---|---|
| WO | WO-99/24867 A1 | 5/1999 |
| WO | WO-99/34485 A1 | 7/1999 |
| WO | WO-00/60433 A1 | 11/1999 |
| WO | WO-00/10039 A1 | 2/2000 |
| WO | WO-00/49451 A1 | 8/2000 |
| WO | WO-00/58776 A1 | 10/2000 |
| WO | WO-01/27670 A1 | 4/2001 |

OTHER PUBLICATIONS

Bardia Pezeshki et al., Vertical Cavity Devices as Wavelength Selective Waveguides, Journal of Lightwave Technology, vol. 12, No. 10, Oct. 1994.

Lucent Technologies, Bell Labs Innovations, Arrayed Waveguide Grating Multiplexer/Demultiplexer, Jan. 2000.

Robert Shi and Tomasz Jannson, Optical Interconnection Foundations and Applications, Chapter 5, Integrated Optical Waveguide Routing—Micro–optics, Artech House, pp. 141–225.

Amalia N. Miliou et al., A 1.3 $\mu$m Directional Coupler Polarization Splitter by Ion Exchange, Journal of Lightwave Technology, vol. 11, No. 2, Feb. 1993.

Gijs J. M. Krijnen et al., A New Method for the Calculation of Propagation constants and Field Profiles of Guided Modes of Nonlinear Channel Waveguides Based on the Effective Index Method, Journal of Lightwave Technology, vol. 12, No. 9, Sep. 1994.

Xiao, X. et al. Fabry–Perot Optical Intensity Modulator at 1.3mm in Silicon, IEEE Photonics Technology Letters, vol. 3, No. 3, Mar. 1991, pp. 230–231.

* cited by examiner

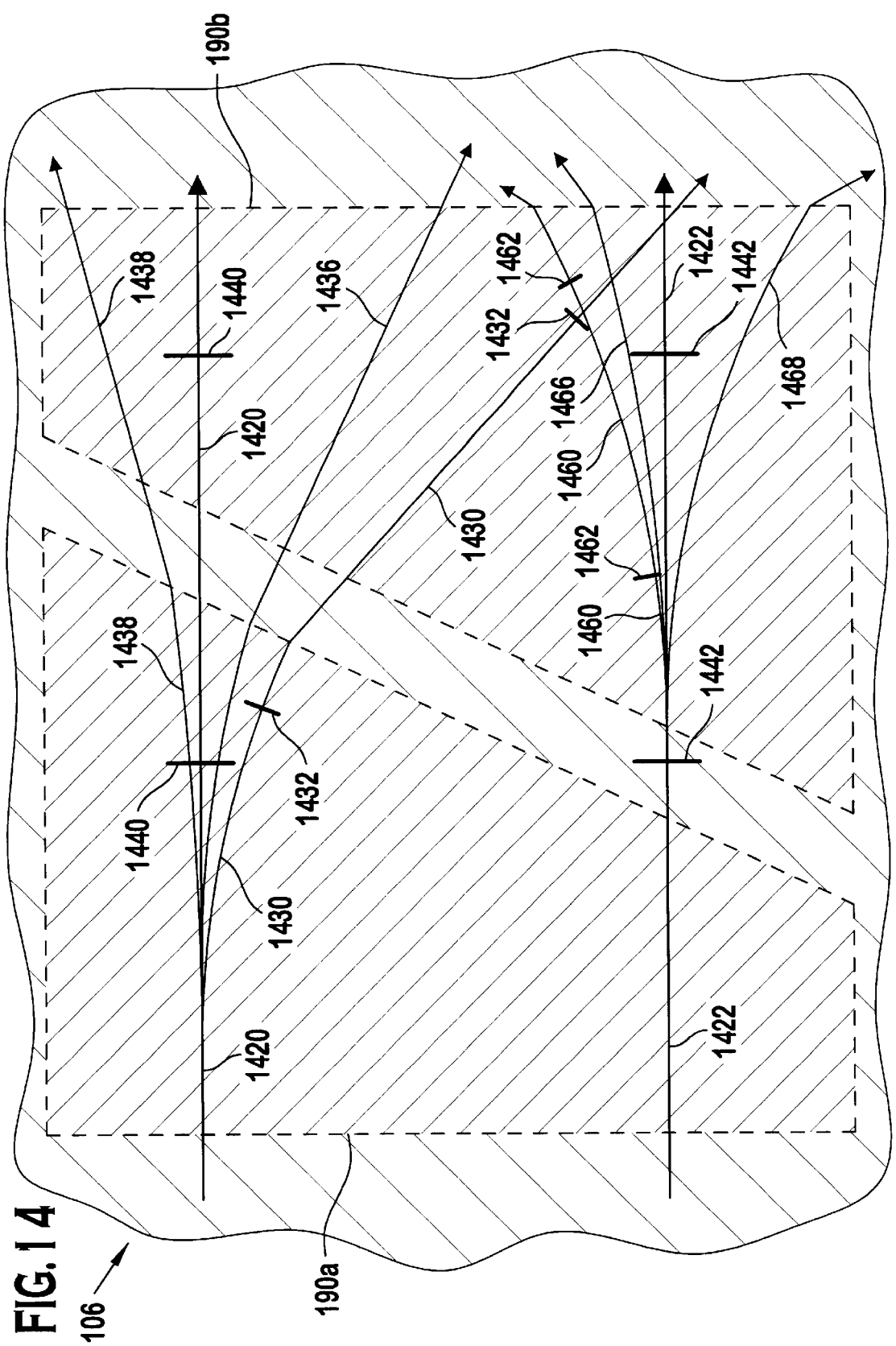

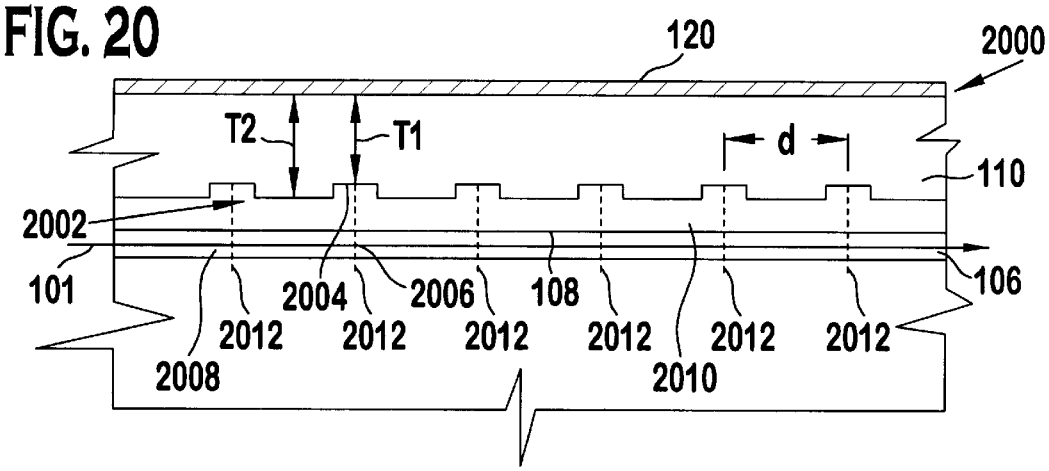
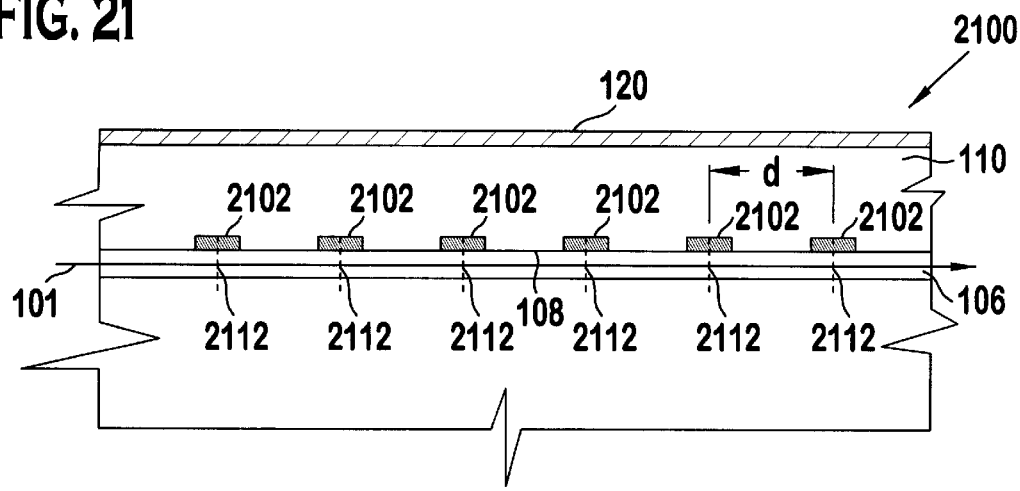
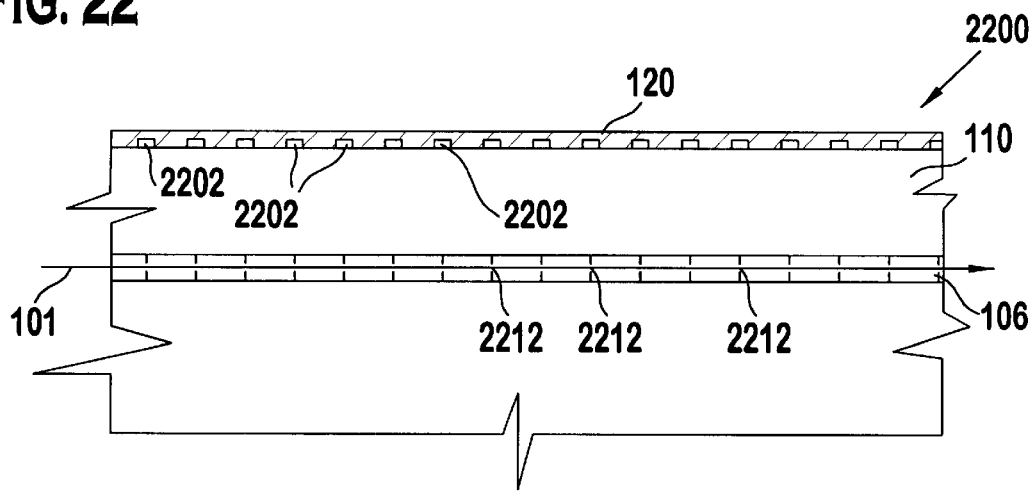

SELF-ALIGNING MODULATOR METHOD AND ASSOCIATED APPARATUS

FIELD OF THE INVENTION

This invention relates to optical devices, and more particularly to optical waveguide devices.

BACKGROUND OF THE INVENTION

In the integrated circuit industry, there is a continuing effort to increase device speed and increase device densities. Optical systems are a technology that promise to increase the speed and current density of the circuits. Optical devices, such as optical modulators are used in these optical systems. Such optical modulators can be used to perform a variety of functions in integrated circuits such as signal transmission and attenuation. Optical modulators typically require different devices to phase modulate or amplitude modulate light.

Optical devices that perform different functions are typically formed and shaped differently in order to perform the different functions. As such, each type of optical device, and each size of the same optical device type, has to be manufactured distinctly. Therefore, the production of precision optical devices is expensive. Additionally, optical devices are susceptible to changes in temperature, contact, pressure, humidity, etc. As such, the optical devices are typically contained in packaging that maintains the conditions under which the optical devices are operating. Providing such packaging is extremely expensive. Even if such packaging is provided, passive optical devices may be exposed to slight condition changes. As such, the passive optical devices perform differently under the different conditions. The modulators will modulate the light a different amount. If the characteristics of a passive optical device is altered outside of very close tolerances, then the optical device will not adequately perform its function. In other words, there is no adjustability for passive optical devices such as modulators.

It would therefore be desirable to provide an optical modulator that can both phase modulate and amplitude modulate, or a combination of the two, using the same device. Additionally, it would be desired to provide an optical device whose operation can be adjusted either to control the amount of modulation, or to compensate for changed parameters.

SUMMARY OF THE INVENTION

A self-aligned optical modulator that modulates an input optical signal in order to generate a modulated output optical signal includes an optical modulator device including a waveguide, a first modulating electrode, a second modulating electrode, and a two-dimensional electron (hole) gas (2DEG) proximate the first modulating electrode, the waveguide includes an input port wherein the input optical signal is introduced into the waveguide, an output port wherein the modulated output optical signal exits the waveguide, and a region of modulating propagation constant disposed along a first length of the waveguide and between the input port and the output port, wherein the input optical signal is guided by total internal reflection in the waveguide, and the waveguide is formed at least in part from an active semiconductor. The first modulating electrode is positioned proximate a first surface of the region of modulating propagation constant and electrically separated from an active semiconductor. The second modulating electrode is in electrical contact with the active semiconductor and disposed on a first side of the region of modulating propagation. The two-dimensional electron (hole) gas (2DEG) proximate the first modulating voltage is applied between the first modulating electrode and the second modulating electrode, wherein modulation of the voltage by the optical modulation device causes a corresponding modulation of the free carrier distribution which, in turn, causes corresponding modulation of a propagation constant level in the region of modulating propagation constant. A first deflector deflects light in a first lateral direction within the waveguide, and a second deflector configured to deflect light in a second lateral direction towards the waveguide wherein the deflection of the first deflector or the second deflector acts to direct light approaching the region of modulating propagation constant towards the region of modulating propagation constant.

BRIEF DESCRIPTION OF THE DRAWINGS

The accompanying drawings, which are incorporated herein and constitute part of this specification, illustrate the presently preferred embodiment of the invention, and, together with the general description given above and the detailed description given below, serve to explain features of the invention.

FIG. 14 shows a top cross sectional view of the waveguide of the embodiment of prism-shaped gate array of FIG. 13 including dotted lines representing a region of changeable propagation constant. The solid light rays are shown passing through the regions of changeable propagation constant corresponding to the prism-shaped gate array;

FIG. 15, including FIG. 15A shows both gate electrodes 1304, 1306 being deactivated, FIG. 15B shows the gate electrode 1304 being actuated as the gate electrode 1306 is deactivated, FIG. 15C shows the gate electrode 1304 being deactuated as the gate electrode 1306 is activated, and FIG. 15D shows both gate electrodes 1304 and 1306 being actuated;

FIG. 20 shows one embodiment of a Bragg grating formed in one of the optical waveguide devices shown in FIGS. 1–3 and 5;

FIG. 21 shows another embodiment of a Bragg grating formed in one of the optical waveguide devices shown in FIGS. 1–3 and 5;

FIG. 22 shows yet another embodiment of a Bragg grating formed in one of the optical waveguide devices shown in FIGS. 1–3 and 5;

DETAILED DESCRIPTION OF THE EMBODIMENT

The present disclosure provides multiple embodiments of optical waveguide devices in which light travels within a waveguide. Different embodiments of optical waveguide devices are described that perform different functions to the light contained in the waveguide. Altering the shape or structure of an electrode(s) can modify the function of the optical waveguide device 100.

Figure 1:
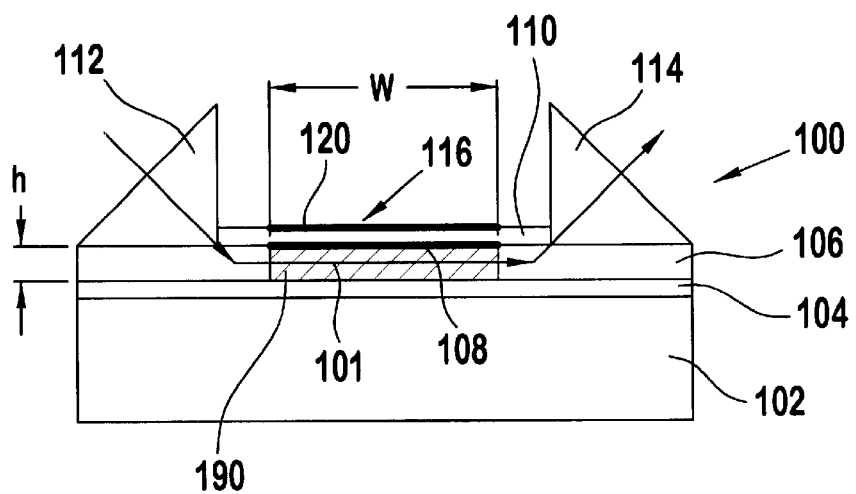
FIG. 1 shows a front cross sectional view of one embodiment of an optical waveguide device including a field effect transistor (FET)
Figure 2:
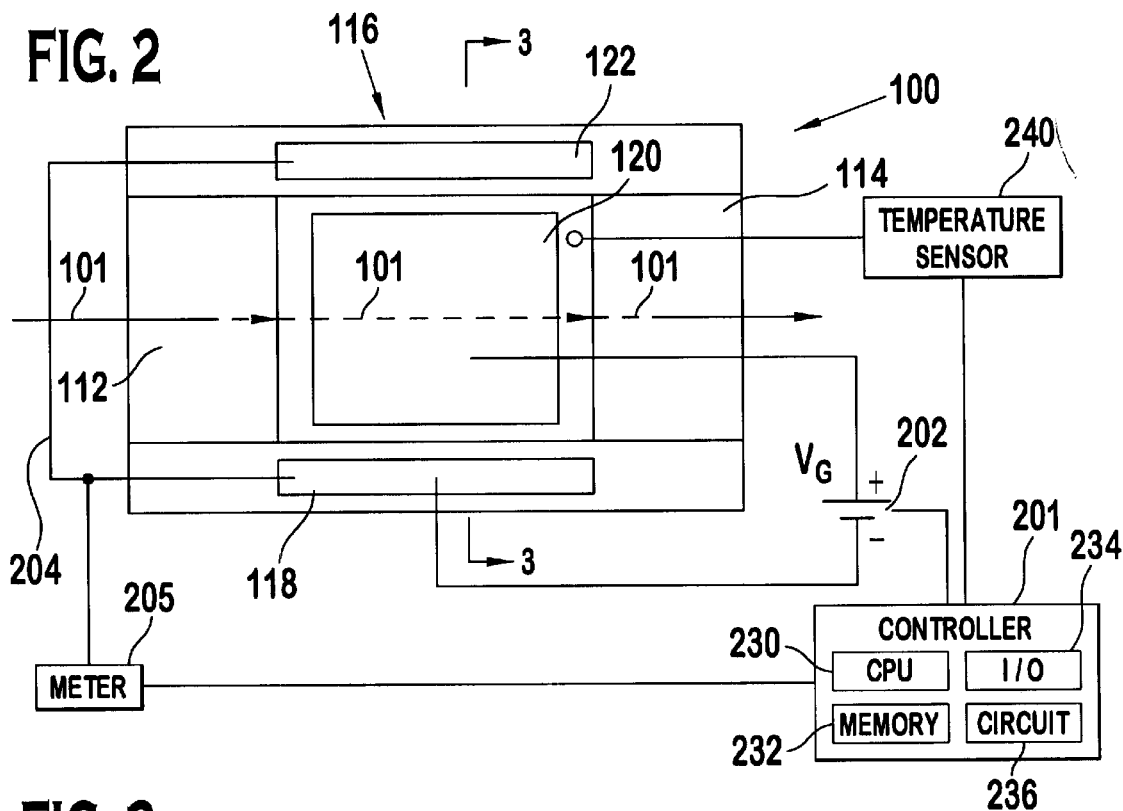
FIG. 2 shows a top view of the optical waveguide device shown in FIG. 1.
Figure 3:
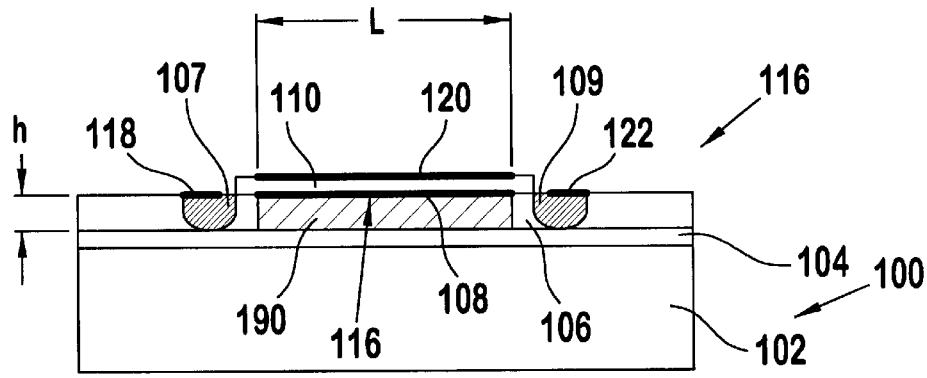
FIG. 3 shows a section view as taken through sectional lines 3—3 of FIG. 2.
Figure 4:
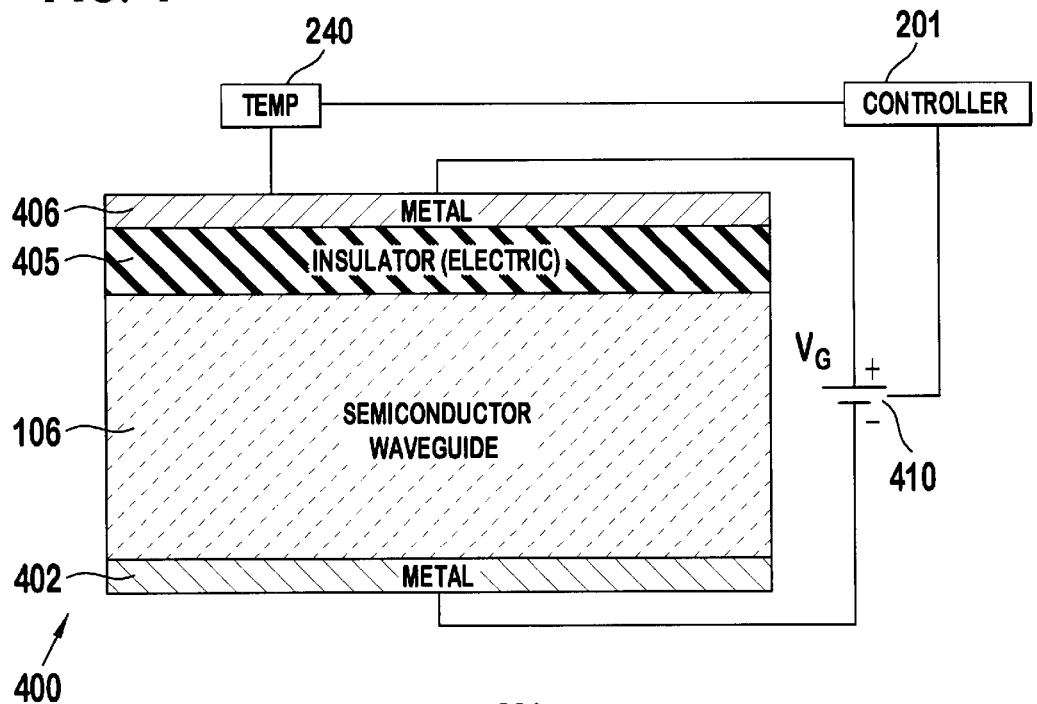
FIG. 4 shows a front cross sectional view of one embodiment of an optical waveguide device including a metal oxide semiconductor capacitor (MOSCAP)
Figure 5:
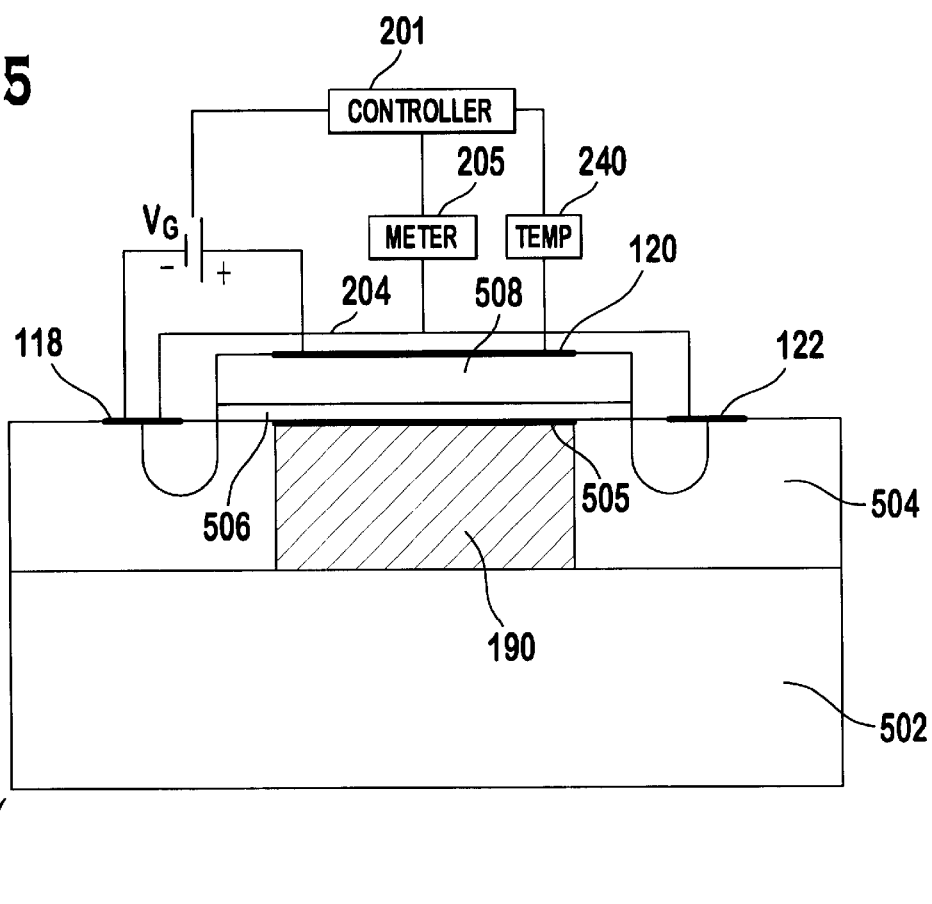
FIG. 5 shows a front view of another embodiment of an optical waveguide device including a high electron mobility transistor (HEMT)

There are a variety of optical waveguide devices 100 that are described in this disclosure. Embodiments of optical waveguide devices include a waveguide located in a Field Effect Transistor (FET) structure as shown in FIGS. 1 to 3; a waveguide associated with metal oxide semiconductor capacitor (MOSCAP) structure is shown in FIG. 4; and a waveguide located in the High Electron Mobility Transistor (HEMT) as shown in FIG. 5. In MOSCAPs, one or more body contact(s) is/are separated from the gate electrode by a semiconductor waveguide and an electrical insulator. In the embodiment of FETs applied to the present invention, a substantially constant potential conductor is applied between the source electrode and the drain electrode to maintain the two electrodes at a common voltage. When the source electrode of a FET is held at the same potential as the drain electrode, the FET functionally operates as, and may be considered structurally to be, a MOSCAP. To make the description for the above embodiments more uniform, the term "body contact electrodes" is used to describe either the body contact at the base of the MOSCAP or the substantially common potential source electrode and drain electrode in the FET.

The application of the voltage between the gate and body contact(s) predominantly changes the distribution of free-carriers (either electrons or holes) near the semiconductor/electrical insulator boundary. These essentially surface localized changes in the free carrier distributions are referred to as two-dimensional electron gas or 2DEG included in MOSCAPs. In a FET structure, for example, an increase in the application of the bias leads consecutively to accumulation of charges (of the same type as the semiconductor i.e. holes in a p-type and electrons in n-type, depletion, and finally inversion. In 2DEGs, the polarity of semiconductor is opposite the type of the predominant free carriers, i.e. electrons in p-type or holes in n-type). In a High Electron Mobility Transistor (HEMT), the electron (hole) distribution formed just below the surface of the electrical insulator is referred to as 2DEG because of particularly low scattering rates of charge carriers. At any rate, for the purposes of clarity, all of the above shall be referred to as 2DEG signifying a surface localized charge density change due to application of an external bias.

The term "semiconductor" is used through this disclosure in particular reference to the waveguides of the particular optical waveguide devices. The semiconductor waveguide is intended to represent a class of semiconductor materials. Silicon and Germanium are natural single element semiconductors at room temperature. GaAs and InP are examples of binary compound semiconductors. There are semiconductors made from three element semiconductors such as AlGaAs. The salient feature of all semiconductors is the existence of a band-gap between the valence and the conduction band. Multiple layers of semiconductors may also be used in the construction of a waveguide as well as to create an optical waveguide device including a MOSCAP, a FET, or a HEMT. For the purpose of this disclosure, the semiconductor provides the ability to control the density of the 2DEG by the application of the gate voltage. Any description of a specific semiconductor in this disclosure is intended to be enabling, exemplary, and not limiting in scope. The concepts described herein are intended to apply to semiconductors in general.

These concepts relating to the optical waveguide device apply equally well to any mode of light within a waveguide. Therefore, different modes of light can be modulated using multi-mode waveguides. The physical phenomena remains as described above for multi-mode waveguides.

I. Optical Waveguide Device

The embodiments of optical waveguide device 100 shown in multiple figures including FIGS. 1–3, and 5, etc. include a field effect transistor (FET) portion 116 that is electrically coupled to a waveguide 106. One embodiment of the waveguide is fabricated proximate to, and underneath, the gate electrode of the FET portion 116. The waveguide is typically made from silicon or another one or plurality of III–V semiconductors. The FET portion 116 includes a first body contact electrode 118, a gate electrode 120, and a second body contact electrode 122. A voltage can be applied by e.g., a voltage source 202 to one of the electrodes. The gate electrode 120 is the most common electrode in which the voltage level is varied to control the optical waveguide device.

The variation in voltage level changes the propagation constant of at least a portion of the waveguide 106. The changes in the index profile of the waveguide are determined by the location and shapes of all the electrodes. The density of the 2DEG generally follows the shape of the gate electrode 120. Therefore, the shape of the gate electrode may be considered as being projected into a region of changeable propagation constant 190 (the value of the propagation constant may vary at different locations on the waveguide 106). The region of changeable propagation constant 190 is considered to be that region through the height of the waveguide in which the value of the propagation constant is changed by application of voltage to the gate electrode 120. Gate electrodes 120 are shaped in non-rectangular shapes (as viewed from above or the side depending on the embodiment) in the different embodiments of optical waveguide device. The different embodiments of the optical waveguide device perform such differing optical functions as optical phase/amplitude modulation, optical filtering, optical deflection, optical dispersion, etc. Multiple ones of the optical waveguide devices can be integrated into a single integrated optical circuitry as an arrayed waveguide (AWG), a dynamic gain equalizer, and a large variety of integrated optical circuits. Such optical waveguide devices and integrated optical circuits can be produced using largely existing CMOS and other semiconductor technologies.

FIGS. 1 to 3 will now be described in more detail, and respectively show a front, top, and side view of one embodiment of an optical waveguide device 100. FIG. 1 shows a planar semiconductor waveguide bounded by low-index insulating materials to which the light is coupled using a prism coupler 112. Other well-known types of coupling include gratings, tapers, and butt-coupling that are each coupled to the end of the waveguide. The "gate" electrode 120 is positioned directly above the light path in the semiconductor waveguide. The gate electrode is separated from the semiconductor by the low-index dielectric acting as an electrical insulator. The body contact electrodes are electrically coupled to the semiconductor. This embodiment may be considered to be a FET structure with the body contact electrodes 118, 122 forming a symmetric structure typically referred to as "source" and "drain" in FET terminology. A substantially constant potential conductor 204 equalizes the voltage level between the first body contact electrode 118 and the second body contact electrode 122. The first body contact electrode and the second body contact electrode can thus be viewed as providing symmetrical body contact electrodes to the semiconductor. In another embodiment, the body contact is placed directly underneath the light path and underneath the waveguide.

In yet another embodiment, the body contact is positioned symmetrically laterally of both sides of, and underneath, the incident light path within the waveguide. The body contact in each of these embodiments is designed to change a free-carrier distribution region in a two dimensional electron gas (2DEG) 108 near the semiconductor/electrical insulator boundary of the waveguide along the light travel path. This change in free-carrier distribution results from application of the potential between the insulated gate electrode and the one or plurality of body contact electrodes connected to the body of the semiconductor.

The FIG. 1 embodiment shows the optical waveguide device 100 including an integrated field effect transistor (FET) portion 116. The field effect transistor (FET) portion 116 includes the gate electrode 120, the first body contact electrode 118, and the second body contact electrode 122, but the channel normally associated with a FET is either replaced by, or considered to be, the waveguide 106. Examples of FETs that can be used in their modified form as FET portions 116 (by using the waveguide instead of the traditional FET channel) include a metal-oxide-semiconductor FET (MOSFET), a metal-electrical insulator-semiconductor FET (MISFET), a metal semiconductor FET (MESFET), a modulation doped FET (MODFET), a high electron mobility transistor (HEMT), and other similar transistors. In addition, a metal-oxide-silicon capacitor (MOSCAP) may also be similarly modified to form a FET portion.

FIGS. 1, 2, and 3 shows one embodiment of optical waveguide device 100 that includes a substrate 102, a first electrical insulator layer 104, a waveguide 106, a first body contact well 107, a second body contact well 109, the 2DEG 108, a second electrical insulator layer 110, an input prism 112, an output prism 114, and the field effect transistor (FET) portion 116. The 2DEG 108 is formed at the junction between the silicon waveguide 106 and the second electrical insulator layer 110 of the waveguide 106. Multiple embodiments of optical waveguide devices are described that, upon bias of the gate electrode 120 relative to the combined first body contact electrode 118 and second body contact electrode 122, effect the passage of light through the waveguide 106 to perform a variety of functions.

Figure 12:
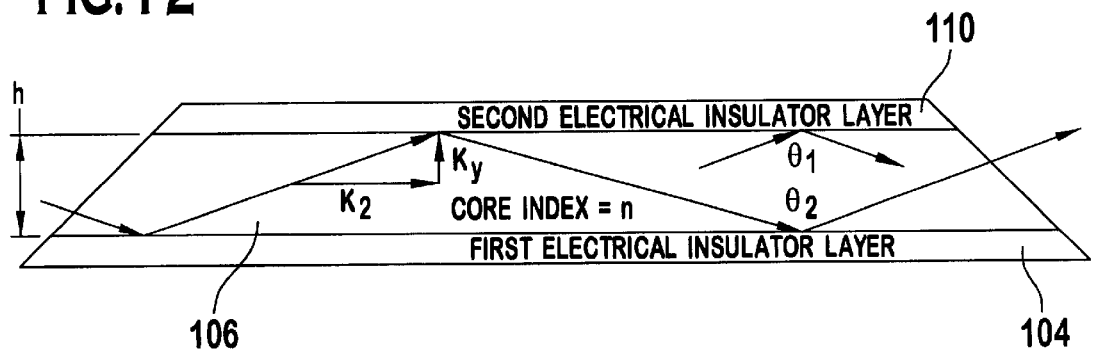
FIG. 12 shows one embodiment of a wave passing though a dielectric slab waveguide.

The FIG. 12 embodiment of semiconductor waveguide (which may be doped) 106 has a thickness h, and is sandwiched between the first electrical insulator layer 104 and the second electrical insulator layer 110. The first electrical insulator layer 104 and the second electrical insulator layer 110 are each typically formed from silicon dioxide (glass) or any other electrical insulator commonly used in semiconductors, for example SiN. The electrical insulator layers 104, 110 confine the light using total internal reflection of the light traversing the waveguide 106.

Light is injected into the waveguide 106 via the input prism 112 and light exits from the waveguide 106 via the output prism 114, although any light-coupling device can be used to respectively inject or remove the light from the waveguide 106. Examples of light-coupling devices include prisms, gratings, tapers, and butt-couplings. Light passing from the input prism (or other input port) to the output prism (or other output port) follows optical path 101 as shown in FIG. 1. The optical path 101 may be defined based upon the function of the optical waveguide device 100. For example, if the optical waveguide device functions as an optical modulator, optical deflector, or an optical filter, the optical path 101 can be respectively considered to be an optical modulation region, an optical deflection region, or an optical filtering region, etc.

As described earlier, application of voltage on the gate electrode 120 relative to the combined first body contact electrode 118 and second body contact electrode 122 leads to a change in the propagation constant via changes induced in the free-carrier density distribution 108. In a MOSCAP, the capacitance of the device is controlled by the voltage due to presence (or absence) of 2DEG. In case of a FET, changes in the free carrier distribution also control the conductance between the first body contact electrode and the second body contact electrode. The free-carriers are responsible for changing the optical phase or the amplitude of the guided wave depending on their density which in turn is controlled by the gate voltage. The basis of field-effect transistor action, i.e., rapid change in 2DEG as a function of gate voltage, is also responsible for the control of the light wave and enables integration of electronic and optical functions on the same substrate. Thus traditional FET electronic concepts can be applied to provide active optical functionality in the optical waveguide device 100. The FET portion 116 is physically located above, and affixed to, the waveguide 106 using such semiconductor manufacturing techniques as epitaxial growth, chemical vapor deposition, physical vapor deposition, etc.

The propagation constant (and therefore the effective mode index) of at least a portion of the waveguide in the optical waveguide device 100 is changed as the free carrier distribution 108 changes. Such changing of the propagation constant results in phase modulation of the light passing through that device. The phase modulation occurs in a regions of changeable propagation constant, indicated in cross-hatching in FIGS. 1 and 3 as 190, that closely follows the two-dimensional planar shape of the gate electrode through the height of the waveguide to form a three dimensional shape.

FIG. 2 shows one embodiment of a voltage source configuration that biases the voltage of the optical waveguide device 100 by using a voltage source 202 and a substantially constant potential conductor 204. The substantially constant potential conductor 204 acts to tie the voltage level of the first body contact electrode 118 to the voltage level of the second body contact electrode 122. The voltage source 202 biases the voltage level of the gate electrode 120 relative to the combined voltage level of the first body contact electrode 118 and the second body contact electrode 122.

To apply a voltage to the gate electrode, a voltage source 202 applies an AC voltage $v_g$ from the gate electrode 120 to the combined first body contact electrode 118 and second body contact electrode 122. The AC voltage $v_g$ may be configured either as a substantially regular (e.g. sinusoidal) signal or as an irregular signal such as a digital data transmission. In one embodiment, the AC voltage $v_g$ may be considered as the information carrying portion of the signal. The voltage source 202 can also apply a DC bias $V_g$ to the gate electrode 120 relative to the combined first body contact electrode 118 and second body contact electrode 122. Depending on the instantaneous value of the $V_g$, the concentration of the 2DEG will accumulate, deplete, or invert as shown by the different regions in FIG. 6. In one embodiment, the DC bias $V_g$ is the signal that compensates for changes in device parameters. The combined DC bias $V_g$ and AC voltage $v_g$ equals the total voltage $V_G$ applied to the gate electrode by the voltage source 202. It will be understood from the description above that modulation of $v_g$ can thus be used to effect, for example, a corresponding modulation of light passing through the waveguide 106.

The voltage potential of the first body contact electrode 118 is tied to the voltage potential of the second body contact electrode 122 by the substantially constant potential conductor 204. Certain embodiments of the substantially constant potential conductor 204 include a meter 205 (e.g. a micrometer) to measure the electrical resistance of the gate electrode from the first body contact electrode to the second body contact electrode. The term "substantially" is used when referring to the constant potential conductor because the meter 205 may generate some relatively minor current levels in comparison to the operating voltage and current levels applied to the optical waveguide device. The minor current levels are used to measure the resistance of the gate electrode. The current level produced by the meter is relatively small since the voltage (typically in the microvolt range) of the meter is small, and the waveguide resistance is considerable (typically in the tens of ohms).

The electrical resistance of the gate electrode is a function of such parameters as gate voltage, temperature, pressure, device age, and device characteristics. As such, the voltage (e.g. the AC voltage or the DC voltage) applied to the gate electrode can be varied to adjust the electrical resistance of the gate electrode to compensate for such parameters as temperature, pressure, device age, and/or device characteristics. Therefore, the voltage applied to the gate electrode can be adjusted to compensate for variations in the operating parameters of the optical waveguide device.

As the temperature of the optical waveguide device varies, the DC bias $V_g$ applied to the gate electrode 120 of the optical waveguide device is adjusted to compensate for the changed temperature. Other parameters (pressure, device age, device characteristics, etc.) can be compensated for in a similar manner as described for temperature (e.g. using a pressure sensor to sense variations in pressure). This disclosure is not limited to discussing the sensing and compensating for temperature since the other parameters can be compensated for in a similar manner. Different meter 205 and/or controller 201 embodiments may be provided to compensate for the different temperatures.

Figure 7:
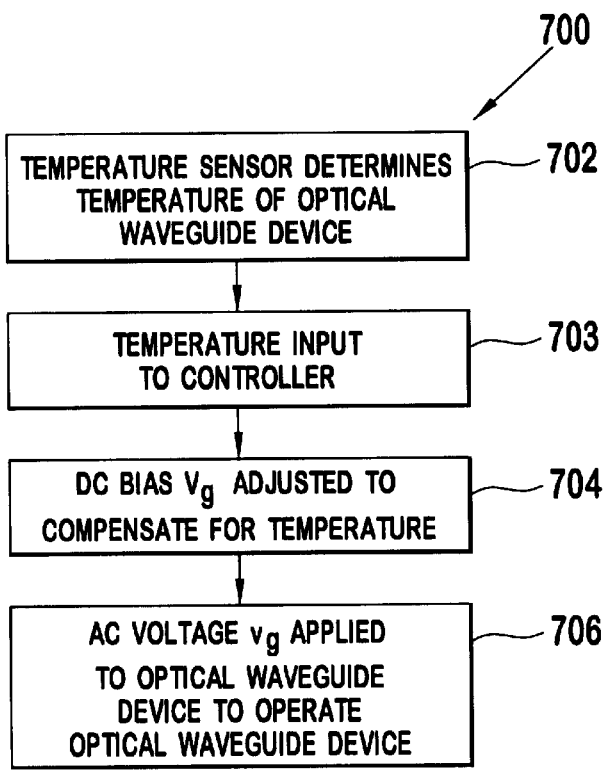
FIG. 7 shows one embodiment of a method to compensate for variations in temperature, or other such parameters, in an optical waveguide device.

FIG. 7 shows an embodiment of method 700 that compensates for temperature variations in an optical waveguide device. The method 700 starts with step 702 in which the temperature sensor 240 determines the temperature of the optical waveguide device. The temperature sensor 240 can be located either on the substrate or off the substrate. The temperature sensor inputs the temperature determined by the temperature sensor to the controller 201 in step 703. The method 700 continues to step 704 in which the DC bias $V_g$ that is applied to the gate electrode is adjusted to compensate for variations in the temperature. The controller 201 includes stored information that indicates the required change in DC bias $\Delta V_g$ that is necessary to compensate for variations in temperature, for each value of DC bias $V_g$ for each temperature within the operating range of the optical waveguide device. The method 700 continues to step 706 in which the AC voltage $v_g$ is applied to operate the optical waveguide device as desired in the waveguide.

The amount of AC voltage $v_g$ is then superimposed on the DC bias $V_g$ that is applied to the gate electrode to provide for the desired operation of the optical waveguide device 200 (e.g. the voltage necessary for optical modulation, optical filtering, optical focusing, etc.). The AC voltage $v_g$ superimposed on the combined DC bias $V_g$ and the DC bias change $\Delta DC$ yields the total signal $V_G$ applied to the gate electrode.

Another embodiment of compensation circuit, that compensates for the change in temperature or other operating parameter(s) of the optical waveguide device, measures the electrical resistance of the gate between the first body contact electrode 118 and the second body contact 122. The electrical resistance of the waveguide is a function of temperature, device age, device characteristics, and other such parameters. The meter 205 measures the electrical resistance of the waveguide. For a given waveguide, the same resistance corresponds to the same electron density and the same hole density in the waveguide. Therefore, if the same electrical resistance of the waveguide is maintained, the optical waveguide will behave similarly to cause a similar amount of such optical action as optical modulation, optical filtering, optical focusing, or optical deflection.

Figure 8:
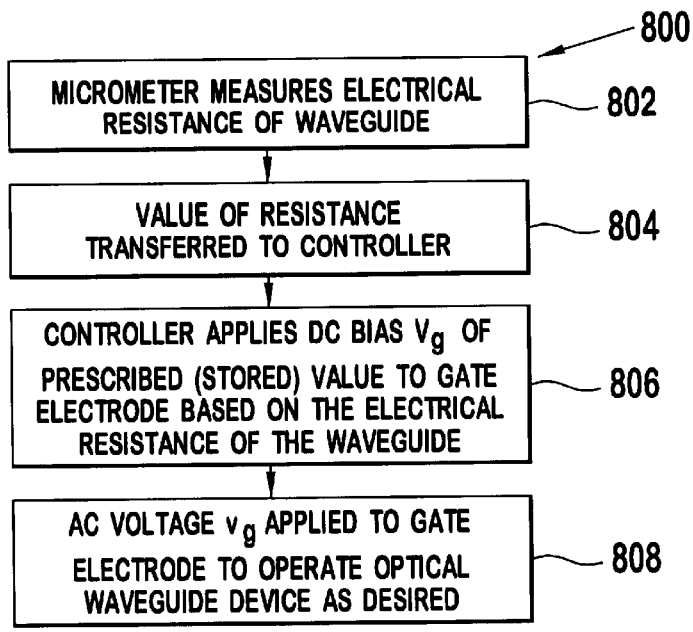
FIG. 8 shows another embodiment of a method to compensate for variations in temperature, or other such parameters, in an optical waveguide device.

FIG. 8 shows another method 800 used by the controller 201 to compensate for temperature variations of the optical waveguide device. The method 800 starts with step 802 in which the meter 205 measures the electrical resistance of the waveguide. The method 800 continues to step 804 in which the measured electrical resistance of the waveguide is transferred to the controller 201. The method continues to step 806 in which the controller applies the amount of DC bias $V_g$ required to be applied to the gate electrode for that particular value of electrical resistance of the waveguide. Such parameters as temperature and device age that together may change the electric resistance of the waveguide can thus be compensated for together. Therefore, after measuring the electrical resistance of the waveguide, a feedback loop applies the voltage for that measured resistance. The method 800 continues to step 808 in which the AC voltage $v_g$ is applied to operate the optical waveguide device (i.e. modulate, filter, focus, and/or deflect light) as desired in the waveguide.

In both of these temperature compensating embodiments shown in FIGS. 7 and 8, the controller 201 allows the DC bias $V_g$ to drift slowly as the temperature varies to maintain the average resistance of the waveguide from the source electrode to the drain electrode substantially constant. These temperature-compensating embodiments make the optical waveguide device exceedingly stable. As such, the required complexity and the associated expense to maintain the temperature and other parameters over a wide range of temperature are reduced considerably.

Suitably changing the voltages applied between the gate electrode 120, and the combined first body contact electrode 118 and second body contact electrode 122 results in a corresponding change in the free carrier distribution in the 2DEG 108. In the FIG. 1 embodiment of optical waveguide device 100, altering the voltage applied to the gate electrode 120 of the FET portion 116 changes the density of free carriers in the 2DEG 108. Changing free carriers distribution in the 2DEG 108 changes the effective mode index of the 2DEG 108 in the waveguide. Changing the free carrier distribution similarly changes the instantaneous propagation constant level of the region of changeable propagation constant 190 (e.g., the area generally underneath the gate electrode 120 in the FIG. 1 embodiment) within the waveguide 106.

Effective mode index, and equivalently propagation constant, both measure the rate of travel of light at a particular location within the waveguide taken in the direction parallel to the waveguide. For a light beam traveling over some distance in some medium at a velocity V, the velocity V divided by the speed of light in vacuum is the index for that medium. Glass has a propagation constant of 1.5, which means light travels 1.5 times slower in glass then it does in a vacuum. For the silicon in the waveguide the propagation constant is about 3.5. Since a portion of the light path travels in silicon and part of the light path is in the glass, the propagation constant is some value between 1.5 and 3.5. Therefore, the light is travelling at some effective speed measured in a direction parallel to the axial direction of the waveguide. That number, or speed, is called effective index of the waveguide. Each mode of light has a distinct effective index (referred to as the effective mode index) since different modes of the waveguide will effectively travel at different speeds.

The effective mode index is the same thing as the propagation constant for any specific mode of light. The term effective mode index indicates that the different modes of light within a waveguide travel at different velocities. Therefore there are a plurality of effective indexes for a multimode waveguide, each effective index corresponds to a different mode of light. The propagation constant (or the effective index) measures the average velocity for a phase of light for specific mode travel parallel to the axis of the waveguide as shown in FIG. 12. The propagation constant multiplied by the length would indicate how long it takes to go that length. Through this disclosure, the effective index for a mode (the effective mode index) is considered to be the same measure as the propagation constant for that mode of light. The term propagation constant is primarily used throughout the remainder of the disclosure for uniformity.

Changing the propagation constant of the waveguide 106 by varying the 2DEG 108 can phase modulate or amplitude modulate the light in the waveguide. Within the waveguide, the degree of modulation is local in that it depends on the density of 2DEG at a particular location. The shape of the electrode, or other arrangements of body contact electrodes, can impose a spatially varying phase or amplitude pattern to the light beam in the waveguide. This in turn can be used to accomplish a wide variety of optical functions such as variable attenuators, optical programmable filters, switches, etc. on the optical signals flowing through the waveguide 106.

A controller 201 controls the level of the total voltage $V_G$ applied to the voltage source 202. The optical waveguide device 100 can be employed in a system that is controlled by the controller 201, that is preferably processor-based. The controller 201 includes a programmable central processing unit (CPU) 230 that is operable with a memory 232, an input/output (I/O) device 234, and such well-known support circuits 236 as power supplies, clocks, caches, displays, and the like. The I/O device receives, for example, electrical signals corresponding to a desired modulation to be imposed on light passing through the waveguide 106. The controller 201 is capable of receiving input from hardware in the form of temperature sensors and/or meters for monitoring parameters such as temperature, optical wavelength, light intensity, device characteristics, pressure, and the like. All of the above elements are coupled to a control system bus to provide for communication between the other elements in the controller 201 and other external elements.

The memory 232 contains instructions that the CPU 230 executes to facilitate the monitor and control of the optical waveguide device 100. The instructions in the memory 232 are in the form of program code. The program code may conform to any one of a number of different programming languages. For example, the program code can be written in C, C++, BASIC, Pascal, or a number of other languages. Additionally, the controller 201 can be fashioned as an application-specific integrated circuit (ASIC) to provide for quicker controller speed. The controller 201 can be attached to the same substrate as the optical waveguide device 100.

In the FIG. 1 embodiment of waveguide 106, electrons (hole) concentrate in the waveguide to form the 2DEG 108 that forms a very narrow channel near the boundary of the silicon waveguide 106 and the second electrical insulator layer 110. The surface inversion charge density $q_n$ in the 2DEG 108 is a direct function of the local surface potential $\phi_s$ applied to the waveguide 106. The local surface potential $\phi_s$ is, in turn, directly related to the total instantaneous voltage on the gate electrode 120. The total voltage of light in the waveguide $V_G$ satisfies the equation $V_G = V_g + v_g$, where $V_g$ is the DC bias and $v_g$ is the AC bias. The local surface potential $\phi_s$ is a function of the total voltage $V_G$, and is given by the equations:

$$\phi_s = \frac{Q}{C} + V_G + \frac{Q_{OX}}{C_{OX}} + \phi_{ms} \quad\quad 1$$

$$\phi_s \equiv \frac{Q}{C} + V'_G$$

Figure 6:
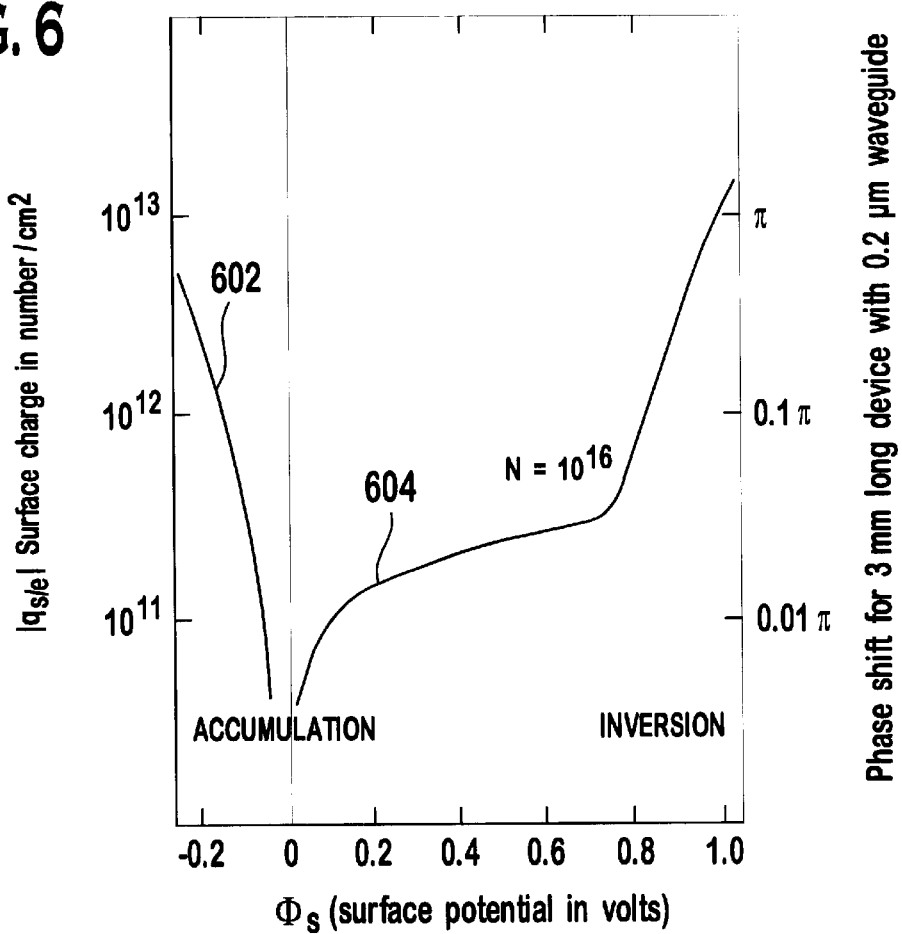
FIG. 6 shows a graph plotting surface charge density and the phase shift, both as a function of the surface potential.

The total potential $V_G$ that is applied to the waveguide 106 is thus a factor of the effective capacitance C of the optical waveguide device 100. The effective capacitance C itself depends on the distribution of the free-carriers. Thus, the capacitance in the MOS like device is a function of the applied voltage. The charges Q and capacitance C in the equation 1 above are measured per unit area. Since the 2DEG density depends only on $\phi_s$, dopant density, and temperature; 2DEG density $q_n$ can be plotted vs. $\phi_s$. FIG. 6 illustrates a curve 602 that plots surface charge density as a function of surface potential for an Si/SiO$_2$ MOSCAP where the uniform dopant density is assumed to be $10^{16}$ cm$^{-2}$ at room temperature. FIG. 6 also shows curve 604 that plots phase shift that is applied to the optical wave passing through waveguide 106 for a 3 mm long rectangular gate region. The phase shift is plotted as a function of surface potential $\phi_s$.

A side view of one embodiment of the optical waveguide device including a waveguide located in a MOSCAP is shown in FIG. 4. The optical waveguide device includes a MOSCAP 400 including a body contact 402, a waveguide 106, an electric insulator layer 405, and a gate electrode 406. In the embodiment of MOSCAP similar to as shown in FIG. 4, a voltage source 410 applies a voltage between the gate electrode 406 and the body contact 402 to alter a level of propagation constant in a region of changeable propagation constant 190 within the waveguide 106. The variations to the effective mode index and the propagation constant result occur similarly to in the FET embodiments of optical waveguide device 100 as described below.

In the MOSCAP embodiment of optical waveguide device shown in FIG. 4, the body contact 402 is positioned below the waveguide 106. Alternatively, body contacts may be located where the traditional source and drain electrodes exist on traditional FETs. The body contact in the FET embodiment of optical waveguide device shown in FIGS. 1 to 3 is formed from the first body contact electrode being electrically coupled at the same potential as the second body contact electrode. Application of the electric field due to the potential difference between the "gate" and the body contacts results in changes in the distribution of free charges as shown in the embodiment of FIG. 4.

FIG. 5 discloses one embodiment of high electron mobility transistor (HEMT) 500. The HEMT 500 comprises a semi-electric insulating substrate 502, an undoped buffer waveguide layer 106, an undoped spacer layer 506, a doped donor layer 508, a 2DEG 505, the first body contact electrode 118, the gate electrode 120, and the second body contact electrode 122. In one embodiment, the semi-insulating substrate 502 is formed from AlGaAs. The undoped buffer waveguide layer 106 is formed from GaAs. The undoped spacer layer 506 is formed from AlGaAs. The doped donor layer 508 is formed from a doped AlGaAs.

During operation of the optical waveguide device, the 2DEG 505 increases in height (taken vertically in FIG. 5) to approximately 20 angstroms. The 2DEG 505 is generated at the interface between the undoped spacer layer 506 and the undoped buffer waveguide layer 106 as a result of the negative biasing of the doped donor layer 508. Such negative biasing drives the electron carriers in a 2DEG 505 generally downward, thereby forming a p-type 2DEG 505. Application of voltage to the gate electrode tends to increase the free carrier distribution in those portions of the 2DEG 505 that are proximate the gate electrode. Such an increase in the free carrier distribution in the 2DEG increases the effective mode index in the waveguide 106 formed underneath the 2DEG 505. The gate electrode 120 is formed having a prescribed electrode shape. The shape of the effective mode index region within the waveguide 106 (i.e., the region having an effective mode index that is changed by the application of voltage to the gate electrode) generally mirrors the shape of the gate electrode 120 as viewed from above in FIG. 5. Additionally, the undoped spacer layer 506 acts as an insulative layer, to allow the formation of the 2DEG. HEMTs are formed in a variety of embodiments, several of which are described in U.S. Pat. No. 6,177,685 to Teraguchi et al. that issued on Jan. 23, 2001 (incorporated herein by reference in its entirety).

From semiconductor physics, the change in the distribution of free charges is most pronounced near the electrical insulator-semiconductor boundary. These changes in the free-carrier distribution change the index profile of the optical waveguide from a well-known relationship in plasma physics given by the Drude Model. The change in the free carrier distribution changes the propagation constant of the optical waveguide device from a well-known relationship in plasma physics given by the Drude model in a region of changeable propagation constant 190 within the waveguide. The changes in the free-carrier distribution induced in the semiconductor by the application of electric fields between the gate electrode and the body contact electrode(s) modulates the phase and/or amplitude of the optical wave passing through the region of changeable propagation constant 190. Thus, local changes in the free carrier distribution induced by a change in applied voltage to the gate electrode are impressed on the local optical phase or the amplitude of light passing through the waveguide. The shape of the charge distribution, i.e., the region of changeable propagation constant 190, provides the appropriate optical function as described below. In multiple embodiments, the pattern of the gate electrode (i.e., the planar shape of the gate) controls the shape of the free carrier distribution. The change in free carrier distribution, in turn, changes the local effective mode index, or propagation constant, of the waveguide in the region of changeable propagation constant 190. The same phenomena of change in the refractive index profile of the waveguide may be ascribed by indicating that group delay or the group velocity of the light beam has been changed as the free carrier distribution varies.

Therefore, the effective mode index, the propagation constant, the group delay, or the group velocity relate to an equivalent concept, namely, parametizing changes in the waveguide's refractive index profile on the optical beam passing through the region of changeable propagation constant 190 in the waveguide. This principle applies to all embodiments of optical waveguide devices, including those shown in FIGS. 1–3, 4, and 5.

The relationship between the effective mode index, the propagation constant, the group delay, or the group velocity apply to waveguides of all thickness' is now considered. In the case of "thick" waveguides, the light ray travels by bouncing between the two bounding planes defined by the insulator layers 110 and 104. The light ray can be easily identified, typically using the concept of phase or amplitude changes that are directly imposed on a beam that has directly undergone one or multiple interactions with free carriers. However, the concepts of effective mode index, propagation constant, group delay, or group velocity signify the same final result on the light beam. In this disclosure, the terms propagation constant, effective mode index, group delay, and group velocity are each used to describe the effects of changes in the free-carrier distribution due to electric field applied to a semiconductor in an optical waveguide device, whether the optical waveguide device uses FET, HEMT, MOSCAP, or any other type of optical waveguide device technology.

Controlling the 2DEG density provides the optical function of an optical waveguide device. As described, adjusting the gate voltage can control the 2DEG density. The density may be spatially varied to provide more complex functions. A triangular shaped density distribution (included in a region of changeable propagation constant) is capable of deflecting the light beam in a fashion similar to a prism in ordinary optics. An undulating pattern of 2DEG of a particular spatial period can reflect/deflect a specific wavelength to form a Bragg grating. The exact shape or the spatial density of the 2DEG is affected by placement of body contact electrodes relative to the gate electrode, the shape of the body contact electrodes and the gate electrode, and the applied voltages discussed herein. The electric field density between the gate electrode and the body contact electrode determines the shape of the 2DEG density. The properties or thickness of the insulator can be changed to affect the density distribution. For example, a Bragg grating may be constructed by patterning the gate electrode as a series of grooves having a constant spacing. In alternate embodiments, the gate electrode can have a consistent thickness, but the insulator thickness or shape can be altered to change the electrical resistance between the gate electrode and the waveguide. All of these embodiments provide an electrically switchable Bragg grating by controlling the 2DEG density. The 2DEG density pattern follows the surface potential at the waveguide/electric insulator boundary rather than the exact shape of the gate electrode.

Figure 9:
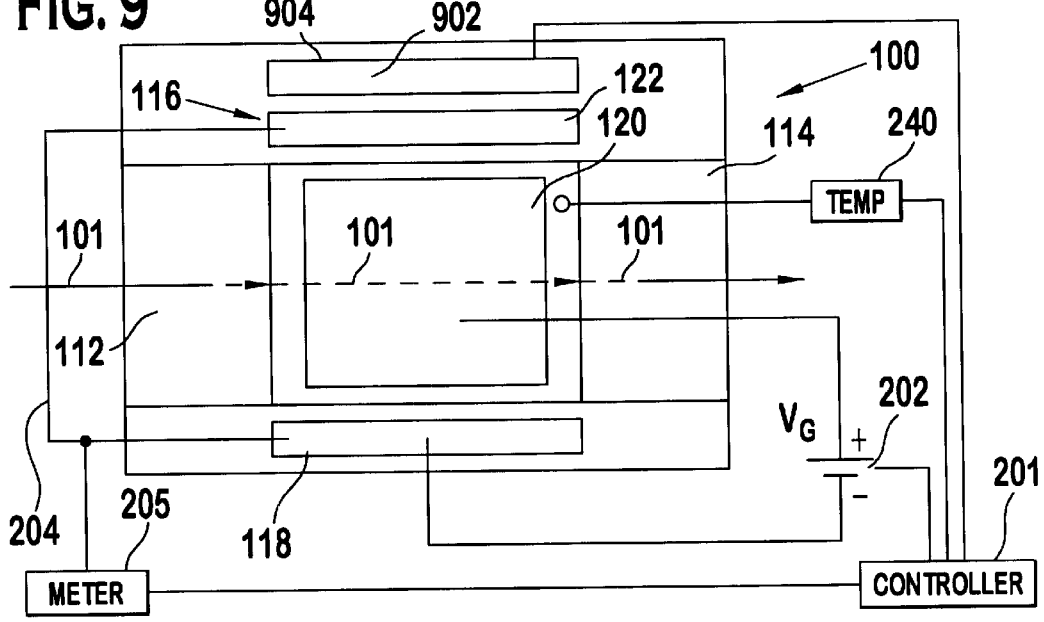
FIG. 9 shows a top view of another embodiment of optical waveguide device 100.

FIG. 9 shows a top view of another embodiment of optical waveguide device 100 that is similar to that shown in the embodiment of FIG. 2, except that the optical waveguide device includes an additional bank gate electrode 902 that is connected to a bank gate electrode well 904. The doping charge of the bank gate electrode well 904 (p++) in one embodiment is opposite the doping charge (n++) of the source electrode well and the drain electrode well. During operation, a voltage may be applied between the bank gate electrode 902 and the connected source electrode and drain electrode to establish a propagation constant gradient formed within the region of changeable propagation constant across the waveguide from the source electrode to the drain electrode. A variety of alternative embodiments may be provided to establish a propagation constant gradient formed within the region of changed propagation constant across the waveguide. For example the width of the second electrical insulator layer 110, or the resistance of the material used in the second electrical insulator layer 110 may be varied to establish a propagation constant gradient across the waveguide. Since there are such a variety of FET, MOSCAP, HEMT, and other configurations, it is envisioned that those configurations are within the intended scope of optical waveguide device of the present invention.

Optical waveguide devices may be configured either as slab waveguides or channel waveguides. In channel waveguides, the guided light is bound in two directions (x and y) and is free to propagate in the axial direction. In slab waveguides, the guided light is bound in one direction and can propagate freely in two orthogonal directions. Channel waveguides are used in such applications as transmission, resonators, modulators, lasers, and certain filters or gratings where the guided light is bound in two directions. Slab waveguides are used in such applications as deflectors, couplers, demultiplexers, and such filters or gratings where the guided light is bound only in one direction, and it may be desired to change the direction of propagation.

Figure 10:
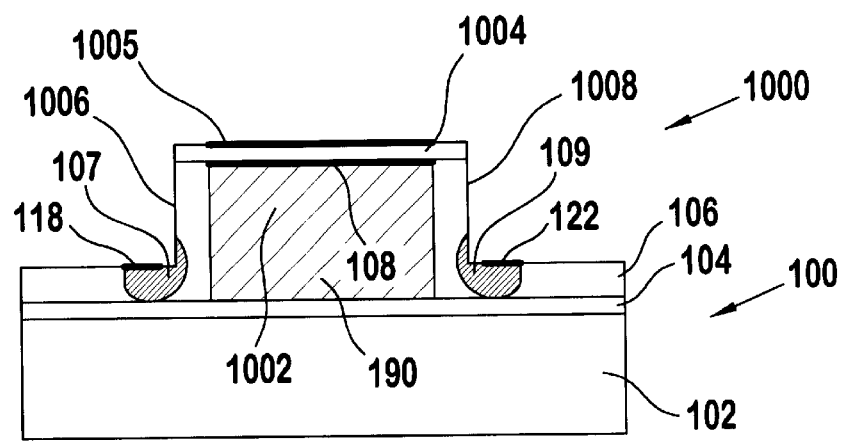
FIG. 10 shows a side cross sectional view of one embodiment of a ridge optical channel waveguide device.
Figure 11:
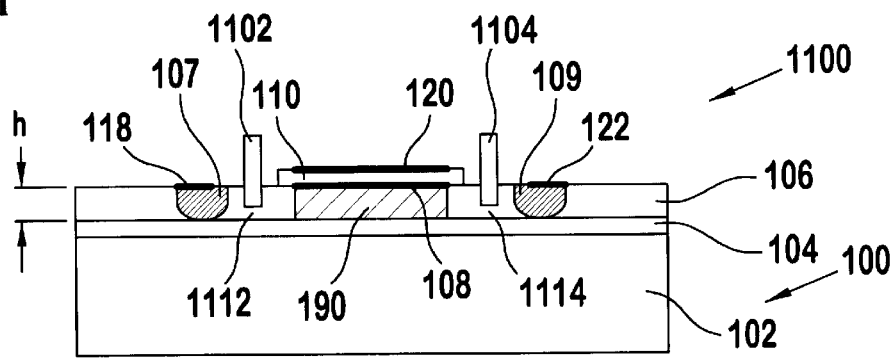
FIG. 11 shows a side cross sectional view of one embodiment of a trench optical channel waveguide device.

There are several embodiments of channel waveguides including the FIG. 10 embodiment of the ridge channel waveguides 1000 and the FIG. 11 embodiment trench channel waveguide 1100. The ridge channel waveguide 1000 includes a raised central substrate portion 1002, a electrical insulator layer 1004, and a metal gate electrode 1005. The raised substrate portion 1002 is n-doped more heavily than the main substrate 102. The raised substrate portion 1002 forms a channel defined by a pair of side walls 1006, 1008 on the sides; the electrical insulator layer 1004 on the top; and the n-doping differential between the raised substrate portion 1002 and the main substrate 102 on the bottom. The pair of side walls 1006, 1008 includes, or is coated with, a material having a similar index of refraction as the electrical insulator layers 104, 106. Biasing the metal gate electrode 1005 forms a 2DEG 108 adjacent the electrical insulator layer 1004. The 2DEG 108 allows the carriers to pass between the first body contact well 107 and the second body contact well 109 as applied, respectively, by the respective first body contact electrode 118 and the second body contact electrode 122.

FIG. 11 shows one embodiment of trench channel waveguide 1100. The trench channel waveguide includes a plurality of electrical insulative blocks 1102, 1104 and the waveguide 106. The electrical insulative block 1102 partially extends into the waveguide 106 (from the upper surface of the optical waveguide device 100) at a lateral location between the first body contact well 107 and the gate electrode 120. The electrical insulative block 1104 partially extends into the waveguide 106 (from the upper surface of the optical waveguide device 100) at a lateral location between the second body contact well 109 and the gate electrode 120. The light passing through the waveguide 106 is restrained from travelling laterally by the addition of the electrical insulative blocks 1102, 1104. Spaces 1112, 1114 are defined within the waveguide between each one of the respective insulative blocks 1102, 1104 and the first electrical insulator layer 104. These spaces allow carriers to flow between the respective first body contact well 107 and the second body contact well 109 through the waveguide 106 formed under the gate electrode 120.

One embodiment of the optical waveguide devices 100 can be constructed on so-called silicon on insulator (SOI) technology that is used in the semiconductor electronics field. SOI technology is based on the understanding that the vast majority of electronic transistor action in SOI transistors occurs on the top few microns of the silicon. The silicon below the top few microns, in principal, could be formed from some electrical insulator such as glass. The SOI technology is based on providing a perfect silicon wafer formed on a layer of an electrical insulator such as glass (silicon dioxide), that starts two to five microns below the upper surface of the silicon. The electrical insulator electrically isolates the upper two to five microns of silicon from the rest of the silicon.

The inclusion of the electrical insulator in SOI electronic devices limit the large number of electric paths that can be created through a thicker silicon, thereby automatically making SOI transistors go faster and use less power consumption. SOI technology has developed over the past decade to be commercially competitive. For example, Power PC (a registered trademark of Apple Computer, Inc. of Cupertino, Calif.) has moved to SOI technology. In addition, the Pentium lines of processor (Pentium is a registered trademark of Intel Corporation of Santa Clara, Calif.) is soon going to utilize the SOI technology.

The embodiment of optical waveguide device 100 shown, for example, in FIGS. 1 to 3 may be configured using SOI technology such as processors and chips. The waveguide 106 of the optical waveguide device 100 may be fashioned as the upper SOI silicon layer. The first electrical insulator layer 104 may be fashioned as the SOI insulator layer. The substrate 102 may be fashioned as the SOI silicon substrate. As such, the SOI technology including the majority of processors and chips, can easily be used as an optical waveguide device.

II. Waveguide Physics

This section demonstrates that the propagation constant (or equivalently the effective mode index) of the waveguide is an instantaneous function of the 2DEG charge density $q_n$. An increase in the free carrier distribution in a region of the 2DEG 108 results in a corresponding increase in the propagation constant of the waveguide 106 at the corresponding region. The relationship between the volumetric density of the free carriers and the refractive index was originally derived by Drude in his Model of Metals that indicates that metals provide both a dielectric and "free electron" response. The same model may be applied to semiconductors. The changes in the real part of the refractive index $\Delta n$ and the imaginary part of the refractive index $\Delta k$ (the imaginary part corresponds to absorption) from an increase in the free carrier distribution are a function of the change in the free-carrier density $\Delta N$, as indicated by the following equations:

$$\Delta n = \frac{e^2}{2\varepsilon_0 m_e n \omega^2} \Delta N \equiv \chi \Delta N \qquad 3$$

$$\Delta k = \frac{\Delta n}{\omega \tau_s}$$

where e is the electronic charge, $m_e$ is the effective mass of the carrier, $\tau_s$ is the mean scattering time and is related to the mobility, and $\Delta N$ is the change in the free-carrier density. For the semiconductor devices considered here, where the dominant change in the free-carriers is due to the 2DEG, $\Delta N$ is a function of $q_n$ and the thickness (t) of the 2DEG varies according to the equation:

$$\Delta N = \frac{\Delta q_n}{t_{2DEG}} \qquad 4$$

TABLE 1 shows the calculated values of the Drude coefficient χ and the effective mass $m_e$ for Silicon with n or p-type dopants, and Gallium Arsinide (GaAs) with n-type doping (at wavelengths of 1.3 and 1.55 micron). GaAs and InP both have a larger Drude Coefficient χ than silicon. This is in part due to the smaller effective mass of charge (electron or hole). Thus, a waveguide structure made from GaAs and InP will have larger changes in the propagation constant for the same changes in the density of 2DEG when compared to Silicon.

TABLE 1

| Wavelength | Material | χ | $m_e$ |
|---|---|---|---|
| 1.33 | Silicon-n | $-7 \times 10^{-22}$ | 0.33 |
| 1.55 | | $-9.4 \times 10^{-22}$ | |
| 1.33 | Silicon-p | $-4 \times 10^{-22}$ | 0.56 |
| 1.55 | | $-5.5 \times 10^{-22}$ | |
| 1.33 | GaAs-n | $-3.5 \times 10^{-21}$ | 0.068 |
| 1.55 | | $-4.8 \times 10^{-21}$ | |

To estimate the length requirements for a dielectric slab waveguide, the modes of the FIG. 12 embodiment of dielectric slab waveguide 106 formed between the cladding layers have to satisfy the equation:

$$2k_y h + \phi_1 + \phi_2 = 2m\pi \qquad 5$$

where h is the thickness of the waveguide 106, and the phase shifts $\phi_1$ and $\phi_2$ are due to the reflection of the light at the boundary and m is an integer multiple. The propagation constant $k_z$ and $k_y$ are related to k and the mode angle θ by the following equations:

$$k_y = k\cos\theta \qquad 6$$
$$k_z = k\sin\theta, \text{ and}$$
$$k = \left(\frac{2\pi}{\lambda}\right)n$$

Solving equations 5 and 6 can derive the modes of the waveguide 106. The values of $\phi_1$ and $\phi_2$ are functions of angle θ. The change in the propagation constant $k_z$ due to change in the waveguide index profile induced by the 2DEG is responsible for amplitude and phase modulation. The phase modulation of the light in the waveguide results from a change in the propagation constant of selected regions within the waveguide. The amplitude modulation of the light passing through the waveguide results from a change in the absorption of the light passing through selected regions within the waveguide.

The shape and type of the material through which light is passing plays an important role in determining the optical function of the optical waveguide device. For example, light passing through rectangular slab optical waveguide device only travels axially along the optical path 101. Optical deflectors, for example, not only allow the light to travel axially, but can also deviate the light laterally. The amount of displacement and deviation of the light passing through the waveguide are both dependent on the propagation constant of the waveguide as well as the apex angle of the prism.

The shape of a region of changeable propagation constant 190 within a waveguide plays a role in determining how an application of voltage to the gate electrode will modify the optical characteristics of light passing through the waveguide. For example, a suitably-biased prism-shaped gate electrode projects a three dimensional prism-shaped region of changeable propagation constant 190 into the waveguide. The cross-sectional height of the region of changeable propagation constant 190 is projected through the entire height of the waveguide. As viewed from above, the region of changeable propagation constant 190 deflects light in similar propagation directions as light passing through a similarly shaped optical prism. In slab waveguides, the rays of light will deflect or bounce between the upper and lower surface of the waveguide while continuing in the same propagation direction as viewed from above.

Unlike actual optical devices that are physically inserted in a path of light, any effects on light passing through the waveguide of the present invention due to the propagation constant within a region of changeable propagation constant 190 can be adjusted or eliminated by altering the voltage level applied to the gate electrode. For example, reducing the voltage applied to a deflector-shaped gate electrode sufficiently results in the propagation constant of the projected deflector-shaped region of changeable propagation constant 190 being reduced to the propagation constant value of the volume surrounding the region of changeable propagation constant 190. In effect, the region of changeable propagation constant 190 will be removed. Light travelling through the region of changeable propagation constant 190 will therefore not be effected by the region of changeable propagation constant 190 within the waveguide. Similarly, the strength of the propagation constant can be changed or reversed by varying the voltage applied to the gate electrode.

III. Specific Embodiments of Optical Waveguide Devices

A variety of embodiments of optical waveguide devices are now described. Each optical waveguide device shares the basic structure and operation of the embodiments of optical waveguide device described relative to FIGS. 1–3, 4, or 5. The optical waveguide device can be configured in either the channel waveguide or slab waveguide configuration. Each embodiment of optical waveguide device is an active device, and therefore, the voltage level applied to the electrode can control the degree that the light within the region of changeable propagation constant 190 in the waveguide will be affected. Since the optical waveguide device is active, the propagation constant in the region of changeable propagation constant 190 can be adjusted by varying the voltage applied to the gate electrode. Allowing for such adjustment using the controller 201 in combination with either the meter 205 or the temperature sensor 240 using the methods shown in FIG. 7 or 8 is highly desirable considering the variation effects that temperature, device age, pressure, etc. have on the optical characteristics of the optical waveguide device.

The embodiments of optical waveguide device 100 described relative to FIGS. 1 to 3, 4, and 5 can be modified to provide a considerable variation in its operation. For example, the optical waveguide device 100 can have a projected region of changeable propagation constant 190 within the waveguide to provide one or more of phase and/or amplitude modulation, optical deflection, optical filtering, optical attenuation, optical focusing, optical path length adjustment, variable phase tuning, variable diffraction efficiency, optical coupling, etc. As such, embodiments of many optical waveguide devices that perform different operations are described in the following sections along with the operations that they perform.

In each of the following embodiments of an optical waveguide device, the gate electrode is formed in a prescribed electrode shape to perform a desired optical operation. The projected region of changeable propagation constant 190 assumes a shape similar to, but not necessarily identical to, the gate electrode. The shape of the region of changeable propagation constant 190 within the waveguide can physically map extremely closely to, with a resolution of down to 10 nm, the prescribed gate electrode shape. The construction and operation of different embodiments of optical waveguide devices, and the operation, and effects of various embodiments of regions of changeable propagation constant 190 are described in this section.

3A. Optical Modulator

This section describes an optical modulator, one embodiment of optical waveguide device 100 that modulates light passing through the waveguide. The embodiments of optical waveguide device as shown in FIGS. 1–3, 4, or 5 can perform either phase modulation or amplitude modulation of light passing through the waveguide. The modulation of light by the optical waveguide device 100 can be optimized by reducing the losses in the gate electrode 120 as well as reducing the charges in the 2DEG 108, while increasing the interaction of the waveguide mode with the 2DEG. In general, reducing the waveguide thickness h reduces the necessary waveguide length $L_N$ to produce modulation. Limiting the modulation of the 2DEG 108 also limits the effects on the free-carriers resulting from absorption during modulation. The length required for a specific loss, such as a 10 dB loss $L_{10dB}$, can be experimentally determined for each device. Both $L_N$ and $L_{10dB}$ are functions of $\Delta q_n$. $\Delta q_n$ depends on both the DC bias $V_g$ as well peak-to-peak variation of the varying AC signal $v_g$.

To construct a high-speed modulator operating with bandwidth in excess of, for example 50 GHz, it is important to consider both the RF microwave interfaces and the transit time of the free-carriers. Since the carriers arrive in the 2DEG either from the bulk electrode (not shown), from the first body contact electrode 118, or from the second body contact electrode 122, as the voltage of the gate electrode 122 is changed, the time required for the voltage to equilibrate to supply a constant voltage is, $$\tau_e = \frac{(L/2)}{v_s} \qquad 7$$

where $v_s$ is the maximum velocity of the carriers and L is the channel length illustrated in FIG. 1. Thus, the maximum length L of the MOS/HEMT structure of the optical waveguide device 100 is determined by the requirement that $\tau_e$ be less than some percentage of the bit period.

FIG. 6 shows illustrative graph of the surface charge density and the phase shift, both plotted as a function of the surface potential for a planar dielectric waveguide. In the FIG. 6 plot, the waveguide is an exemplary planar Si waveguide that has an electrical insulator layer such as cladding on both the upper and lower surfaces. The waveguide is a single mode waveguide with the propagation constant of 14.300964 $\mu m^{-1}$. A change in the gate voltage by approximately 0.2–0.5 V results in a change to the surface charge density of the 2DEG by $8 \times 10^{12}$ cm$^{-2}$ which in turn will lead to a change of −0.01 in the propagation constant if the 2DEG was due to electrons. Further assume that this 2DEG region is effectively confined to within 5–50 nm adjacent the upper electrical insulator layer, as is typical for MOS device physics. Assuming that there is an index change over only a 10 nm distance, the new propagation constant is calculated to be 14.299792 $\mu m^{-1}$. The changes in the propagation constant result in an additional phase shift of 180 degrees for light travelling a length of 2.86 mm. Thus, gate voltage modulation leads to phase modulation of light in the waveguide. Similarly, free-carrier absorption occurs in the semiconductor locations where there are scattering centers (i.e. donor sites). Such free-carrier absorption acts to modulate the amplitude of the propagating mode of light. In general, amplitude modulation and phase shift modulation will occur simultaneously, but one type of modulation can be arranged to be predominant by controlling the doping profile of the waveguide.

In one embodiment, a channel waveguide is used to construct a high-speed modulator. With total internal reflection (TIR) using a channel waveguide, all the light within the waveguide is constrained to follow the direction parallel to the optical path 101 since the light that contacts the electrical insulator layers 104, 110 of the waveguide reflects off the electrical insulator layers. Electrical insulator layers 104, 110 have a lower refractive index than the waveguide. The channel waveguide should be dimensioned to match the mode(s) of the waveguide so the waveguide acts as a modulator for that mode.

The first body contact well 107 and the second body contact well 109, that respectively interact with the first body contact electrode 118 and the second body contact electrode 122, are both typically n-doped. This doping produces the body contact wells 107, 109 having a lower refractive index than the silicon waveguide 106 due to the presence of free-carriers. The body contact wells 107, 109 thus form a low-refractive index cladding that naturally confine the light mode(s) laterally within the waveguide 106. The body contact wells 107, 109 also absorb some light passing through the waveguide 106, but the absorption of light makes the waveguide lossy. Thus, it may be desired to use other refractive elements than the electrodes 118, 122 to confine the travel of the optical modes and limit the loss of the light.

For high speed modulation, the body contacts and the gate electrodes can be made to act like a waveguide that operates at radio frequencies. It is preferred, depending on the distance required, to produce the required modulation to match the group velocity of the optical wave to the microwave.

Variable optical attenuators are one additional embodiment of optical amplitude modulators. The description of constructing one embodiment of variable optical attenuator using optical waveguide devices is described later following a description of Bragg gratings.

3B. Optical Deflectors

Figure 13:
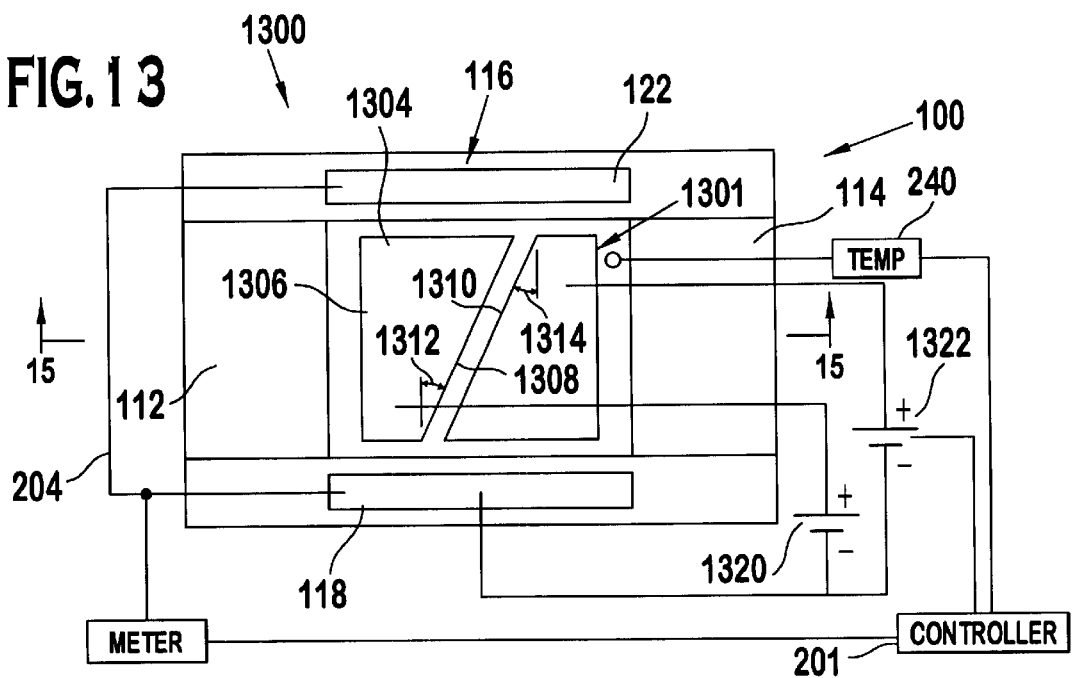
FIG. 13 shows a top view of another embodiment of an optical waveguide device from that shown in FIG. 2, including one embodiment of a prism-shaped gate array that provides for light deflection by the optical device.

The FIG. 13 embodiment of the optical waveguide device 100 is capable of acting as an optical deflector 1300 to controllably deflect light passing through the waveguide. In one embodiment of deflector 1300, the gate electrode 120 shown in the embodiments of FIGS. 1–3, 4, and 5 is physically and operationally divided into two electrodes including the input prism gate electrode 1304 and the output prism gate electrode 1306. Both the input prism gate electrode 1304 and the output prism gate electrode 1306 may be shaped in a trapezoidal or other prismatic) configuration, and are both substantially co-planar and physically positioned above the waveguide. When voltage of a first polarity is applied to one of the input prism gate electrode 1304 or the output prism gate electrode 1306 (not simultaneously), light will be deflected from the incident axial direction of propagation into opposite lateral directions, e.g. respectively downwardly and upwardly within the waveguide of FIG. 13. When a voltage of one polarity is applied to one of the input prism gate electrode 1304, light will be deflected in the opposite lateral directions (upward or downward as shown in FIG. 13) as when voltage of the same polarity is applied to the output prism gate electrode 1306.

The input prism gate electrode 1304 and the output prism gate electrode 1306 are both formed from an electrically conductive material such as metal. A first voltage supply 1320 extends between the combined first body contact electrode 118 and second body contact electrode 122 (that are electrically connected by substantially constant potential conductor 204) and the input prism gate electrode 1304. A second voltage supply 1322 extends between the combined first body contact electrode 118 and second body contact electrode 122 to the output prism gate electrode 1306. The first voltage supply 1320 and the second voltage supply 1322 are individually controlled by the controller 201, and therefore an opposite, or the same, or only one, or neither, polarity voltage can be applied to the input prism gate electrode 1304 and the output prism gate electrode 1306. The input prism gate electrode 1304 and the output prism gate electrode 1306 can be individually actuated so that each one of the deflecting prism gate electrodes 1304, 1306 can project a region of changeable propagation constant 190 in the waveguide while the other deflecting prism gate electrode does not. FIGS. 14 and 15 show a shape of a embodiment of first region of changeable propagation constant 190a projected by the input prism gate electrode 1304 closely maps that shape of the input prism gate electrode shown in FIG. 13. The shape of the FIGS. 14 and 15 embodiment of second region of changeable propagation constant 190b projected by the output prism gate electrode 1306 that closely maps that shape of the output prism gate electrode 1306 shown in FIG. 13.

The input prism gate electrode 1304 has an angled surface 1308 whose contour is defined by apex angle 1312. The output prism gate electrode 1306 has an angled surface 1310 whose contour is defined by apex angle 1314. Increasing the voltage applied to either the input prism gate electrode 1304 or the output prism gate electrode 1306 increases the free carrier distribution in the region of the 2DEG adjacent to the respective first region of changeable level of region of changeable propagation constant 190a or the second region of changeable propagation constant 190b of the waveguide, shown in the embodiment of FIG. 15 (that includes FIGS. 15A to 15D). Both regions of changeable propagation constants 190a, 190b are prism (trapezoid) shaped and extend for the entire height of the waveguide and can be viewed as a horizontally oriented planar prisms located in the waveguide whose shape in the plane parallel to the gate electrode is projected by the respective deflecting prism gate electrodes 1304, 1306. The waveguide volume within either one of the regions of changeable propagation constant 190a, 190b has a raised propagation constant compared to those waveguide regions outside the region of changeable propagation constant 190a, 190b. Additionally, a boundary is formed between each one of the regions of changeable propagation constant 190a, 190b and the remainder of the waveguide. The fact that each one of the regions of changeable propagation constant 190a, 190b has both a raised propagation constant level and a boundary makes the prism-shaped regions of changeable propagation constant 190a, 190b act as, and indeed be functionally equivalent to, optical prisms formed of either semiconductor material or glass.

Figure 15A:
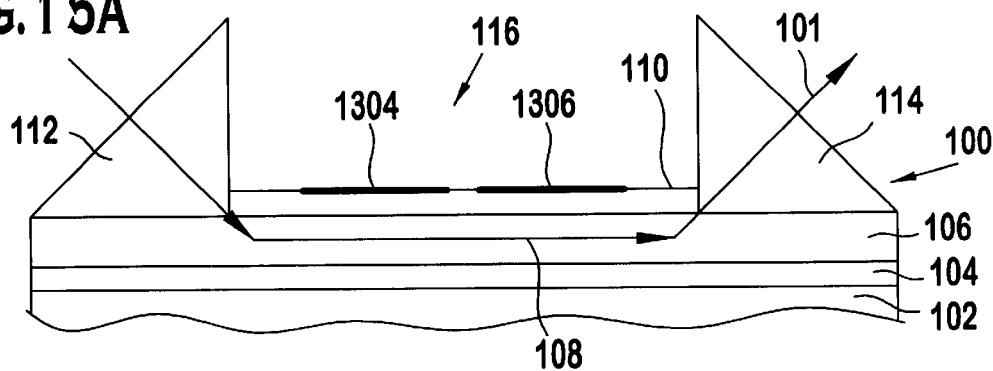
FIGS. 15A to 15D, show side cross section views of the optical waveguide device of FIG. 13 or taken through sectional lines 15—15 in FIG. 13.

As shown in FIG. 15A, when a level of voltage that is insufficient to alter the carrier concentration is applied to either gate electrode 1304 and 1306, no 2DEG 108 is established between the electric insulator layer 110 and the waveguide 106. Since the 2DEG changes the level of propagation constant in the respective regions of propagation constant 190a, 190b, no regions of changeable propagation constants 190a or 190b are established in the waveguide 106. Therefore, the propagation constant of the first region of changeable propagation constant 190a in the waveguide matches the propagation constant level of the remainder of the waveguide 106, and light travelling along paths 1420, 1422 continues to follow their incident direction. Path 1420 is shown with a wavefront 1440 while path 1422 is shown with a wavefront 1442.

Figure 15B:
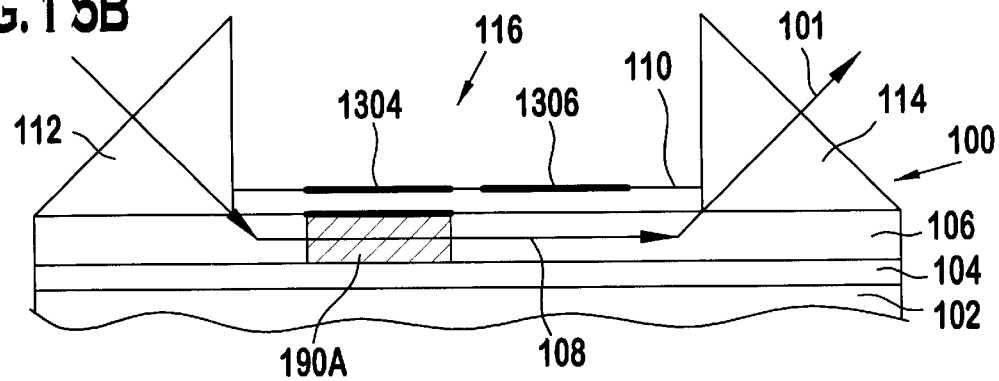

When voltage of a first polarity is applied to the input prism gate electrode 1304, the first region of changeable propagation constant 190a is projected in the shape of the input prism gate electrode 1304 through the height of the waveguide to form the region of changed propagation constant 190a, as shown in FIG. 15B. The first region of changeable propagation constant 190a thus functions as a variable optical prism that can be selectively turned on and off. The first region of changeable propagation constant 190 is formed in the semiconductor waveguide that deflects the light passing along the waveguide along a path 1430 including wavefronts 1432. Individual beams of the light following path 1430 are reflected with total internal reflectance between an upper and lower surface of the waveguide, but the direction of travel of light within the waveguides remains along the path 1430.

The intensity of the voltage applied to the input prism gate electrode 1304 can be reduced to limit the propagation constant level of the region of changed propagation constant, so the light following path 1420 would be deflected, e.g., along path 1436 instead of along path 1430. The polarity of the voltage applied to the input prism gate electrode 1304 can also be reversed, and light following path 1420 along the waveguide would be deflected to follow path 1438. Therefore, the deflection of the light within the waveguide 106 can be controlled, and even reversed, by controlling the voltage applied to the input prism gate electrode 1304. Changing of the propagation constant within the first region of changeable propagation constant 190a causes such deflection by the input prism gate electrode 1304.

When no voltage is applied to the output prism gate electrode 1306 as shown in FIGS. 15A and 15B, thereby effectively removing the second region of changeable propagation constant 190b from the waveguide 106. Light following within waveguide 106 along path 1422 is assumed to continue in a direction aligned with the incident light, or in a direction deflected by the input prism gate electrode 1304, since the propagation constant is uniform throughout the waveguide.

Figure 15C:
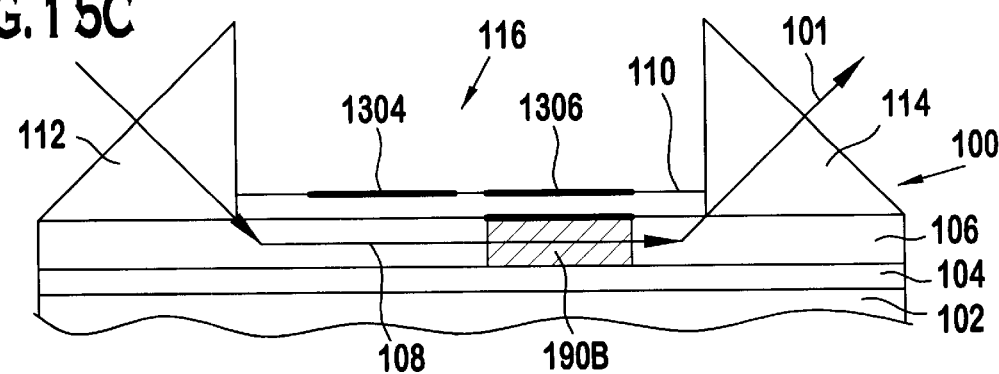
Figure 15D:
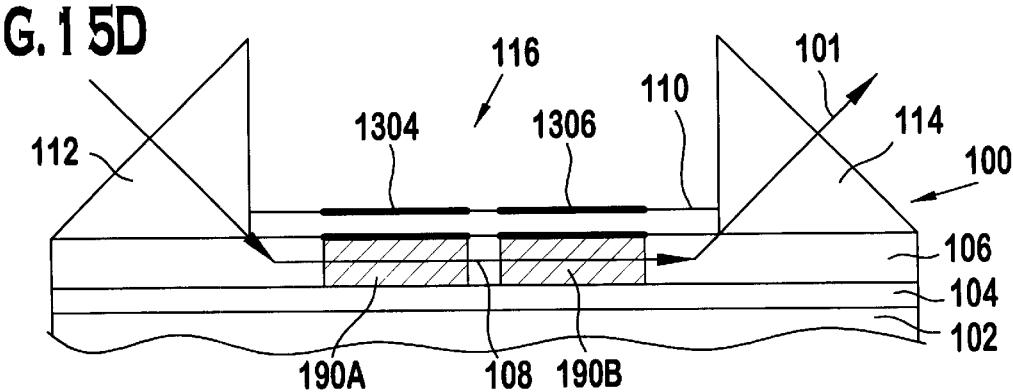

When voltage of a first polarity is applied to the output prism gate electrode 1306, the second region of changeable propagation constant 190b having a changed propagation constant level is projected in the waveguide as shown in FIGS. 15C and 15D. The second region of changeable propagation constant 190b may be viewed as an optical prism that projects in the shape of output prism gate electrode 1306 to the waveguide, thereby deflecting the light passing along the waveguide along path 1460 with the wavefronts 1462 extending perpendicular to the direction of travel.

The intensity of the voltage applied to the output prism gate electrode 1306 shown in FIG. 15C can be reduced, so the light following path 1422 would be deflected at a lesser angle, e.g., along path 1466 instead of along path 1460. Similarly, increasing the voltage applied to the output prism gate electrode 1306 increases the angle of deflection. The polarity of the voltage applied to the output prism gate electrode 1306 could also be reversed, and light following path 1420 within the waveguide would be deflected in a reversed direction to the original polarity to follow path 1468. Therefore, the deflection of the light within the waveguide 106 can be controlled, and even reversed, by controlling the voltage applied to the output prism gate electrode 1306. Additionally, the propagation constant in prescribed regions of the waveguide, and the gate resistance, can be calibrated using the techniques described in FIGS. 7 and 8 using the controller 201, the meter 205, and/or the temperature sensor 240.

The voltage being used to bias the input prism gate electrode 1304 and/or the output prism gate electrode 1306 have the effect of controllably deflecting the light as desired. The FIG. 14 embodiment of optical waveguide device 100 is structurally very similar to the FIGS. 1 to 3 embodiment of optical waveguide device 100, however, the two embodiments of optical waveguide devices perform the differing functions of modulation and deflection.

Figure 16:
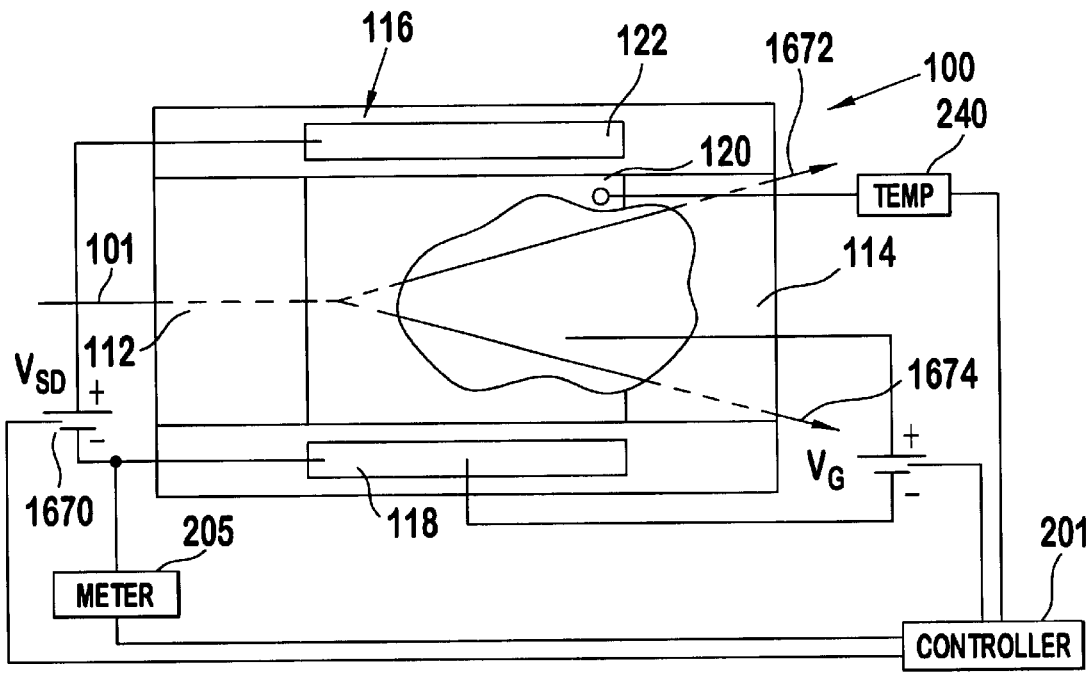
FIG. 16 shows a top view of another embodiment of an optical waveguide device that is similar in structure to the optical waveguide device shown in FIG. 2, with a second voltage source applied from the source electrode to the drain electrode, the gate electrode and electrical insulator is shown partially broken away to indicate the route of an optical wave passing through the waveguide that is deflected from its original path along a variety of paths by application of voltage between the source electrode and gate electrode.

In the FIG. 16 embodiment of optical waveguide device, the incident light flowing through the waveguide will be deflected from its incident direction in a direction that is parallel to the axis of the optical waveguide device. Such deflection occurs as result of variable voltage applied between the second body contact electrode 122 and the first body contact electrode 118. In this configuration, an additional voltage source 1670 applies a voltage between the second body contact electrode and the first body contact electrode to provide voltage gradient across the gate electrode. By varying the voltage between the second body contact electrode and the first body contact electrode, the level of propagation constant within the region of changeable propagation constant changes. The voltage level applied to the waveguide thus causes a direction of the propagation of light flowing through the waveguide to be controllably changes, leading to deflection of light within the horizontal plane (e.g. upward and downward along respective paths 1672, 1674 as shown in FIG. 16).

The application of the first body contact-to-second body contact voltage $V_{SD}$ 1670 by the voltage source causes a propagation constant gradient to be established across the 2DEG in the waveguide 106 from the first body contact electrode to the second body contact electrode. Thus, the propagation constant, or the effective mode index, of the waveguide 106, varies. This variation in the propagation constant leads to angled phase fronts from one lateral side of the waveguide to another. That is, the wavefront of the optical light flowing through the FIG. 16 embodiment of waveguide 106 on one lateral side of the wavefront lags the wavefront on the other lateral side. The phase fronts of the light emerging from the gate region will thus be tilted and the emerging beam will be deflected by an angle γ. For a fixed $V_{DS}$, the deflection angle γ increases with the distance z traveled within the waveguide 106. The angle γ can be calculated by referring to FIG. 16 according to the equation.

$$\gamma = a\tan\left(\frac{\Delta OP}{L}\right) = a\tan\left(\frac{\Delta \bar{n}W}{L}\right) = a\tan\left(\frac{\bar{n}\cot(\theta)\Delta\theta W}{L}\right) \therefore \gamma = \left(\frac{W}{L}\right)10^{-4} \qquad 8$$

Figure 17:
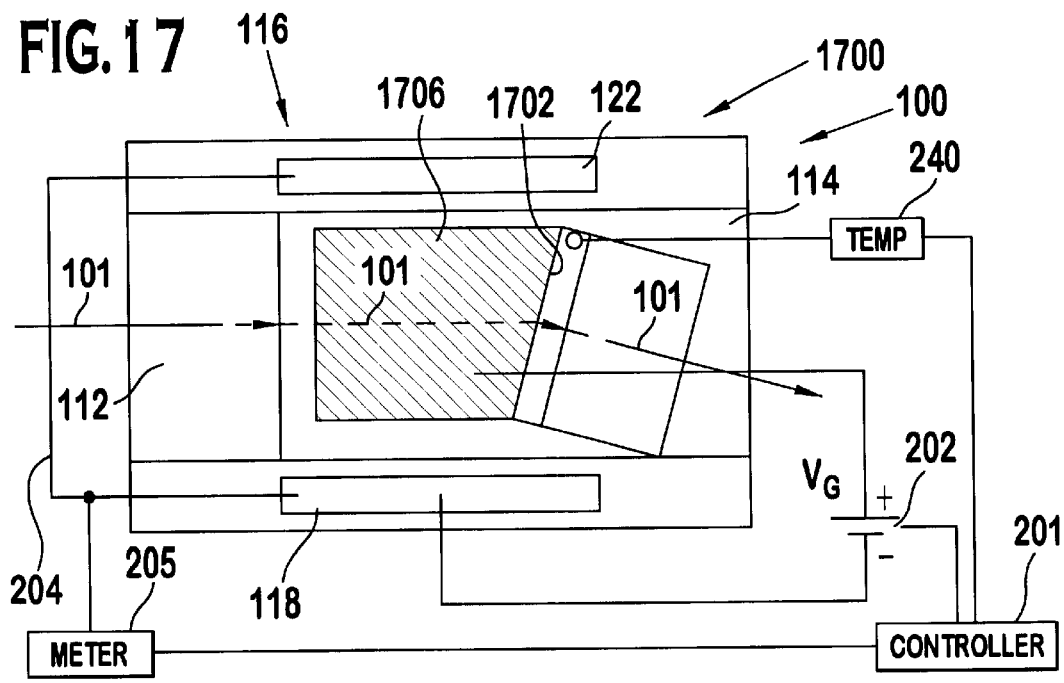
FIG. 17 shows another embodiment of an optical deflector.

Another embodiment of optical deflector 1700 is shown in FIG. 17. The waveguide 1702 is trapezoidal in shape. A gate electrode 1706 (that is shown as hatched to indicate that the gate electrode shares the shape of the waveguide 1702 in this embodiment) may, or may not, approximate the trapezoidal shape of the waveguide. Providing a trapezoidal shaped waveguide in addition to the shaped gate electrode enhances the deflection characteristics of the optical deflector on light. In the optical deflector 1700, if the voltage applied to the gate electrode is removed, deflection occurs due to the shape of the waveguide due to the trapezoidal shape of the waveguide. In this embodiment of optical waveguide device, the waveguide itself may be shaped similarly to the prior-art discrete optical prisms formed from glass.

Figure 18:
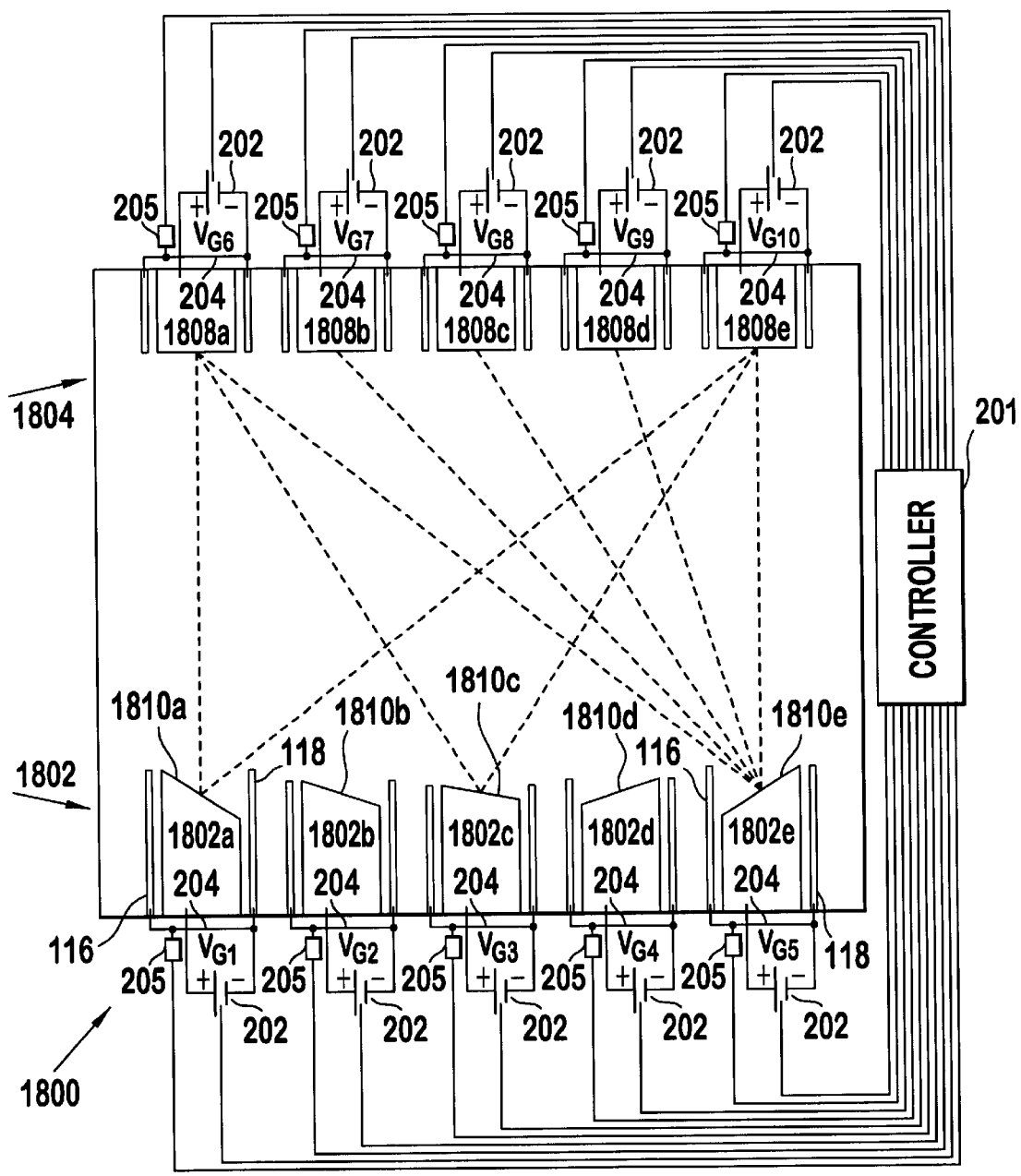
FIG. 18 shows a top view of one embodiment of an optical switch that includes a plurality of the optical deflectors of the embodiments shown in FIG. 14, 15, or 16.

FIG. 18 shows one embodiment of optical switch 1800 including a plurality of optical deflectors that each switches its input light from one or more deflecting prism gate electrodes 1802a through 1802e to one of a plurality of receiver waveguides 1808a to 1808e. The optical switch 1800 includes an input switch portion 1802 and an output switch portion 1804. The input switch portion includes a plurality of the FIG. 18 embodiment of deflecting prism gate electrodes as 1802a to 1802e. The deflecting prism gate electrodes 1802a to 1802e may each be constructed, and operate, as described relative to one of the deflecting prism gate electrodes 1306, 1308 of FIG. 13. Each one of the deflecting prism gate electrodes 1802a to 1802e is optically connected at its input to receive light signals from a separate channel waveguide, not shown in FIG. 18. The output portion 1806 includes a plurality of receiver waveguides 1808a, 1808b, 1808c, 1808d, and 1808e. Each of the receiver waveguides 1808a to 1808e is configured to receive light that is transmitted by each of the deflecting prism gate electrodes 1802a to 1802e.

The optical switch 1800 therefore includes five deflecting prism gate electrodes 1802a to 1802e, in addition to five receiver waveguides 1808a to 1808e. As such, the optical switch can operate as, e.g., a 5×5 switch in which any of the deflecting prism gate electrodes 1802a to 1802e can deflect it's output light signal to any, or none, of the receiver waveguides 1808a to 1808e. Each of the deflecting prism gate electrodes 1802a to 1802e includes a gate portion that is configured with a respective angled apex surface 1810a to 1810e. Voltage supplied to any of the deflecting prism gate electrodes 1802a to 1802e results in an increase in the propagation constant within the corresponding region of changeable propagation constant 190 (that forms in the waveguide below the corresponding deflecting prism gate electrode 1802a to 1802e shown in FIG. 18) associated with that particular deflecting prism's gate electrode.

Although the FIG. 18 embodiment of waveguide operates similarly to the FIG. 15 embodiment of waveguide, if no voltage is applied to any particular deflecting prism gate electrode 1802a to 1802e, then the light travels directly through the waveguide associated with that deflecting prism gate electrode and substantially straight to a respective receiver waveguide 1808a to 1808e located in front of that deflecting prism gate electrode. The apex angles 1810a and 1810e (and/or the angles of the waveguide as shown in the FIG. 17 embodiment) of the outer most deflecting prism gate electrodes 1802a and 1802e are angled at a greater angle than deflecting prism gate electrodes 1802b, 1802c, and 1802d. An increase in the apex angle 1810a and 1810e allows light flowing through the waveguide to be deflected through a greater angle toward the more distant receivers 1808a to 1808e. It may also be desired to minimize the lateral spacing between each successive deflecting prism gate electrode 1802a to 1802e, and the lateral spacing between each respective receiver 1808a to 1808e to minimize the necessary deflection angle for the deflecting prism gate electrodes. The apex angle of those deflecting prism gate electrodes that are generally to the left of an axial centerline of the optical switch (and thus have to deflect their light to the right in most distances) are angled oppositely to the apex angle of those deflecting prism gate electrodes that are to the right of the centerline of that switch that have to deflect their light to the left in most instances. Deflecting prism gate electrodes 1802*b*, 1802*c*, and 1802*d* that have other deflecting prism gate electrodes locate to both their right and left should also have receivers located both to their right and left as shown in FIG. 18 and therefore must be adapted to provide for deflection of light to either the left or right. For example, the deflecting prism gate electrode 1802*c* must cause light traveling through its waveguide to be deflected to the right when transmitting its signal to the receivers 1808*d* or 1808*e*. By comparison, the deflecting prism gate electrode 1802*c* must cause light that is passing through its waveguide to be deflected to its left when deflecting light to receivers 1808*a* and 1808*b*.

Optical switch 1800 has the ability to act extremely quickly, partly due to the fact that each deflecting prism gate electrode has no moving parts. Each of the deflecting prism gate electrodes 1802*a* to 1802*e* can be adjusted and/or calibrated by controlling the voltage applied to that deflecting prism gate electrode using the techniques described in FIGS. 7 and 8. Applying the voltage to the deflecting prism gate electrodes 1802*a* to 1802*e* results in an increase, or decrease (depending on polarity), of the propagation constant level of the region of changeable propagation constant in the waveguide associated with that deflecting prism gate electrode 1802*a* to 1802*e*.

Figure 19:
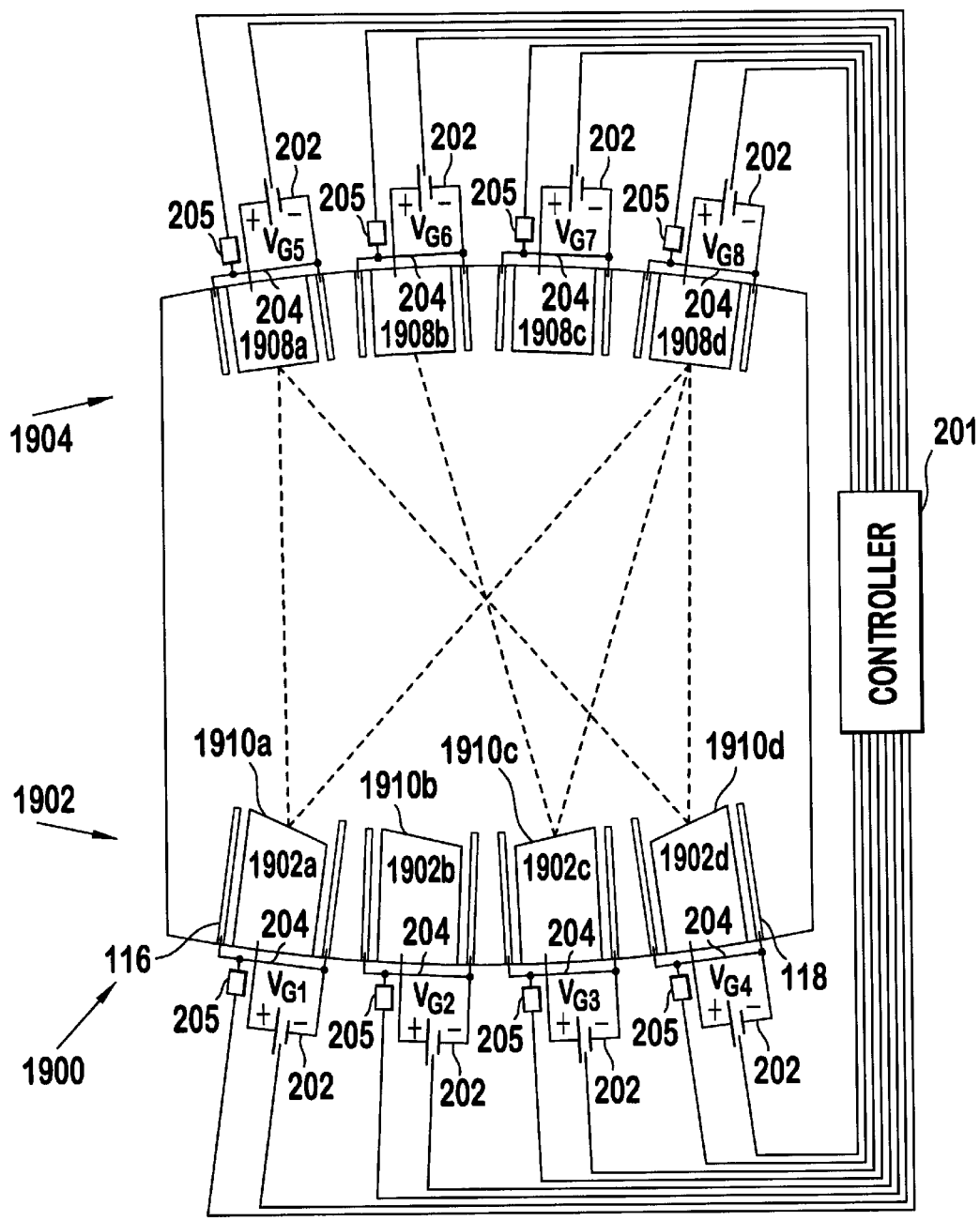
FIG. 19 shows a top view of another embodiment of an optical switch device from that shown in FIG. 18, that may include one embodiment of the optical deflectors shown in FIG. 14, 15, or 16.

FIG. 19 shows another embodiment of optical switch 1900. The optical switch includes a concave input switch portion 1902 and a concave output switch portion 1904. The input switch portion 1902 includes a plurality of deflecting prism gate electrodes 1902*a* to 1902*d* (having respective apex angles 1910*a* to 1910*d*) that operate similarly to the FIG. 18 embodiment of deflecting prism gate electrodes 1802*a* to 1802*e*. Similarly, the concave output switch portion 1902 includes a plurality of receivers 1908*a* to 1908*d*. Each one of the receivers 1908*a* to 1908*d* operates similarly to the FIG. 18 embodiment of receivers 1808*a* to 1808*e*. The purpose of the concavity of the concave input switch deflector portion 1902 and the concave output portion 1904 is to minimize the maximum angle through which any one of the optical deflecting prism gate electrodes has to deflect light to reach any one of the receivers. This is accomplished by mounting each of the optical deflecting prism gate electrodes at an angle that bisects the rays extending to the outermost receivers 1908*a* to 1908*d*. The mounting of the optical deflecting gate electrodes also generally enhances the reception of light by the receivers since each receiver is directed at an angle that more closely faces the respective outermost optical deflecting prism gate electrodes. The operation of the embodiment of optical switch 1900 in FIG. 19 relative to the deflecting prism gate electrodes 1902*a* to 1902*d* and the receivers 1908*a* and 1908*d* is similar to the above-described operation of the optical switch 1800 in FIG. 18 relative to the respective deflecting prism gate electrodes 1802*a* to 1808*e* (except for the angle of deflection of the deflecting prism gate electrode).

3C. Optical Gratings

Bragg Gratings in the dielectric slab waveguide as well as in fibers are well known to perform various optical functions such as optical filtering, group velocity dispersion control, attenuation, etc. The fundamental principle behind Bragg grating is that small, periodic variation in the mode index or the propagation constant leads to resonant condition for diffraction of certain wavelengths.

These wavelengths satisfy the resonant condition for build up of diffracted power along certain direction. The wavelength selectivity depends on the design of the grating structure. In the case presented here, we envision a Bragg grating that is electrically controlled via the effect of 2DEG. There are many ways to produce the undulating pattern in 2DEG. The methods include: undulation in the effective dielectric constant of the gate insulator, patterned gate metal, periodic doping modulation etc. FIG. 20 is one example. In FIG. 20 the gate dielectric is divided into two gate insulators of different dielectric strength.

FIGS. 20 to 22 show a variety of embodiments of optical Bragg gratings in which the shape or configuration of the gate electrode 120 of the optical waveguide device 106 is slightly modified. Bragg gratings perform a variety of functions in optical systems involving controllable optical refraction as described below. In the different embodiments of optical Bragg gratings, a series of planes of controllable propagation constant (compared to the surrounding volume within the waveguide) are projected into the waveguide 106. The planes of controllable propagation constant may be considered to form one embodiment of a region of changeable propagation constant 190, similar to those shown and described relative to FIGS. 1–3, 4, or 5. In the FIG. 20 embodiment of optical Bragg grating 2000, the second insulator layer 110 is provided with a corrugated lower surface 2002. The corrugated lower surface includes a plurality of raised lands 2004 that provide a variable thickness of the second insulator layer 110 between different portions of the corrugated lower surface of the second electrical insulator layer or oxide 110 and the gate electrode 120. Each pair of adjacent raised lands 2004 are uniformly spaced for one Bragg grating.

A distance T1 represents the distance between the raised lands 2004 of the corrugated surface 2002 and the gate electrode 120. A distance T2 represents the distance from the lower most surface of the corrugated surface 2002 and the gate electrode 122. Since the distance T1 does not equal T2, the electrical field at the insulator/semiconductor interface of the second insulator layer 110 from the gate electrode to the waveguide 106 will vary along the length of the waveguide. For example, a point 2006 in the waveguide that is underneath the location of one of the raised lands 2004 experiences less electrical field at the insulator/semiconductor interface to voltage applied between the gate electrode and the waveguide than point 2008 that is not underneath the location of one of the raised lands. Since the resistance of the second insulator layer 110 in the vertical direction varies along its length, the resistance between the gate electrode and the waveguide (that has the second insulating layer interspersed there between) varies along its length. The strength of the electric field applied from the gate electrode into the waveguide varies as a function of the thickness of the second insulator layer 110. For example, the projected electric field within the waveguide at point 2006 exceeds the projected electric field at point 2008. As such, the resultant free carrier charge distribution in the 2DEG above point 2006 exceeds the resultant free carrier charge distribution in the 2DEG above point 2008. Therefore, the resultant propagation constant in the projected region of changeable propagation constant 190 in the waveguide at point 2006 exceeds the resultant propagation constant in the projected region of changeable propagation constant 190 in the waveguide at point 2008.

The raised lands 2004 are typically formed as grooves in the second insulator layer 110 that extend substantially perpendicular to, or angled relative to, the direction of light propagation within the waveguide. The raised lands 2004 may extend at a slight angle as described with respect to FIG. 23 so that reflected light passing through the waveguide may be deflected at an angle to, e.g., another device. A low insulative material 2010 is disposed between the second electrical insulator layer 110 and waveguide 106. The previously described embodiments of optical waveguide devices relied on changes in the planar shape of the gate electrode to produce a variable region of changeable propagation constant 190 across the waveguide. The FIGS. 20 to 22 embodiments of optical waveguide devices rely on variations of thickness (or variation of the electrical resistivity of the material) of the gate electrode, or the use of an insulator under the gate electrode, to produce a variable propagation constant across the waveguide.

Since a variable electromagnetic field is applied from the gate electrode 120 through the second electrical insulator layer or oxide 110 to the waveguide 106, the propagation constant of the waveguide 106 will vary. The carrier density in the 2DEG 108 will vary between the location in the 2DEG above the point 2006 and above the point 2008. More particularly, the lower resistance of the second electrical insulator layer or oxide at point 2006 that corresponds to distance T1 will result in an increased carrier density compared to the point 2008 on the 2DEG that corresponds to an enhanced distant T2, and resulting in an increased resistance of the 2DEG. Such variation in the propagation constant along the length of the waveguide 106 results only when gate electrode 120 is actuated. When the gate electrode is deactuated, the propagation constant across the waveguide 106 is substantially uniform. In the FIGS. 20 to 22 embodiments of optical gratings, the propagation constant is changed by the thickness of the gate electrode, i.e., the raised lands locations. Therefore, this embodiment of optical waveguide device changes the propagation constant by changing the thickness of the gate electrode to form the Bragg gratings, not by changing the shape of the gate electrode.

Such a variation in propagation constant within certain regions at the waveguide 106 will result in some percentage of the light traveling along the waveguide 106 to be reflected. The variation in the propagation constant extends substantially continuously across the length of the FIG. 20 embodiment of waveguide 106. As such, even though a relatively small amount of energy of each light wave following a direction of light travel 101 will be reflected by each plane projected by a single recess, a variable amount of light can be controllably reflected by the total number of planes 2012 in each Bragg grating. The distance d in the direction of propagation of light between successive planes within the Bragg grating is selected so that the lightwaves reflected from planes 2012 are in phase, or coherent, with the light reflected from the adjacent planes. The strength of the 2DEG determines the reflectivity or the diffraction efficiency of the Bragg structure. By varying the strength, we may chose to control the light diffracted by the Bragg structure. This will be useful in construction of the attenuators, modulators, switches etc.

The lightwaves travelling in direction 101 from the adjacent phase planes 2012 will be in phase, or coherent, for a desired light of wavelength λ if the difference in distance between light reflected from successive planes 2012 equals an integer multiple of the wavelength of the selected light. For example, light traveling along the waveguide 106 (in a direction from left to right as indicated by the arrow in waveguide 106) that is reflected at the first plane 2012 (the plane farthest to the left in FIG. 20) is reflected either along the waveguide 106 or at some angle at which the reflected light beam is deflected, and travels some distance shorter than light reflected off the next plane (the first plane to the right of the leftmost plane 2012 in FIG. 20).

Light reflected from the Bragg gratings of the waveguide will be in-phase, or coherent, when the distance d between recesses taken in a direction parallel to the original direction of propagation of the light in the waveguide is an integer multiple of a selected bandwidth of light. In the FIG. 23 embodiment of Bragg grating, light reflected off successive planes 2311 would coherently add where the distance "d" is some integer multiple of the wavelength of the reflected light. The other wavelengths of light interfere destructively, and cannot be detected by a detector.

The FIG. 21 embodiment of Bragg grating 2100 includes a plurality of insulators 2102 evenly spaced between the electrical insulator layer 110 and the waveguide 106. The electrical resistance of the insulators 2102 differs from that of the electrical insulator layer 110. Alternatively, inserts could be inserted having a different electrical resistance than the remainder of the electrical insulator layer. The insulator 2102 limits the number of carriers that are generated in those portions of the 2DEG 108 below the insulators 2102 compared to those locations in the 2DEG that are not below the insulators 2102. As such, the propagation constant in those portions of the waveguide 106 that are below the insulators 2102 will be different than the propagation constant in those portions of the waveguide that are not below the insulators 2102. Planes 2112 that correspond to the regions of changed propagation constant within the waveguide under the insulators that are projected into the waveguide 106. Such planes 2112 are therefore regularly spaced since the location of the projected regions of changeable propagation constant corresponds directly to the location of the insulators 2102. The insulator properties that control the strength of the electric field at the insulator/semiconductor interface are due to its dielectric constant at the modulation frequencies of interest. The insulator may have variable dielectric constant at radio frequencies but is substantially unchanged at the optical frequencies. Thus, optical wave does not "see" the undulation unless induced by 2DEG.

In the FIG. 22 embodiment of optical Bragg grating 2200, another shape of regularly shaped patterning, that may take the form of corrugated patterns along the bottom surface of the gate electrode 120, is formed in the gate electrode 120. The optical Bragg grating 2200 includes a series of raised lands 2202 formed in the lower surface the of the metal gate electrode 120. These raised lands 2202 may be angled relative to the waveguide for a desired distance. The raised lands 2202 in the gate electrode are configured to vary the electrical field at the insulator/semiconductor interface to the waveguide 106 in a pattern corresponding to the arrangement of the raised lands 2202. For example, the propagation constant will be slightly less in those regions of the waveguide underneath the raised lands 2202 than in adjacent regions of the waveguide since the distance that the raised lands 2202 are separated from the waveguide is greater than the surrounding regions.

In this disclosure, Bragg gratings may also be configured using a SAW, or any other similar acoustic or other structure that is configured to project a series of parallel planes 2112 representing regions of changeable propagation constant into the waveguide 106.

The planes 2311 are each angled at an angle α from the direction of propagation of the incident light 2304. As such, a certain amount of light is reflected at each of the planes 2311, resulting in reflected light 2306. The majority of light 2304 continues straight through the waveguide past each plane 2311, with only a relatively minor portion being reflected off each plane to form the reflected light 2306. The difference in distance traveled by each successive plane 2311 that reflects light is indicated, in FIG. 23, by the distance d measured in a direction parallel to the incident light beam 2304. Therefore, distance d is selected to be some multiple of the wavelength of the light that is to be reflected from the FIG. 23 embodiment of optical Bragg grating. The selected wavelength λ of light that reflect off successive planes spaced by the distance d must satisfy the equation:

$$2 \sin \alpha = \lambda/d \qquad 9$$

Figure 23:
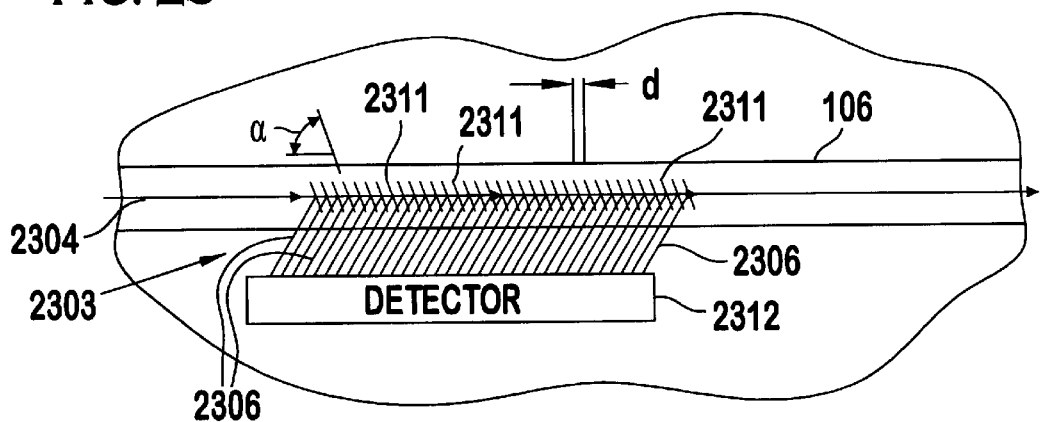
FIG. 23 shows one embodiment of a waveguide having a Bragg grating of the type shown in FIGS. 20 to 22 showing a light ray passing through the optical waveguide device, and the passage of reflected light refracting off the Bragg grating.

If each reflected light path 2306 distance varies by an integer multiple of the wavelength of the selected light, the light at that selected wavelength will constructively interfere at a detector 2312 and thus be visible. The detector can be any known type of photodetector. Since the distance d has been selected at a prescribed value, the distance of each ray of reflected light 2306 off each plane travels a slightly greater distance than a corresponding ray of light reflected off the preceding plane (the preceding plane is the plane to the left as shown in FIG. 23). Those wavelengths of light that are not integer multiples of the distance d, will interfere destructively and thus not be able to be sensed by the detector 2312.

The Bragg gratings represent one embodiment of a one-dimensional periodic structure. More complicated optical functions may be achieved by using a two dimensional periodic patterns. One embodiment of a two-dimensional periodic structure that corresponds to the Bragg grating includes using a "polka dot" pattern, in which the reflectivity of a particular group of wavelengths are unity in all directions in the plane. A "line defect" in the pattern may be provided that results in the effective removal of one or more of these "polka dots" along a line in a manner that causes guiding of light along the line defect. Many geometrical shapes can be used in addition to circles that form the polka dot patter. All of these can be achieved by generalization of the Bragg gratings discussed in detail above to the one-dimensional patterns.

Figure 24:
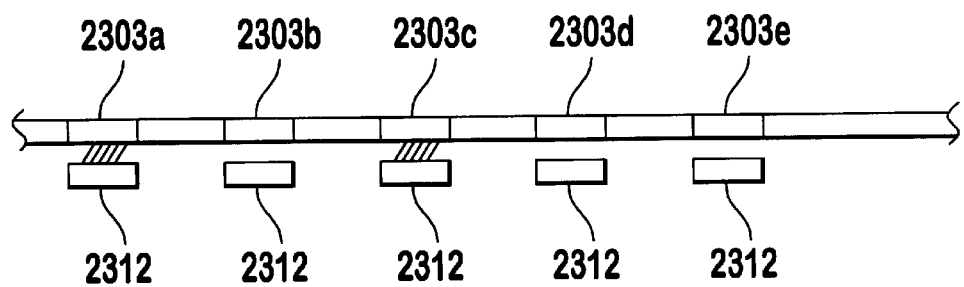
FIG. 24 shows an optical waveguide device including a plurality of Bragg gratings of the type shown in FIGS. 20 to 22, where the Bragg gratings are arranged in series.

FIG. 23 shows one embodiment of optical Bragg grating 2303 that is configured to diffract light. A series of such optical Bragg gratings labeled as 2303a to 2303e can be applied to the FIG. 24 embodiment of waveguide. The specific optical Bragg grating 2303 relating to a desired wavelength λ of light can be actuated, while the remainder of the optical Bragg gratings 2303 are deactuated. One design may provide a plurality of optical Bragg gratings 2303 arranged serially along a channel waveguide, with only a minimal difference between the wavelengths λ of the reflected light by successive optical Bragg gratings 2303a to 2303e. For example, the first optical Bragg grating 2303a reflects light having a wavelength $\lambda_1$ that exceeds the wavelength $\lambda_2$ of the light that is diffracted by the second optical grating 2303b. Similarly, the wavelength of light that can be reflected by each optical Bragg grating is greater than the wavelength that can be reflected by subsequent Bragg gratings. To compensate for physical variations in the waveguide (resulting from variations in temperature, device age, humidity, or vibrations, etc.), a Bragg grating that corresponds to a desired wavelength of reflected light may be actuated, and then the reflected light monitored as per wavelength. If multiple optical Bragg gratings are provided to allow for adjustment or calibration purposes, then the differences in spacing between successive planes of the different optical Bragg gratings is initially selected. If it is found that the actuated Bragg grating does not deflect the desired light (the wavelength of the deflected light being too large or too small), then another optical Bragg grating (with the next smaller or larger plane spacing) can then be actuated. The selection of the next Bragg grating to actuate depends upon whether the desired wavelength of the first actuated optical Bragg grating is more or less than the wavelength of the diffracted light. This adjustment or calibration process can be performed either manually or by a computer using a comparison program, and can be performed continually during normal operation of an optical system employing optical Bragg gratings.

Figure 25:
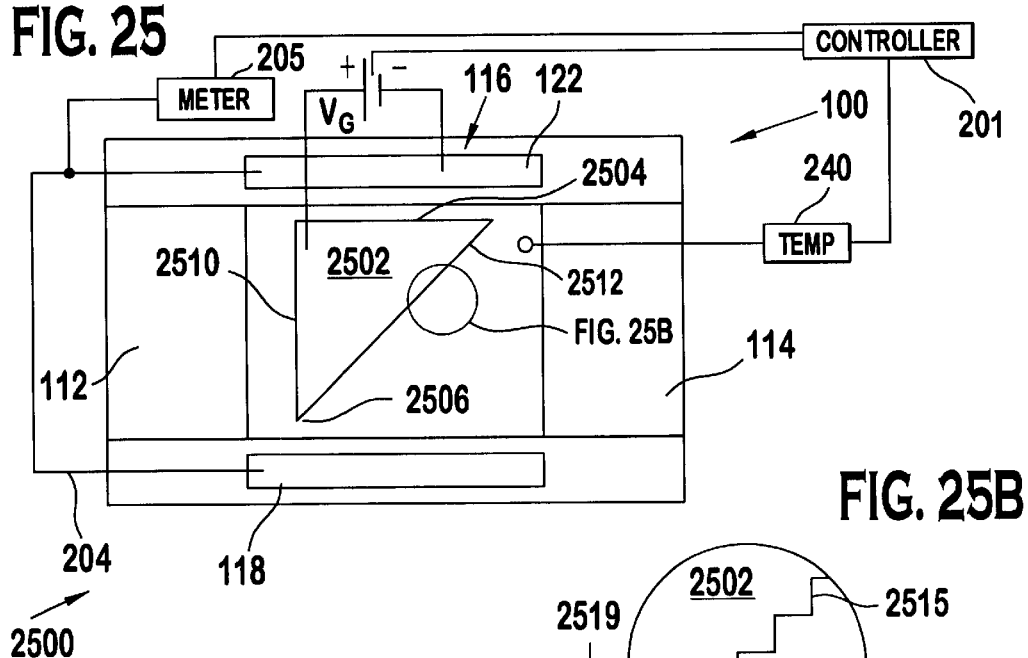
FIG. 25, which is shown exploded in FIG. 25B, shows a respective top view and top exploded view of another embodiment of an optical waveguide device including a gate electrode configured that may be configured as an Echelle diffraction grating or an Echelle lens grating.
Figure 25B:
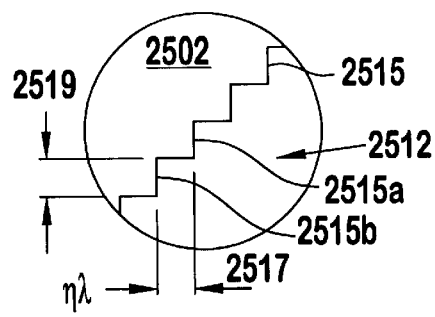

FIG. 25 shows one embodiment of Echelle grating 2500. The Echelle grating 2500 may be used alternatively as a diffraction grating or a lens grating depending on the biasing of the gate electrode. The Echelle grating 2500 is altered from the FIGS. 1 to 3 and 5 embodiment of optical waveguide device 100 by replacing the rectangular gate electrode by a triangular-shaped Echelle gate electrode 2502. The Echelle-shaped gate electrode 2502 includes two parallel sides 2504 and 2506 (side 2506 is shown as the point of the triangle, but actually is formed from a length of material shown in FIG. 26 as 2506), a base side 2510, and a planar grooved surface 2512.

Figure 26:
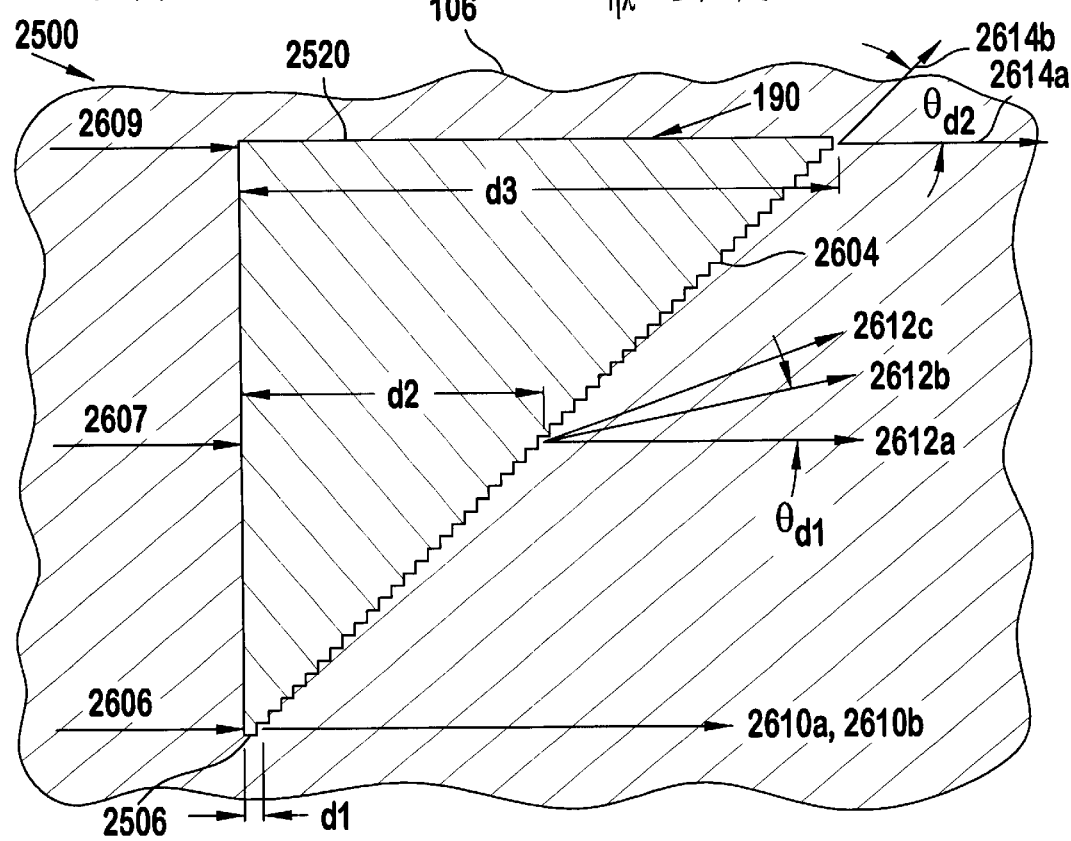
FIG. 26 shows a top cross sectional view taken within the waveguide of the optical waveguide device illustrating the diffraction of optical paths as light passes through the actuated Echelle diffraction grating shown in FIG. 25, wherein the projected outline of the region of changeable propagation constant from the Echelle diffraction grating is shown.

The base surface 2510 extends substantially perpendicular to the incident direction of travel of light (the light is indicated by arrows 2606, 2607, and 2609 shown in FIG. 26) entering the Echelle grating. The grooved side 2512 is made of a series of individual grooves 2515 that extend parallel to the side surface, and all of the grooves regularly continue from side 2504 to the other side 2506. Each groove 2515 includes a width portion 2519 and rise portion 2517.

The rise portion 2517 defines the difference in distance that each individual groove rises from its neighbor groove. The rise portion 2517 for all of the individual grooves 2515 are equal, and the rise portion 2517 equals some integer multiple of the wavelength of the light that is to be acted upon by the Echelle grating 2500. Two exemplary adjacent grooves are shown as 2515a and 2515b, so the vertical distance between the grooves 2515a and 2515b equals 2517. The width portion 2519 of the Echelle shape gate electrode 2502 is equal for all of the individual grooves. As such, the distance of the width portion 2519 multiplied by the number of individual grooves 2515 equals the operational width of the entire Echelle shaped gate electrode. Commercially available three dimensional Echelle gratings that are formed from glass or a semiconductor material have a uniform cross section that is similar in contour to the Echelle shaped gate electrode 2502. The projected region of changeable propagation constant 190 can be viewed generally in cross-section as having the shape and dimensions of the gate electrode (including grooves), and extending vertically through the entire thickness of the waveguide 106. The numbers of individual grooves 2515 in the FIG. 25 embodiment of Echelle shaped gate electrode 2502 may approach many thousand, and therefore, the size may become relatively small to provide effective focusing.

FIG. 26 shows the top cross sectional view of region of changeable propagation constant 190 shaped as an Echelle grating 2500. The waveguide 106 is envisioned to be a slab waveguide, and is configured to permit the angular defraction of the beam of light emanating from the Echelle grating 2500. When voltages are applied to the FIG. 25 embodiment of Echelle shaped gate electrode 2502, a projected region of changeable propagation constant 190 of the general shape shown in FIG. 26 is established within the waveguide 106. Depending upon the polarity of the applied voltage to the Echelle shaped gate electrode in FIG. 25, the propagation constant within the projected region of changeable propagation constant 190 can either exceed, or be less than, the propagation constant within the waveguide outside of the projected region of changeable propagation constant 190. The relative level of propagation constants within the projected region of changeable propagation constant 190 compared to outside of the projected region of changeable propagation constant determines whether the waveguide 106 acts to diffract light or focus light. In this section, it is assumed that the voltage applied to the gate electrode is biased so the Echelle grating acts to diffract light, although equivalent, techniques would apply for focusing light, and are considered a part of this disclosure.

In FIG. 26, three input light beams 2606, 2607, and 2609 extend into the waveguide. The input light beams 2606, 2607, and 2609 are shown as extending substantially parallel to each other, and also substantially parallel to the side surface 2520 of the projected region of changeable propagation constant 190. The projected region of changeable propagation constant 190 as shown in FIG. 26 precisely mirrors the shape and size of the FIG. 25 embodiment of Echelle shaped gate electrode 2502. As such, the projected region of changeable propagation constant 190 can be viewed as extending vertically through the entire thickness of the waveguide 106. The numbers of individual grooves 2515 in the FIG. 25 embodiment of Echelle shaped gate electrode 2502 may approach many thousand to provide effective diffraction, and therefore, individual groove dimensions are relatively small. It is therefore important that the projected region of changeable propagation constant 190 precisely maps from the Echelle shaped gate electrode 2502.

Three input beams in 2606, 2607, and 2609 are shown entering the projected region of changeable propagation constant 190, each containing multiple wavelengths of light. The three input beams 2606, 2607, and 2609 correspond respectively with, and produce, three sets of output beams 2610a or 2610b; 2612a, 2612b or 2612c; and 2614a or 2614b as shown in FIG. 26. Each diffracted output beam 2610, 2612, and 2614 is shown for a single wavelength of light, and the output beam represents the regions in which light of a specific wavelength that emanate from different grooves 2604 will constructively interfere. In other directions, the light destructively interferes.

The lower input light beam 2606 that enters the projected region of changeable propagation constant 190 travels for a very short distance d1 through the projected region of changeable propagation constant 190 (from the left to the right) and exits as output beam 2610a or 2610b. As such, though the region of changeable propagation constant 190 has a different propagation constant then the rest of the waveguide 106, the amount that the output beam 2610a, or 2610b is diffracted is very small when compared to the amount of diffraction of the other output beams 2612, 2614 that have traveled a greater distance through the projected region of changeable propagation constant 190.

The middle input light beam 2607 enters the projected region of changeable propagation constant 190 and travels through a considerable distance d2 before exiting from the Echelle grating. If there is no voltage applied to the gate electrode, then the output light will be unaffected by the region of changeable propagation constant 190 as the light travels the region, and the direction of propagation for light following input path 2607 will be consistent within the waveguide along 2612a. If a voltage level is applied to the FIG. 25 embodiment of gate electrode 2502, then the propagation constant within the region of changeable propagation constant 190 is changed from that outside the region of changeable propagation constant. The propagation constant in the region of changeable propagation constant 190 will thereupon diffract light passing from the input light beam 2607 through an angle $\theta_{d1}$ along path 2612b. If the voltage is increased, the amount of diffraction is also increased to along the path shown at 2612c.

Light corresponding to the input light beam 2609 will continue straight along line 2614a when no voltage is applied to the gate electrode. If a prescribed level of voltage is applied to the gate electrode, the output light beam will be diffracted through an output angle $\theta_{d2}$ along output light beam 2614b. The output angle $\theta_{d2}$ of output diffracted beam 2614b exceeds the output angle $\theta_{d1}$ of diffracted beam 2612b. The output angle varies linearly from one side surface 2522 to the other side surface 2520, since the output angle is a function of the distance the light is travelling through the projected region of changeable propagation constant 190.

When the Echelle grating diffracts a single wavelength of light through an angle in which the waves are in phase, the waves of that light constructively interfere and that wavelength of light will become visible at that location. Light of different wavelength will not constructively interfere at that same angle, but will at some other angle. Therefore, in spectrometers, for instance, the location that light appears relates to the specified output diffraction angles of the light, and the respective wavelength of the light within the light beam that entered the spectrometer.

Figure 27:
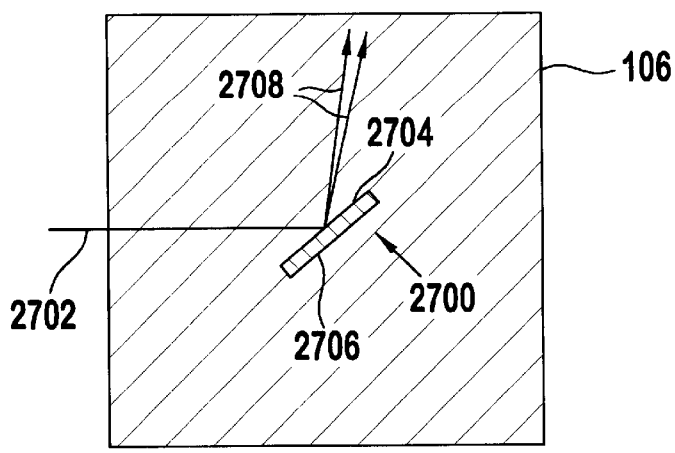
FIG. 27 shows an expanded view of the optical waveguide device biased to operate as an Echelle diffraction grating as shown in FIG. 26.

FIG. 27 shows one embodiment of Echelle grating 2700 that is configured to reflect different wavelengths of light (instead of diffracting light) through an output reflection angle. For instance, an input light beam 2702 of a prescribed wavelength, as it contacts a grating surface 2704 of a projected Echelle grating 2706, will reflect an output light beam 2708 through an angle. The propagation constant of the region of changeable propagation constant 190 will generally have to be higher than that for a diffraction Echelle grating. In addition, the angle at which the grating surface 2704 faces the oncoming input light beam 2702 would probably be lower if the light is refracted, not reflected. Such design modifications can be accomplished by reconfiguring the shape of the gate electrode in the optical waveguide device. Shaping the gate electrodes is relatively inexpensive compared with producing a distinct device.

3D. Optical Lenses

Waveguide lenses are important devices in integrated optical circuits because they can perform various essential functions such as focusing, expanding, imaging, and planar waveguide Fourier Transforms.

The FIG. 25 embodiment of Echelle grating 2500 can be used not only as a diffraction grating as described relative to FIG. 26, but the same structure can also be biased to perform as a lens to focus light. To act as a lens, the polarity of the voltage of the Echelle grating 2500 applied between the gate electrode and the combined first body contact/second body contact electrodes is opposite that shown for the FIG. 26 embodiment of diffraction grating.

Figure 28:
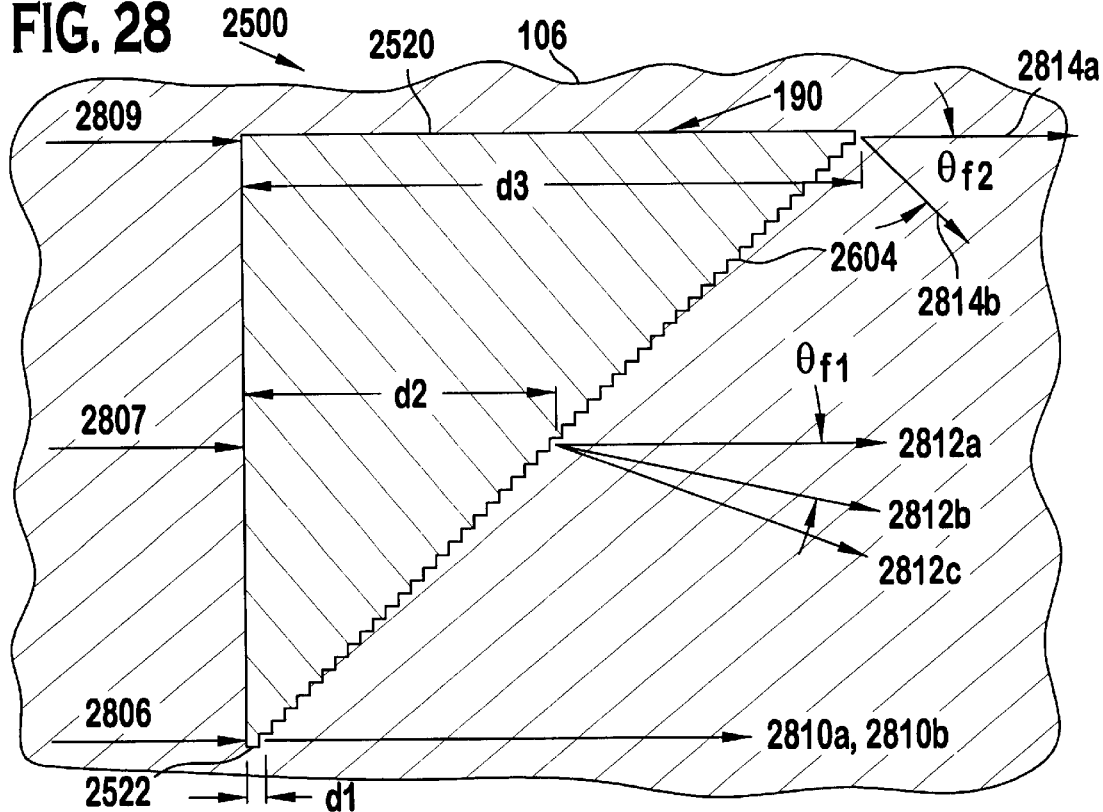
FIG. 28 shows a top cross sectional view taken through the waveguide of the optical waveguide device illustrating the focusing of multiple optical paths as light passes through the actuated Echelle lens grating shown in FIG. 25, illustrating the region of changeable propagation constant resulting from the Echelle lens grating.
Figure 29:
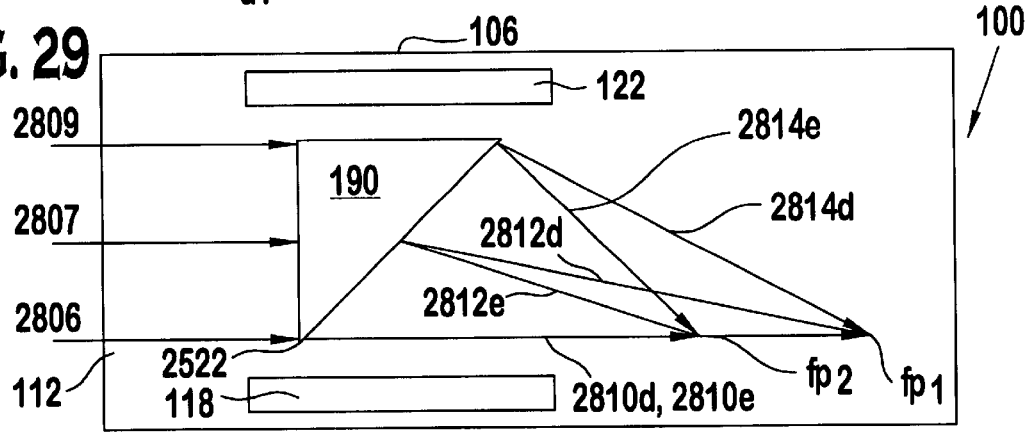
FIG. 29 shows an expanded view of the optical waveguide device biased to operate as an Echelle lens grating as shown in FIG. 28.

FIGS. 28 and 29 show three input light beams that extend into the region of altered propagation constant 190 in the waveguide are shown as 2806, 2807, and 2809. The input light beams 2806, 2807, and 2809 are shown as extending substantially parallel to each other, and also substantially parallel to the side surfaces 2520, 2522 of the projected region of changeable propagation constant 190. The projected region of changeable propagation constant 190 shown in FIGS. 28 and 29 generally mirrors vertically through the height of the waveguide the shape and size of the FIG. 25 embodiment of Echelle shaped gate electrode 2502.

The light input from the input beams 2806, 2807, and 2809 extend through the region of changeable propagation constant 190 to form, respectively, the three sets of output beams 2810a and 2810b; 2812a, 2812b and 2812c; and 2814a and 2814b as shown in FIG. 28. Each focused output beam 2810, 2812, and 2814 is shown for a single wavelength of light, and the output beam represents the direction of travel of a beam of light of a specific wavelength in which that beam of light will constructively interfere. In other directions, the light of the specific wavelength destructively interferes.

The lower input light beam 2806 that enters near the bottom of the projected region of changeable propagation constant 190 travels for a very short distance d1 through the projected region of changeable propagation constant 190 (as shown from the left to the right) and exits as output beam 2810a or 2810b. As such, though the region of changeable propagation constant 190 has a different propagation constant then the rest of the waveguide 106. The amount that the output beam 2810a is focused is very small when compared to the amount of focusing on the other output beams 2812, 2814 that have traveled a greater distance through the region of changeable propagation constant 190.

The middle input light beam 2807 enters the projected region of changeable propagation constant 190 and travels through a considerable distance d2 before exiting from the projected Echelle grating. If there is no voltage applied to the gate electrode, then the output light will be unaffected by the region of changeable propagation constant 190, and light following input path 2807 will continue straight after exiting the waveguide along 2812a. If a medium voltage level is applied to the gate electrode, then the propagation constant within the region of changeable propagation constant 190 will not equal that within the surrounding waveguide. The propagation constant in the region of changeable propagation constant 190 will deflect light beam 2807 through an angle $\theta_{f1}$ along path 2812b. If the voltage is increased, the amount of deflection for focusing is also increased to the angle shown at 2812c.

Light corresponding to the input light beam 2809 will continue straight through the region of changeable propagation constant along line 2814a when no voltage is applied to the gate electrode. If a prescribed level of voltage is applied to the gate electrode, the output light beam will be focused through an output angle $\theta_{f2}$ to along output light beam 2814b. The output angle $\theta_{f2}$ of output focused beam 2814b exceeds the output angle $\theta_{f1}$ of focused beam 2812b if the same voltage applied to the gate electrode. The output angle varies linearly from one side surface 2522 to the other side 2520, since the output angle is a function of the distance the light is travelling through the projected region of changeable propagation constant 190.

FIGS. 28 and 29 demonstrate that a voltage can be applied to an Echelle shaped gate electrode 2602, and that it can be biased in a manner to cause the Echelle grating 2500 to act as a focusing device. The level of the voltage can be varied to adjust the focal length. For example, assume that a given projected region of changeable propagation constant 190 results in the output focused beams 2810, 2812, and 2814 converging at focal point $f_{P1}$. Increasing the gate voltage will cause the propagation constant in the projected region of changeable propagation constant 190 to increase, resulting in a corresponding increase in the output focus angle for each of the output focused beams. As such, the output focus beams would converge at a different point, e.g., at focal point $f_{P2}$, thereby, effectively decreasing the focal length of the lens. The FIGS. 28 and 29 embodiment of focusing mechanism can be used in cameras, optical microscopes, copy machines, etc., or any device that requires an optical focus. There are no moving parts in this device, which simplifies the relatively complex auto focus devices that are presently required for mechanical lenses. Such mechanical autofocus lenses, for example, require precisely displacing adjacent lenses to within a fraction of a wavelength.

Figure 30:
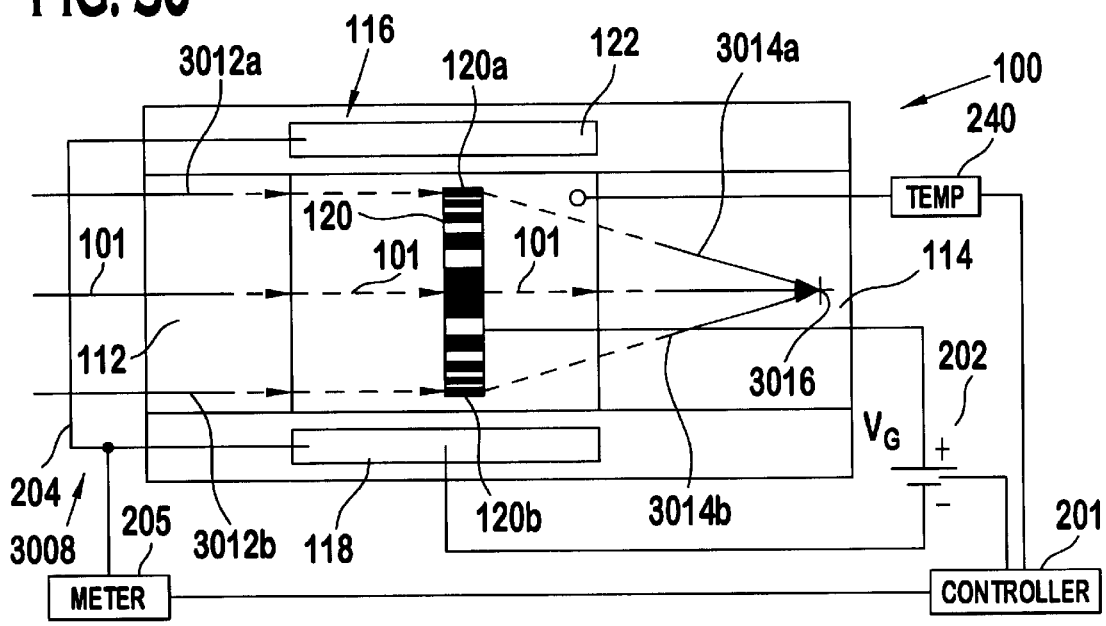
FIG. 30 shows a top view of one embodiment of an optical waveguide device that includes a Bragg grating, and is configured to act as an optical lens.
Figure 30A:
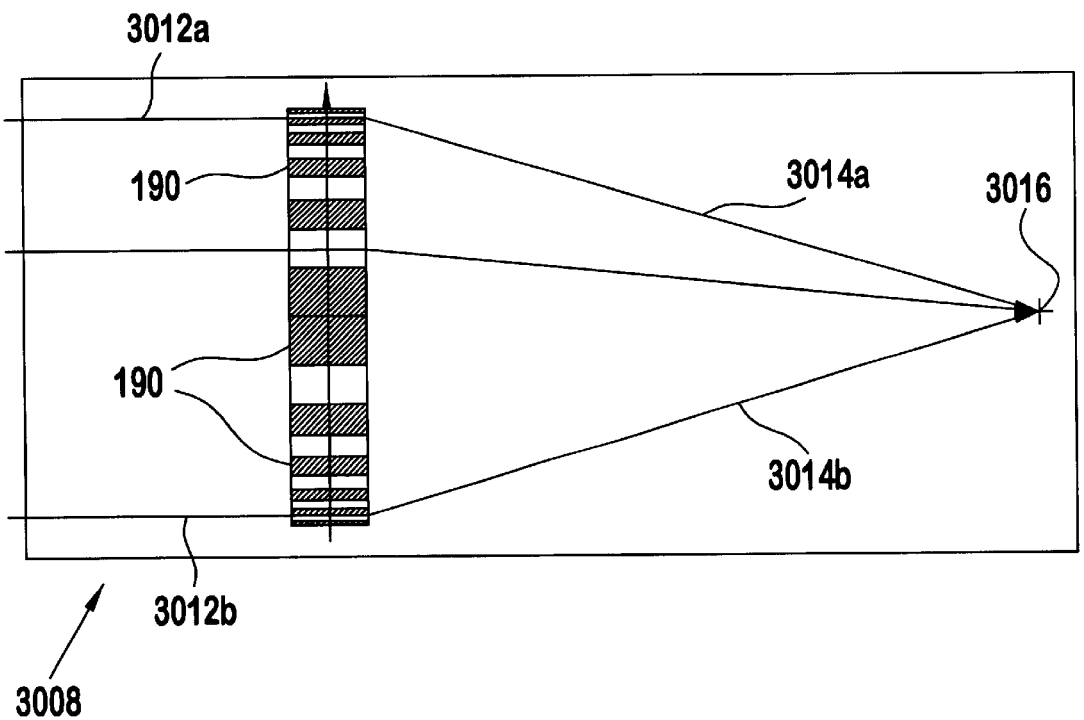
FIG. 30A shows a top cross sectional view taken through the waveguide of the optical waveguide device shown in FIG. 30 illustrating light passing through the waveguide.

FIG. 30 shows another embodiment of an optical waveguide device 100 including a Bragg grating 3008 that is used as a lens to focus light passing through the waveguide. The embodiment of optical waveguide device 100, or more particularly the FIG. 2 embodiment of gate electrode of the optical waveguide device, is modified by replacing the continuous gate electrode (in FIG. 2) with a discontinuous electrode in the shape of a Bragg grating (shown in FIG. 30). The Bragg grating 3008 is formed with a plurality of etchings 3010 that each substantially parallels the optical path 101 of the optical waveguide device. In the FIG. 30 embodiment of Bragg grating 3008, the thickness' of the successive etchings to collectively form gate electrode 120 increase toward the center of the optical waveguide device, and decreases toward the edges 120a, 120b of the gate electrode 120. Therefore, the region of changeable propagation constant 190 in the waveguide is thicker at those regions near the center of the waveguide. Conversely, the region of changeable propagation constant 190 becomes progressively thinner at those regions of the waveguide near edges 120a, 120b. The propagation constant is a factor of both the volume and the shape of the material used to form the gate electrode. The propagation constant is thus higher for those regions of changeable propagation constant closer to the center of the waveguide.

Light is assumed to be entering the waveguide 106 following substantially parallel paths as shown by exemplary paths 3012a and 3012b. Paths 3012a and 3012b represent two paths travelling at the outermost positions of the waveguide. The locations between paths 3012a and 3012b are covered by a continuum of paths that follow similar routes. When sufficient voltage is applied to the Bragg grating shaped electrode, the light following paths 3012a and 3012b will be deflected to follow output paths 3014a and 3014b, respectively. Output paths 3014a and 3014b, as well as the paths of all the output paths that follow through the waveguide under the energized Bragg grating 3008 will be deflected a slightly different amount, all toward a focus point 3016. The FIG. 30 embodiment of optical waveguide device therefore acts as a lens. The Bragg grating 3008, though spaced a distance from the waveguide, can be biased to direct the light in a manner similar to a lens.

The reason why the embodiment of Bragg grating shown in FIG. 30 acts as a lens is now described. Light travelling within the waveguide requires a longer time to travel across those regions of changeable propagation constant at the center (i.e., taken vertically as shown in FIG. 30) than those regions adjacent the periphery of the lens (i.e., near edges 120a, 120b). This longer time results because the propagation constant is greater for those regions near the center. For light of a given wavelength, light exiting the lens will meet at a particular focal point. The delay imparted on the light passing through the regions of changeable propagation constant nearer the center of the lens will be different from that of the light passing near edges 120a, 120b. The total time required for the light to travel to the focal point is made up from the combination of the time to travel through the region of changeable propagation constant 190 added to the time to travel from the region of changeable propagation constant 190 to the focal point. The time to travel through the region of changeable propagation constant 190 is a function of the propagation constant of each region of changeable propagation constant 190. The time to travel from the region of changeable propagation constant 190 to the focal point is a function of the distance from the region of changeable propagation constant 190 to the focal point. As a result of the variation in propagation constant from the center of the waveguide toward the edges 120$a$, 120$b$, a given wavelength of light arrives at a focal point simultaneously, and the lens thereby focuses light.

There has been increasing interest in waveguide lenses such as Fresnel lenses and grating lenses. Such lenses offer limited diffraction performance, and therefore they constitute a very important element in integrated optic devices. Waveguide Fresnel lenses consist of periodic grating structures that cause a spatial phase difference between the input and the output wavefronts. The periodic grating structure gives a wavefront conversion by spatially modulating the grating. Assuming that the phase distribution function of the input and output waves are denoted by $\phi_1$ and $\phi_2$, respectively, the phase difference $\Delta\phi$ in the guided wave structure can be written as:

$$\Delta\phi=\phi_0-\phi_1 \qquad 10$$

The desired wavefront conversion is achieved by a given phase modulation to the input wavefront equal to $\Delta\phi$. The grating for such phase modulation consists of grating lines described by:

$$\Delta\phi=2m\pi \qquad 11$$

where m is an integer, and, for light having a specific wavelength, the light from all of the grating lines will interfere constructively.

The phase difference $\Delta\phi$ for a planar waveguide converging wave follows the expression:

$$\Delta\phi(x)=kn_{eff}(f-\sqrt{x^2+f^2}) \qquad 12$$

where f is the focal length, $n_{eff}$ is the propagation constant of the waveguide, and x is the direction of the spatial periodic grating modulation.

Figure 31:
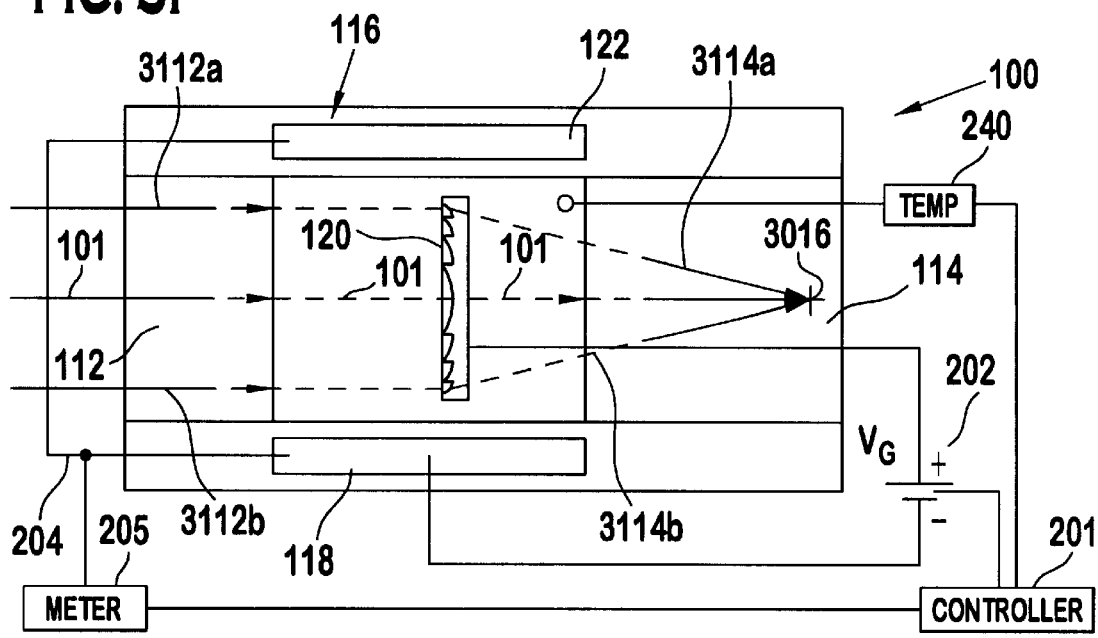
FIG. 31 shows a top view of another embodiment of optical waveguide device that includes a filter grating, and is configured to act as an optical lens.
Figure 31A:
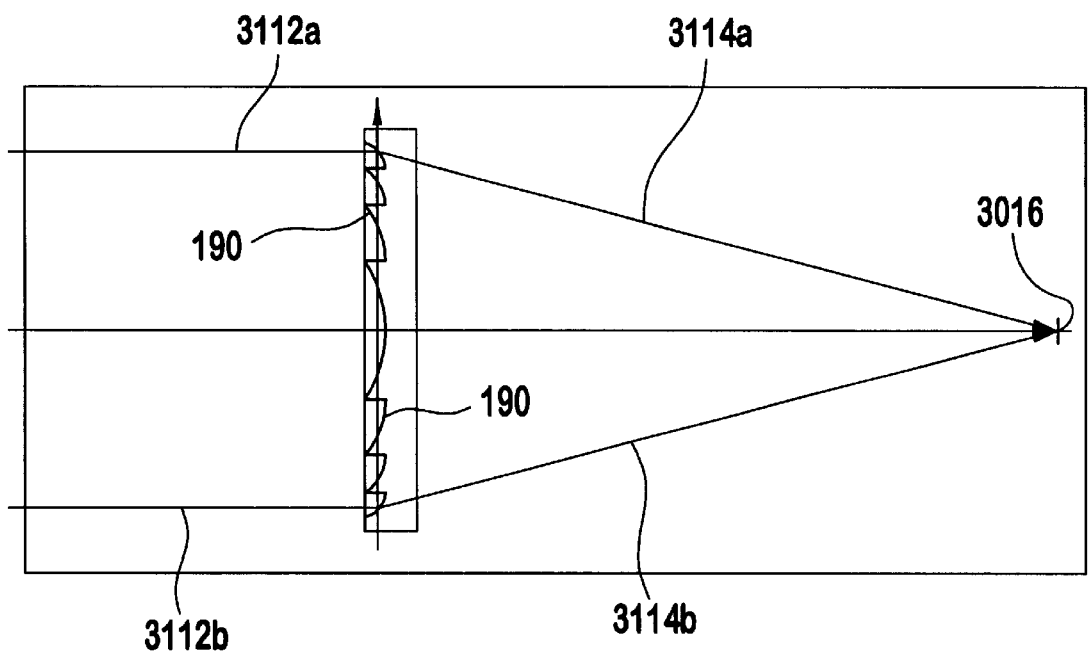
FIG. 31A shows a top cross sectional view taken through the waveguide of the optical waveguide device shown in FIG. 31 illustrating light passing through the waveguide.

FIGS. 30 and 31 show two embodiments of optical waveguide devices that perform waveguide Fresnel lens functions. The two-dimensional Fresnel lenses follow the phase modulation like their three-dimensional lens counterpart:

$$\phi_F(x)=\Delta\phi(x)+2m\pi \qquad 13$$

for $x_m<|x|<x_{m+1}$, the phase modulation $\Delta\phi(x_m)=2m\pi$, which is obtained by segmenting the modulation into Fresnel zones so that $\phi_F(x)$ has amplitude $2\pi$. Under the thin lens approximation, the phase shift is given by $K\Delta nL$. Therefore, the phase of the wavefront for a specific wavelength can be controlled by the variations of $\Delta n$ and L. If $\Delta n$ is varied as a function of x, where the lens thickness, L, is held constant, as shown in FIG. 30, it is called the GRIN Fresnel lens and is described by:

$$\Delta n(x)=\Delta n_{max}(\phi_F(x)/2\pi+1) \qquad 14$$

Figure 32:
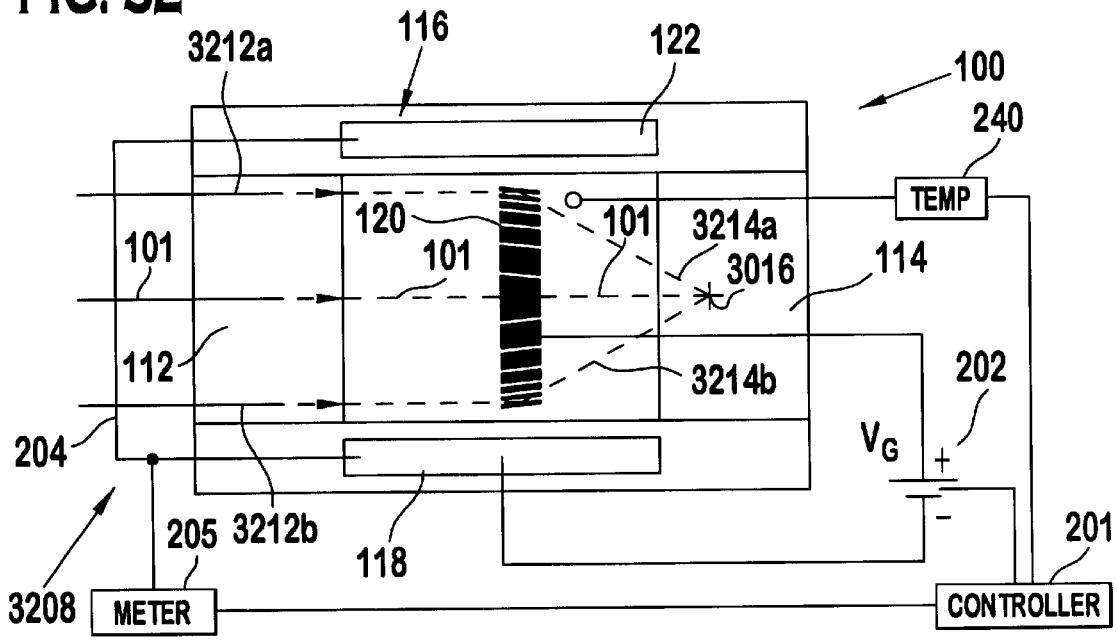
FIG. 32 shows a top view of another embodiment of optical waveguide device that includes a Bragg grating, and is configured to act as an optical lens.
Figure 32A:
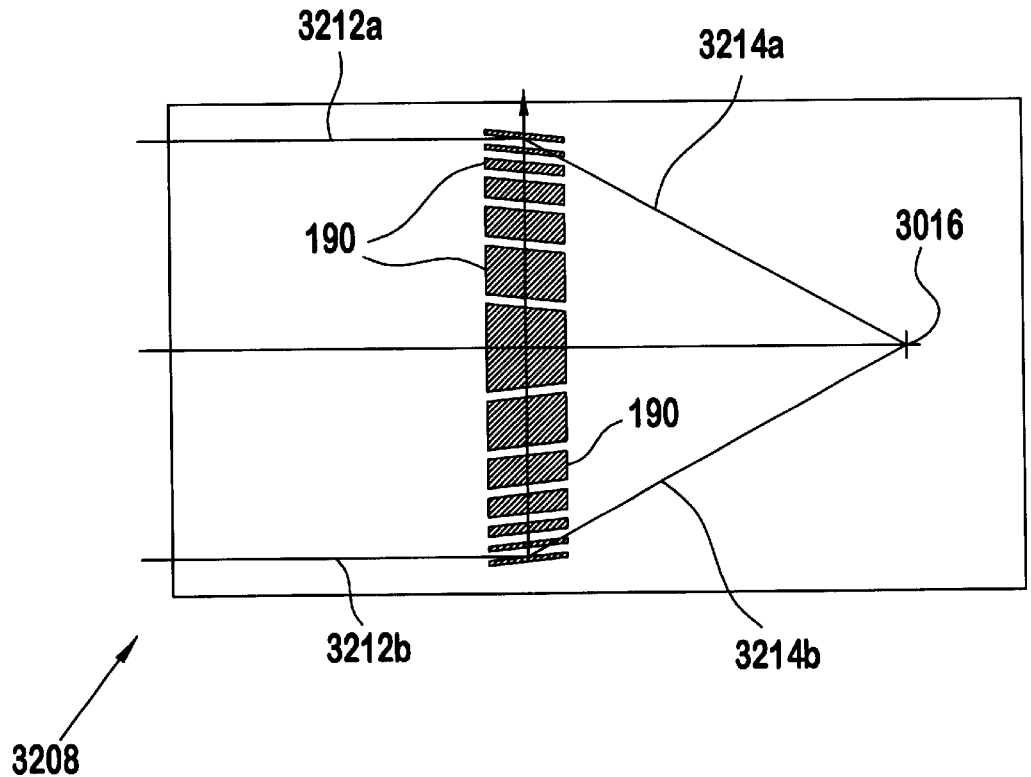
FIG. 32A shows a top cross sectional view taken through the waveguide of the optical waveguide device shown in FIG. 32.

FIG. 32 shows one embodiment of optical waveguide device that operates as a gradient-thickness Fresnel lens where $\Delta n$ is held constant. The thickness of the lens L has the following functional form:

$$L(x)=L_{max}(\phi_F(x)/2\pi+1) \qquad 15$$

To have $2\pi$ phase modulation, in either the FIG. 30 or FIG. 31 embodiment of lens, the modulation amplitude must be optimized. The binary approximation of the phase modulation results in the step-index Fresnel zone lens. The maximum efficiency of 90%, limited only by diffraction, can be obtained in certain lenses.

Another type of optical waveguide device has been designed by spatially changing the K-vector as a function of distance to the central axis, using a so-called chirped Bragg grating configuration. In chirped Bragg grating configurations, the cross sectional areas of the region of changeable propagation constant 190 are thicker near the center of the waveguide than the periphery to provide a greater propagation constant as shown in the embodiment of FIG. 30. Additionally, the output of each region of changeable propagation constant 190 is angled towards the focal point to enhance the deflection of the light toward the deflection point. The architecture of the FIG. 32 embodiment of chirped Bragg grating waveguide lens results in index modulation according to the equation:

$$\Delta n(x)=\Delta n\,\cos[\Delta\phi(x)]=\Delta n\,\cos\{Kn_e[Kn_e(f-\sqrt{x^2+f^2})]\} \qquad 16$$

Where f=focal length, $\Delta\phi$=phase difference; L is the lens thickness of the Bragg grating; x is the identifier of the grating line, and n is the refractive index. As required by any device based on grating deflection, the Q parameter needs to be greater than 10 to reach the Bragg region in order to have high efficiency. The grating lines need to be gradiently slanted following the expression:

$$\Psi(x)=\tfrac{1}{2}\tan^{-1}(x/f)\approx x/2f \qquad 17$$

so that the Bragg condition is satisfied over the entire aperture. The condition for maximum efficiency is:

$$kL=\pi\Delta nL/\lambda=\pi/2 \qquad 18$$

In the embodiment of the optical waveguide device as configured in FIG. 32, adjustments may be made to the path length of the light passing through the waveguide by using a gate electrode formed with compensating prism shapes. Such compensating prism shapes are configured so that the voltage taken across the gate electrode (from the side of the gate electrode adjacent the first body contact electrode to the side of the gate electrode adjacent the second body contact electrode) varies. Since the voltage varies across the gate electrode vary, the regions of changeable propagation constant will similarly vary across the width of the waveguide. Such variation in the voltage will likely result in a greater propagation of the light passing through the waveguide at different locations across the width of the waveguide.

Figure 33:
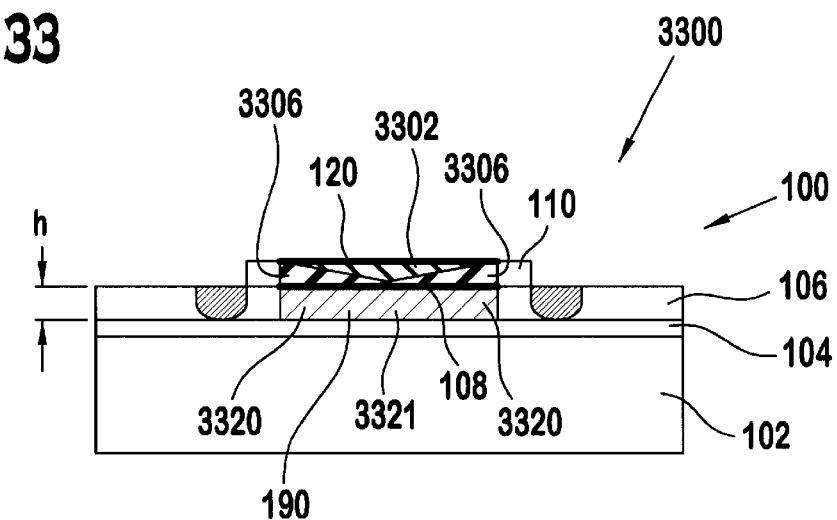
FIG. 33 shows a front view of another embodiment of optical waveguide device from that shown in FIG. 1.

FIG. 33 shows a front view of another embodiment of optical waveguide device from that shown in FIG. 1. The optical waveguide device 100 shown in FIG. 33 is configured to operate as a lens 3300. The depth of the electrical insulator layer 3302 varies from a maximum depth adjacent the periphery of the waveguide to a minimum depth adjacent the center of the waveguide. Due to this configuration, a greater resistance is provided by the electrical insulator 3302 to those portions that are adjacent the periphery of the waveguide and those portions that are the center of the waveguide. The FIG. 33 embodiment of optical lens can establish a propagation constant gradient across the width of the waveguide. The value of the propagation constant will be greatest at the center, and lesser at the periphery of the waveguide. This embodiment of lens 3300 may utilize a substantially rectangular gate electrode. It may also be necessary to provide one or more wedge shape spacers 3306 that are made from material having a lower electrical resistance than the electrical insulator 3302 to provide a planer support surface to support the gate electrode. Other similar configurations in which the electrical resistance of the electrical insulator is varied to provide a varied electrical field at the insulator/semiconductor interface and a varied propagation constant level.

3E. Optical Filters

The optical waveguide device 100 can also be modified to provide a variety of optical filter functions. Different embodiments of optical filters that are described herein include an arrayed waveguide (AWG) component that acts as a multiplexer/demultiplexer or linear phase filter in which a light signal can be filtered into distinct bandwidths of light. Two other embodiments of optical filters are a finite-impulse-response (FIR) filter and an infinite-impulse-response (IIR) filter. These embodiments of filters, as may be configured with the optical waveguide device, are now described.

Figure 34:
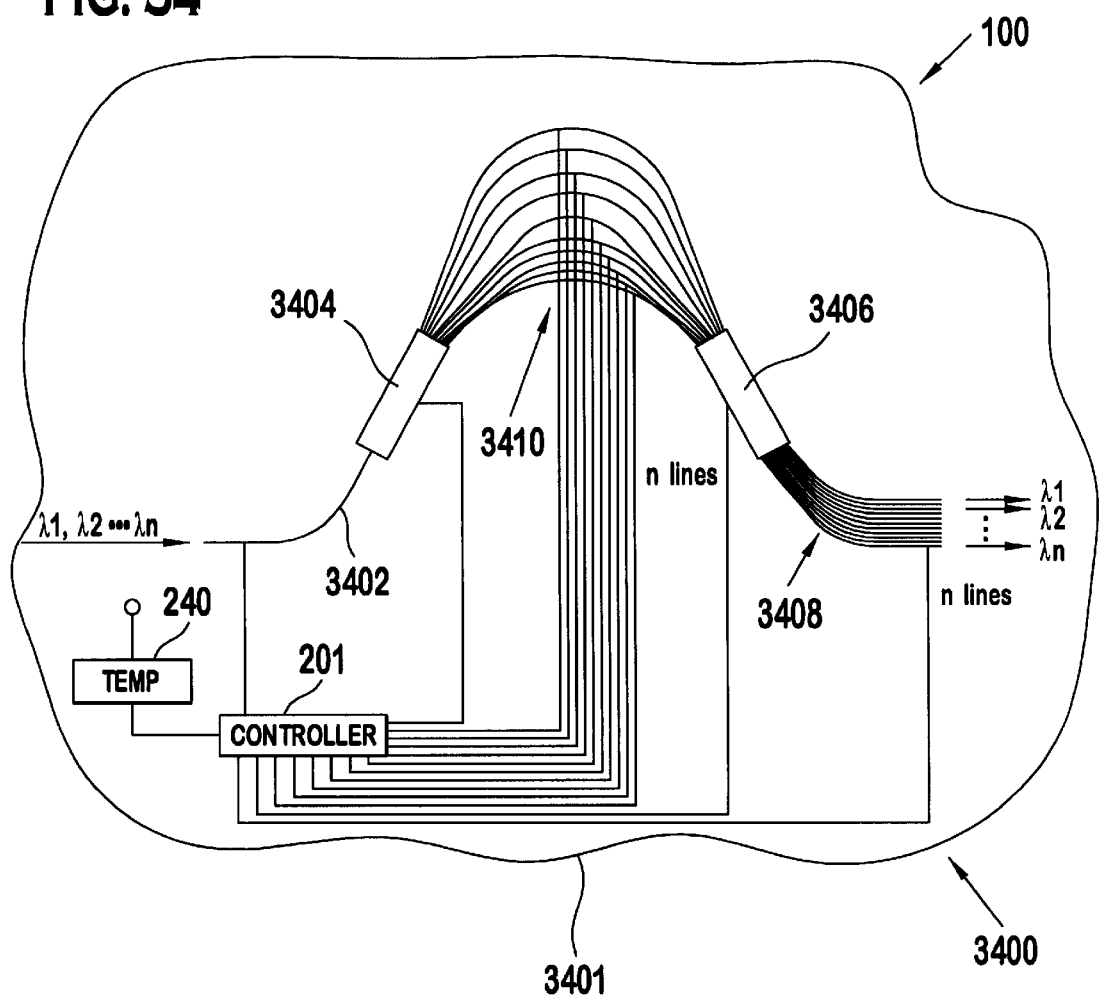
FIG. 34 shows a top view of one embodiment of an arrayed waveguide (AWG) including a plurality of optical waveguide devices.

FIG. 34 shows one embodiment of an optical waveguide device being configured as an AWG component 3400. The AWG component 3400 may be configured to act as a wavelength multiplexer, wavelength demultiplexer, a linear phase filter, or a router. The AWG component 3400 is formed on a substrate 3401 with a plurality of optical waveguide devices. The AWG component 3400 also includes an input waveguide 3402 (that may be formed from one waveguide or an array of waveguides for more than one input signal), an input slab coupler 3404, a plurality of arrayed waveguide devices 3410, an output slab coupler 3406, and an output waveguide array 3408. The input waveguide 3402 and the output waveguide array 3408 each comprise one or more channel waveguides (as shown in the FIGS. 1 to 3, 4, or 5 embodiments) that are each optically coupled to the input slab coupler 3402. Slab couplers 3404 and 3406 allow the dispersion of light, and each slab coupler 3404 and 3406 may also be configured as in the FIGS. 1 to 3 or 5 embodiments. Each one of the array waveguides 3410 may be configured as in the FIGS. 10 to 11 embodiment of channel waveguide. Controller 201 applies a variable DC voltage $V_g$ to some or all of the waveguide couplers 3402, 3404, 3406, 3408, and 3410 to adjust for variations in temperature, device age and characteristics, or other parameters as discussed above in connection with the FIGS. 7–8. In the embodiment shown, controller 201 does not have to apply an alternating current signal $v_g$ to devices 3402, 3404, 3406, 3408, and 3410.

The input array 3402 and the input slab coupler 3404 interact to direct light flowing through one or more of the input waveguides of the channel waveguides 3410 depending upon the wavelength of the light. Each array waveguide 3410 is a different length, and can be individually modulated in a manner similar to described above. For example, the upper array waveguides, shown with the greater curvature, have a greater light path distance than the lower array waveguides 3410 with lesser curvature. The distance that light travels through each of the array waveguides 3410 differs so that the distance of light exiting the different array waveguides, and the resultant phase of the light exiting from the different array waveguides, differ.

Optical signals pass through the plurality of waveguides (of the channel and slab variety) that form the AWG component 3400. The AWG component 3400 is often used as an optical wavelength division demultiplexer/multiplexer. When the AWG component 3400 acts as an optical wavelength division demultiplexer, one input multi-bandwidth signal formed from a plurality of input component wavelength signals of different wavelengths is separated by the AWG component 3400 into its component plurality of output single-bandwidth signals. The input multi-bandwidth signal is applied to the input waveguide 3402 and the plurality of output single-bandwidth signals exit from the output waveguide array 3408. The AWG component 3400 can also operate as a multiplexer by applying a plurality of input single-bandwidth signals to the output waveguide array 3408 and a single output multi-bandwidth signal exits from the input waveguide 3402.

When the AWG component 3400 is configured as a demultiplexer, the input slab coupler 3404 divides optical power of the input multi-bandwidth signal received over the input waveguide 3402 into a plurality of array signals. In one embodiment, each array signal is identical to each other array signal, and each array signal has similar signal characteristics and shape, but lower power, as the input multi-bandwidth signal. Each array signal is applied to one of the plurality of arrayed waveguide devices 3410. Each one of the plurality of arrayed waveguide devices 3410 is coupled to the output terminal of the input slab coupler 3404. The AWG optical wavelength demultiplexer also includes the output slab coupler 3406 coupled to the output terminal of the plurality of arrayed waveguide devices 3410. Each arrayed waveguide device 3410 is adapted to guide optical signals received from the input slab coupler 3404 so each one of the plurality of arrayed waveguide signals within each of the respective plurality of arrayed waveguide devices (that is about to exit to the output slab coupler) has a consistent phase shift relative to its neighboring arrayed waveguides device 3410. The output slab coupler 3406 separates the wavelengths of each one of the arrayed waveguide signals output from the plurality of arrayed waveguide devices 3410 to obtain a flat spectral response.

Optical signals received in at least one input waveguide 3402 pass through the input slab coupler 3404 and then enter the plurality of arrayed waveguide devices 3410 having a plurality of waveguides with different lengths. The optical signals emerging from the plurality of arrayed waveguide devices 3410 have different phases, respectively. The optical signals of different phases are then incident to the output slab coupler 3406 in which a reinforcement and interference occurs for the optical signals. As a result, the optical signals are focused at one of the output waveguide array 3408. The resultant image is then outputted from the associated output waveguide array 3408.

AWG optical wavelength demultiplexers are implemented by an arrayed waveguide grating configured to vary its wavefront direction depending on a variation in the wavelength of light. In such AWG optical wavelength demultiplexers, a linear dispersion indicative of a variation in the shift of the main peak of an interference pattern on a focal plane (or image plane) depending on a variation in wavelength can be expressed as follows:

$$\frac{d_x}{d\lambda} = \frac{fm}{n_s d} \qquad 19$$

where "f" represents the focal distance of a slab waveguide, "m" represents the order of diffraction, "d" represents the pitch of one of the plurality of arrayed waveguide devices 3410, and "$n_s$" is the effective refractive index of the slab waveguide. In accordance with equation 19, the wavelength distribution of an optical signal incident to the AWG optical wavelength demultiplexer is spatially focused on the image plane of the output slab coupler 3406. Accordingly, where a plurality of output waveguides in array 3408 are coupled to the image plane while being spaced apart from one another by a predetermined distance, it is possible to implement an AWG optical wavelength demultiplexer having a wavelength spacing determined by the location of the output waveguide array 3408.

Optical signals respectively outputted from the arrayed waveguides of the AWG component 3400 while having different phases are subjected to a Fraunhofer diffraction while passing through the output slab coupler 3406. Accordingly, an interference pattern is formed on the image plane corresponding to the spectrum produced by the plurality of output single-bandwidth signals. The Fraunhofer diffraction relates the input optical signals to the diffraction pattern as a Fourier transform. Accordingly, if one of the input multi-bandwidth signals is known, it is then possible to calculate the amplitude and phase of the remaining input multi-bandwidth signals using Fourier transforms.

It is possible to provide phase and/or spatial filters that filter the output single-bandwidth signals that exit from the output waveguide array 3408. U.S. Pat. No. 6,122,419 issued on Sep. 19, 2000 to Kurokawa et al. (incorporated herein by reference) describes different versions of such filtering techniques.

Figure 35:
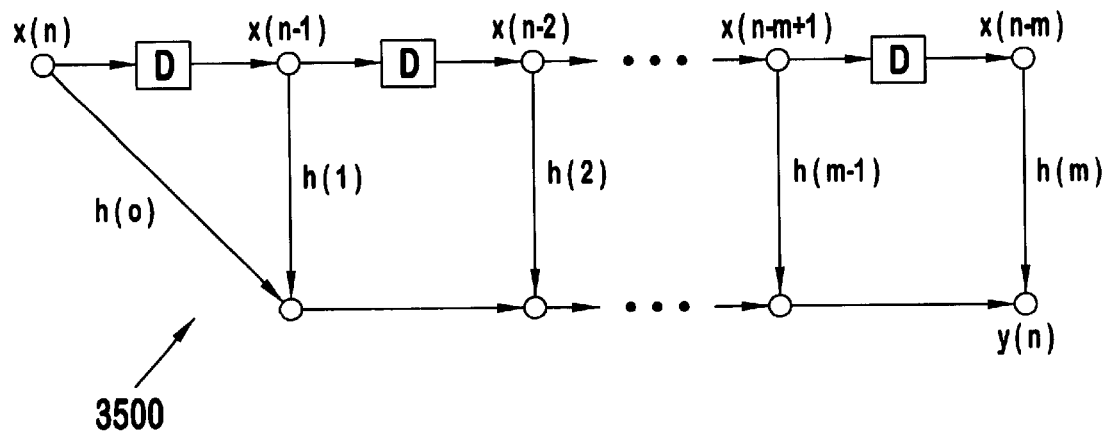
FIG. 35 shows a schematic timing diagram of one embodiment of a finite-impulse-response (FIR) filter.

FIG. 35 shows one embodiment of a finite-impulse-response (FIR) filter 3500. The FIR filter 3500 is characterized by an output that in a linear combination of present and past values of inputs. In FIG. 35, x(n) shows the present value of the input, and x(n−1), x(n−2), etc. represent the respective previous values of the input; y(x) represents the present value of the output; and h(1), h(2) represent the filter coefficients of x(n), y(n−1), etc. The D corresponds to the delay. The FIR filter 3500 satisfies equation 20:

$$y = \sum_{k=0}^{M} h(k)x(n-k) \qquad 20$$

Figure 36:
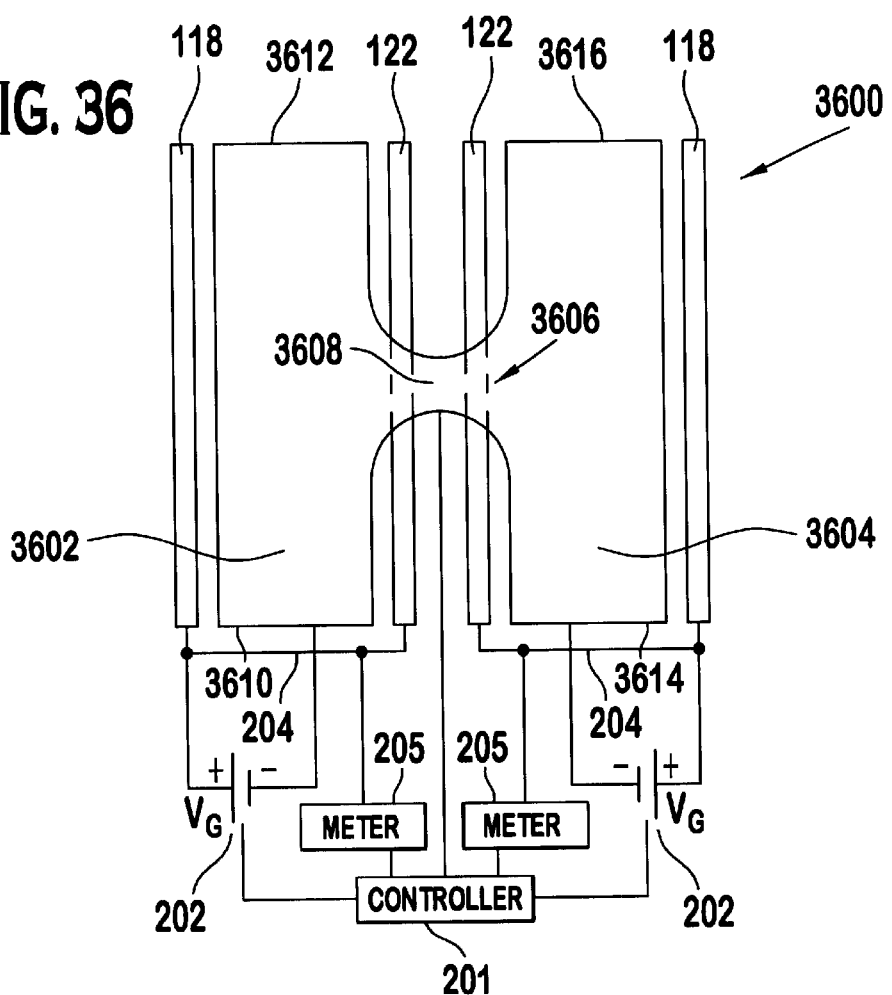
FIG. 36 shows a top view of one embodiment of an FIR filter.

An AWG, for example, is one embodiment of FIR filter in which the present output is a function entirely of past input. One combination of optical waveguide devices, a top view of which is shown in FIG. 36, is a FIR filter 3600 known as a coupled waveguide 3600. The coupled waveguide 3600, in its most basic form, includes a first waveguide 3602, a second waveguide 3604, a coupling 3606, and a light pass grating 3608. The first waveguide 3602 includes a first input 3610 and a first output 3612. The time necessary of light to travel through the first waveguide 3602 and/or the second waveguide 3604 corresponds to the delay D shown in the FIG. 35 model of FIR circuit. The second waveguide 3604 includes a second input 3614 and a second output 3616.

The coupling 3606 allows a portion of the signal strength of the light flowing through the first waveguide 3602 to pass into the second waveguide 3604, and vice versa. The amount of light flowing between the first waveguide 3602 and the second waveguide 3604 via the coupling 3606 corresponds to the filter coefficients h(k) in equation 20. One embodiment of light pass grating 3608 is configured as a Bragg grating as shown in FIGS. 20 to 22. Controller 201 varies the gate voltage of the light pass grating to control the amount of light that passes between the first waveguide 3602 and the second waveguide 3604, and compensates for variations in device temperature. An additional coupling 3606 and light pass grating 3608 can be located between each additional pair of waveguides that have a coefficient as per equation 20.

Figure 37:
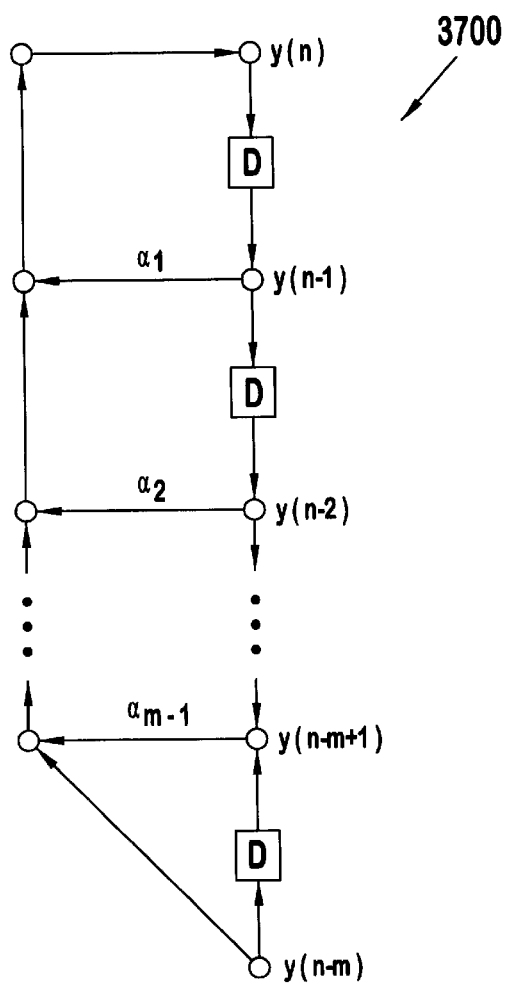
FIG. 37 shows a schematic timing diagram of one embodiment of an infinite-impulse-response (IIR) filter.

FIG. 37 shows one embodiment of a timing model of an infinite-impulse-response (IIR) filter 3700. The FIG. 37 model of IIR filter is characterized by an output that is a linear combination of the present value of the input and past values of the output. The IIR filter satisfies equation 21:

$$y(n) = x(n) + \sum_{k=1}^{M} \alpha_k y(n-k) \qquad 21$$

Where x(n) is a present value of the filter input; y(n) is the present value of the filter output; y(n−1), etc. are past values of the filter output; and $\alpha_1, \ldots, \alpha_M$ are the filter coefficients.

Figure 38:
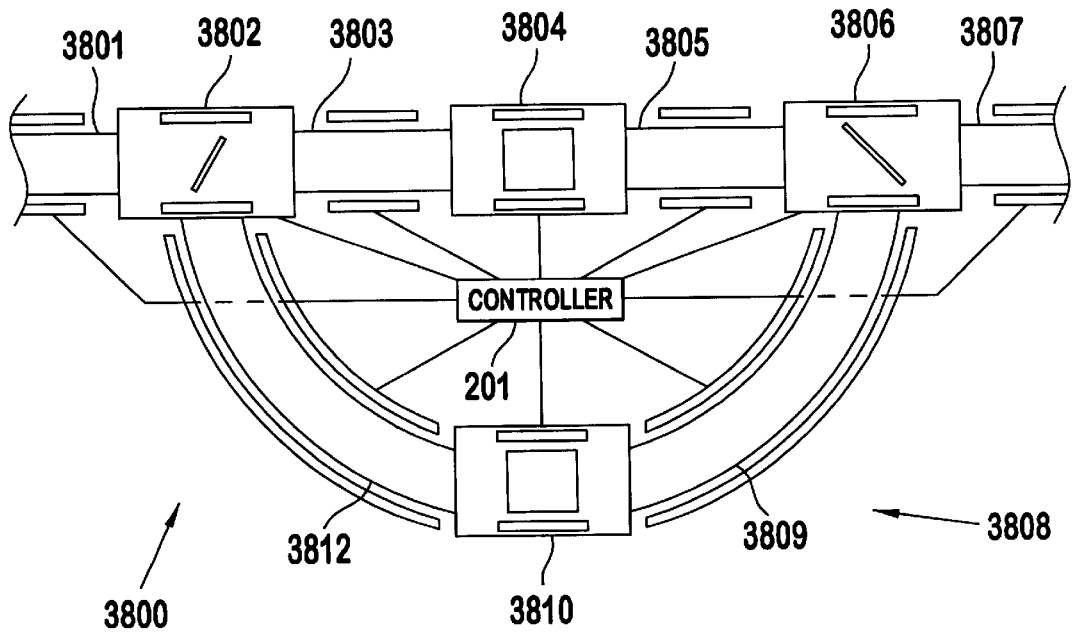
FIG. 38 shows a top view of one embodiment of an IIR filter.

One embodiment of an IIR filter 3800 is shown in FIG. 38. The IIR filter 3800 includes an input waveguide 3801, a combiner 3802, a waveguide 3803, an optical waveguide device 3804, a waveguide 3805, a beam splitter 3806, an output waveguide 3807, and a delay/coefficient portion 3808. The delay/coefficient portion 3808 includes a waveguide 3809, a variable optical attenuator (VOA) 3810, and waveguide 3812. The delay/coefficient portion 3808 is configured to provide a prescribed time delay to the optical signals passing from the beam splitter 3806 to the combiner 3802. In the FIG. 38 embodiment of an IIR filter 3800, The time necessary for light to travel around a loop defined by elements 3802, 3803, 3804, 3805, 3806, 3809, 3810, and 3812 once equals the delay D shown in the FIG. 37 model of IIR circuit. The variable optical attenuator 3810 is configured to provide a prescribed amount of signal attenuation to correspond to the desired coefficient, $\alpha_1$ to $\alpha_M$. An exemplary VOA is described in connection with FIG. 41 below.

Input waveguide 3801 may be configured, for example, as the channel waveguide shown in FIGS. 1 to 3, 4, or 5. Combiner 3802 may be configured, for example, as a Bragg grating shown in FIGS. 20 to 22 integrated in a slab waveguide shown in the FIGS. 1 to 3, 4, or 5. The waveguide 3803 may be configured, for example, as the channel waveguide shown in FIGS. 1 to 3, 4, or 5. The optical waveguide device 3804 may be configured, for example, as the channel waveguide shown in FIGS. 1 to 3, 4, or 5. The waveguide 3805 may be configured, for example, as the channel waveguide shown in FIGS. 1 to 3, 4, or 5. The beam splitter 3806 may be configured, for example, as the beam-splitter shown below in FIG. 46. The waveguide 3809 may be configured, for example, as the channel waveguide shown in FIGS. 1 to 3, 4, or 5. The VOA 3810 may be configured as shown below relative to FIG. 41. The waveguide 3812 may be configured, for example, as the channel waveguide shown in FIGS. 1 to 3, 4, or 5.

Controller 201 applies a variable DC voltage $V_g$ to the respective gate electrodes of the input waveguide 3801, the combiner 3802, the waveguide 3803, the optical waveguide device 3804, the waveguide 3805, the beam splitter 3806, the waveguide 3809, the VOA 3810, and the waveguide 3812 to adjust for variations in temperature, device age, device characteristics, etc. as discussed below in connection with FIGS. 7–8. In addition, controller 201 also varies the gate voltage applied to other components of the IIR to vary their operation, as discussed below.

During operation, an optical signal is input into the waveguide 3801. Virtually the entire signal strength of the input optical signal flows through the combiner 3802. The combiner 3802 is angled to a sufficient degree, and voltage is applied to a sufficient amount so the propagation constant of the waveguide is sufficiently low to allow the light from the waveguide 3801 to pass directly through the combiner 3802 to the waveguide 3803. The majority of the light that passes into waveguide 3803 continues to the optical waveguide device 3804. The optical waveguide device 3804 can perform a variety of functions upon the light, including attenuation and/or modulation. For example, if it is desired to input digital signals, the optical waveguide device 3804 can be pulsed on and off as desired when light is not transmitted to the output waveguide 3807 by varying the gate voltage of waveguide device 3804. If the optical waveguide device 3804 is turned off and is fully attenuating, then a digital null signal will be transmitted to the output waveguide 3807.

The output signal from the output waveguide device 3804 continues through waveguide 3805 into beam splitter 3806. Beam splitter 3806 diverts a prescribed amount of the light into waveguide 3809, and also allows prescribed amount of the light to continue onto the output waveguide 3807. The voltage applied to the gate of the beam splitter 3806 can be changed by controller 201 to control the strength of light that is diverted to waveguide 3809 compared to that that is allowed to pass to output waveguide 3807.

The light that is diverted through waveguide 3809 continues through the variable optical attenuator 3810. The voltage applied to the variable optical attenuator (VOA) 3810 can be adjusted depending upon the desired coefficient. For example, full voltage applied to the gate electrode of the VOA 3810 would fully attenuate the light passing through the waveguide. By comparison, reducing the voltage applied to the gate electrode would allow light to pass through the VOA to the waveguide 3812. Increasing the amount of light passing through the VOA acts to increase the coefficient for the IIR filter corresponding to the delay/coefficient portion 3808. The light that passes through to the waveguide 3812 continues on to the combiner 3802, while it is almost fully deflected into waveguide 3803 to join the light that is presently input from the input waveguide 3801 through the combiner 3802 to the waveguide 3803. However, the light being injected from waveguide 3812 into the combiner 3803 is delayed from the light entering from the input waveguide 3801. A series of these IIR filters 3800 can be arranged serially along a waveguide path.

Figure 39:
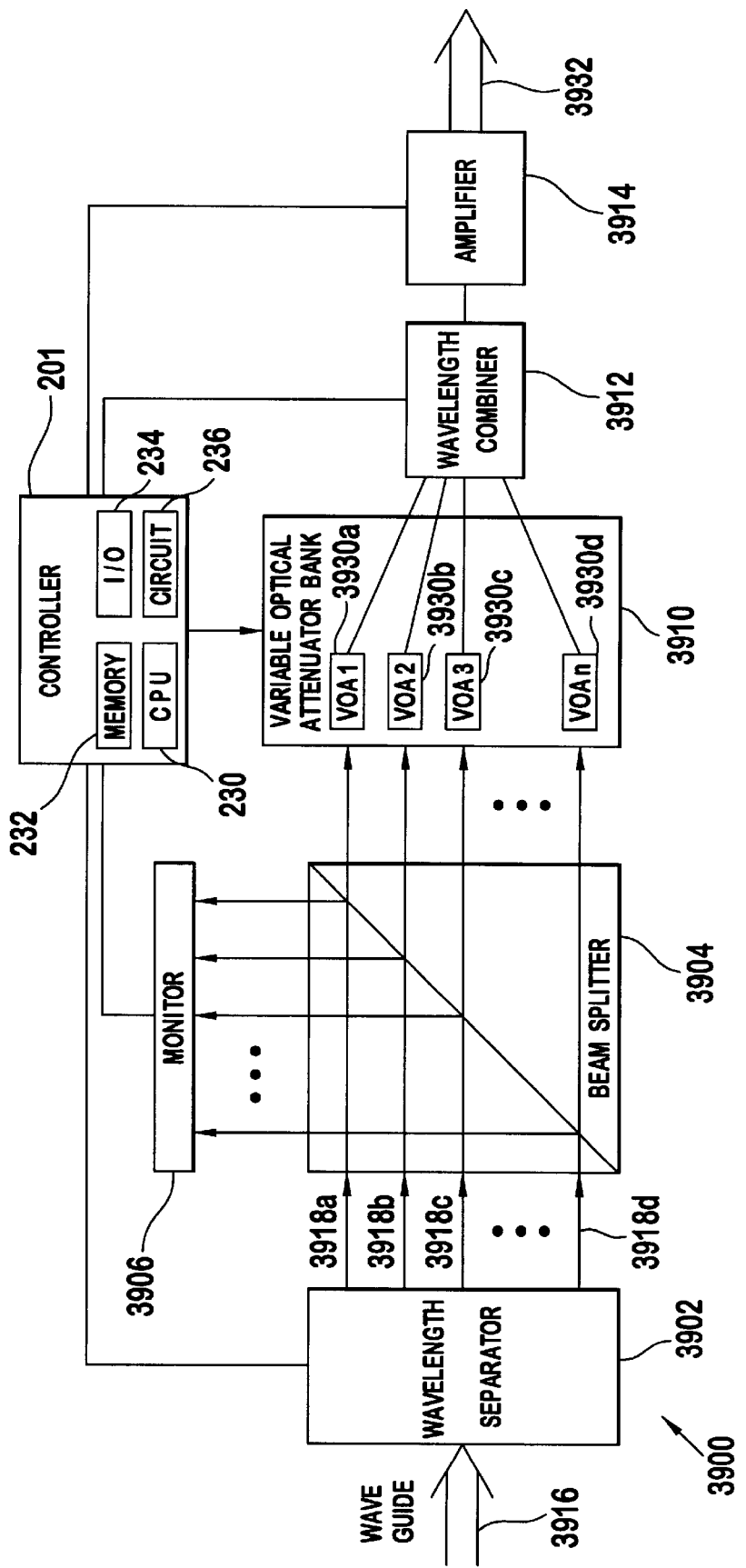
FIG. 39 shows a top view of one embodiment of a dynamic gain equalizer including a plurality of optical waveguide devices.
Figure 40:
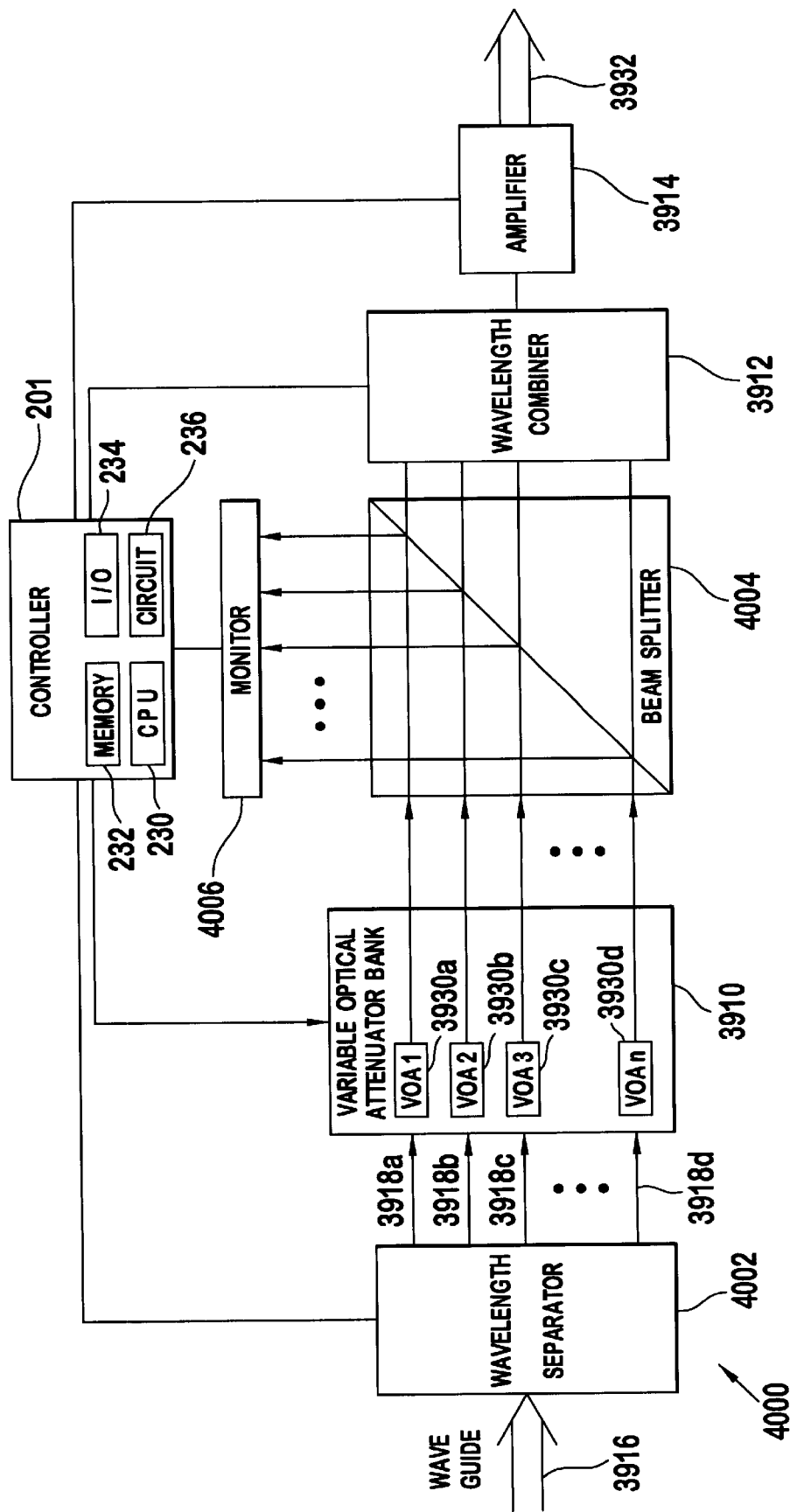
FIG. 40 shows a top view of another embodiment of a dynamic gain equalizer including a plurality of optical waveguide devices.

FIGS. 39 and 40 show two embodiments of a dynamic gain equalizer that acts as a gain flattening filter. The structure and filtering operation of the dynamic gain equalizer is described below.

3F. Variable Optical Attenuators

Figure 41:
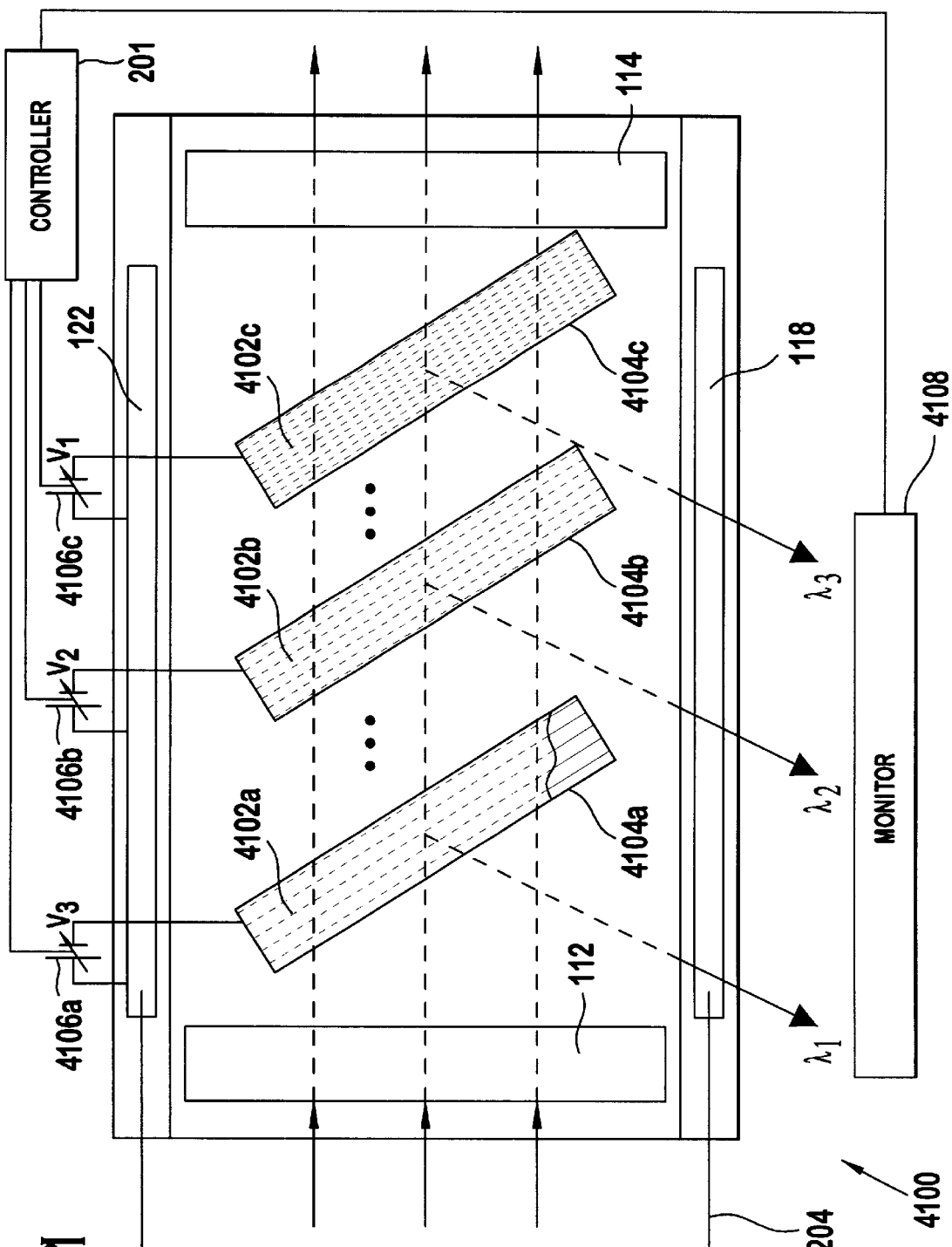
FIG. 41 shows a top view of one embodiment of a variable optical attenuator (VOA)

A variable optical attenuator (VOA) is used to controllable attenuate one or more bandwidths of light. The VOA is embodiment of optical amplitude modulators, since optical attenuation may be considered a form of amplitude modulation. FIG. 41 shows one embodiment of a VOA 4100 that is modified from the FIGS. 1 to 3 or 5 embodiment of optical waveguide modulators. The VOA 4100 includes multiple sets of patterned Bragg gratings 4102a, 4102b, and 4102c, multiple gate electrodes 4104a, 4104b, and 4104c, multiple variable voltage sources 4106a, 4106b, and 4106c, and a monitor 4108. Each individual plane in the patterned Bragg gratings 4102a, 4102b, and 4102c are continuous even through they are depicted using dotted lines (since they are located behind, or on the backside of, the respective gate electrodes 4104a, 4104b, and 4104c).

Each of the multiple sets of patterned Bragg gratings 4102a, 4102b, and 4102c correspond, for example, to the embodiments of Bragg grating shown in FIGS. 20–22, and may be formed in the electrical insulator layer or each respective gate electrode. The respective gate electrode 4104a, 4104b, or 4104c, or some insulative pattern is provided as shown in the FIGS. 20 to 22 embodiments of Bragg gratings. In any one of the individual patterned Bragg gratings 4102a, 4102b, and 4102c, the spacing between adjacent individual gratings is equal. However, the spacing between individual adjacent gratings the FIG. 41 embodiment of patterned Bragg gratings 4102a, 4102b, and 4102c decreases from the light input side to light output side (left to right). Since the grating size for subsequent patterned Bragg gratings 4102a, 4102b, and 4102c decreases, the wavelength of light refracted by each also decreases from input to output.

Each patterned Bragg gratings 4102a–4102c has a variable voltage source applied between its respective gate electrode 4104a, 4104b, and 4104c and its common voltage first body contact electrode/second body contact electrode. As more voltage is applied between each of the variable voltage sources 4106a, 4106b, and 4106c and the Bragg gratings 4102a to 4102c, the propagation constant of that patterned Bragg grating increases. Consequently, more light of the respective wavelengths $\lambda_1$, $\lambda_2$, or $\lambda_3$ associated with the spacing of that patterned Bragg gratings 4102a to 4102c would be refracted, and interfere constructively. The monitor 4108 can monitor such light that interferes constructively.

Depending upon the intensity of the refracted light at each wavelength, equation 22 applies.

$$P_R(\lambda_1)+P_T(\lambda_1)=P_O(\lambda_1) \qquad 22$$

where $P_R(\lambda_1)$ equals the refracted light, $P_T(\lambda_1)$ equals the transmitted light, and $P_o(\lambda_1)$ equals the output light. In a typical embodiment, a variable optical attenuator 4100 may be arranged with, e.g., 50 combined patterned Bragg gratings and gate electrodes (though only three are shown in FIG. 41). As such, light having 50 individual bandwidths could be attenuated from a single light beam using the variable optical attenuator 4100

3G. Programmable Delay Generators and Optical Resonators

Figure 42:
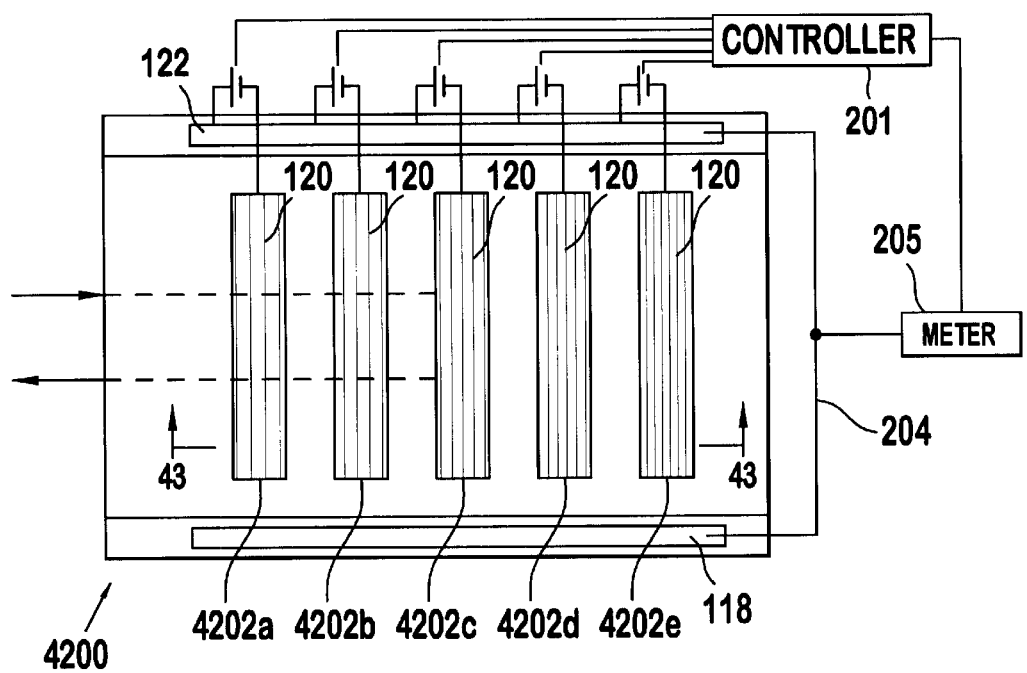
FIG. 42 shows a top view of one embodiment of optical waveguide device 100 including a channel waveguide being configured as a programmable delay generator 4200.
Figure 43:
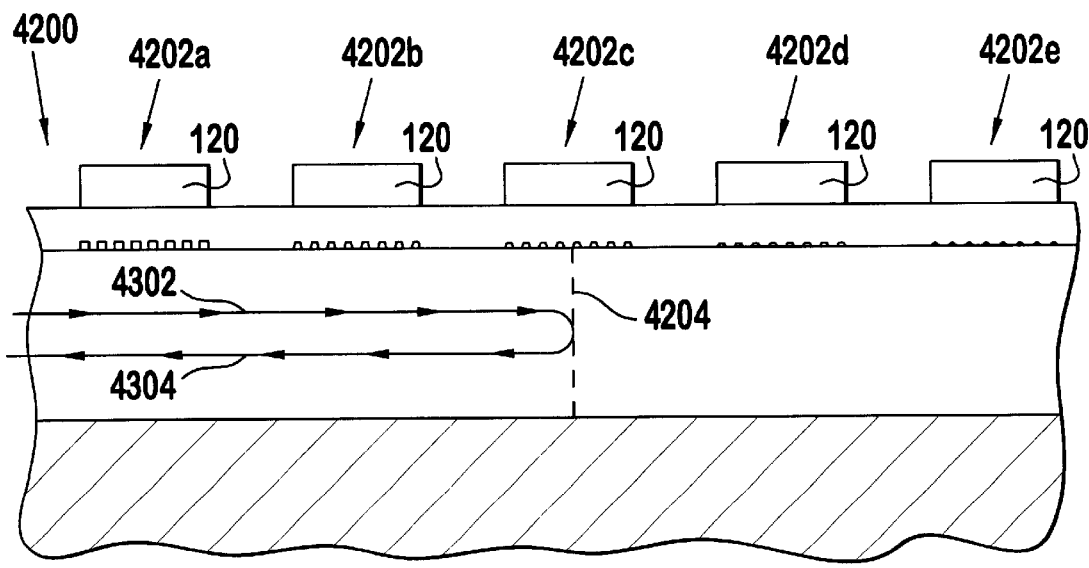
FIG. 43 shows a side cross sectional view of the FIG. 42 embodiment of programmable delay generator 4200.

Programmable delay generators are optical devices that add a prescribed, and typically controllable, amount of delay to an optical signal. Programmable delay generators are used in such devices as interferometers, polarization control, and optical interference topography that is a technology used to examine eyes. In all of these technologies, at least one optical signal is delayed. FIG. 42 shows a top view of one embodiment of a programmable delay generator 4200. FIG. 43 shows a side cross sectional view of the FIG. 42 embodiment of programmable delay generator 4200. In addition to the standard components of the optical waveguide device shown in the embodiments of FIGS. 1–3, 4, or 5, the programmable delay generator 4200 includes a plurality of Bragg grating devices 4202a to 4202e and a plurality of axially arranged gate electrodes 120. The embodiment of Bragg gratings devices 4202 shown in FIGS. 42 and 43 are formed in the lower surface of the gate electrode, however, the Bragg grating devices may alternatively be formed as shown in the embodiments in FIGS. 20 to 22 as grooves in the lower surface of the electrical insulator, as insulator elements having different resistance inserted in the insulator, as grooves formed in the lower surface of the gate electrode, or as some equivalent Bragg structure such as using surface acoustic waves that, as with the other Bragg gratings, project a series of parallel planes 4204, representing regions of changeable propagation constant, into the waveguide. The spacing between the individual grooves in the Bragg grating equals some multiple of the wavelength of light that to be reflected.

Each axially arranged gate electrode 120 is axially spaced a short distance from the adjacent gate electrodes, and the spacing depends upon the amount by which the time delay of light being reflected within the programmable delay generator 4200 can be adjusted. During operation, a gate voltage is applied to one of the axially arranged gate electrodes 120 sufficient to increase the strength of the corresponding region of changeable propagation constant sufficiently to reflect the light travelling within the optical waveguide device.

As shown in FIG. 43, the gate electrode from Bragg grating device 4202c is energized, so incident light path 4302 will reflect off the region of changeable propagation constant 190 associated with that gate electrode and return along return light path 4304. The delay applied to light travelling within the channel waveguide is therefore a function of the length of the channel waveguide between where light is coupled into and/or removed from the channel waveguide and where the actuated gate electrode projects its series of planes or regions of changeable propagation constant. The light has to travel the length of the incident path and the return path, so the delay provided by the programmable delay generator generally equals twice the incident path length divided by the speed of light. By electronically controlling which of the Bragg grating devices 4202a to 4202e are actuated at any given time, the delay introduced by the delay generator 4200 can be dynamically varied.

In one embodiment of operation for the programmable delay generator 4200, only one axially arranged gate electrode 120 is energized with sufficient strength to reflect all the light since that electrode will reflect all of the light travelling within the waveguide. This embodiment provides a so-called hard reflection since one plane or regions of changeable propagation constant reflects all of the incident light to form the return light.

In another embodiment of operation for the programmable delay generator 4200, a plurality of adjacent, or axially spaced as desired, gate electrodes 120 are energized using some lesser gate voltage level than applied in the prior embodiment to reflect all of the light. The planes or regions of changeable propagation constant associated with each actuated axially arranged gate electrode 120 each reflect some percentage of the incident light to the return light path. The latter embodiment uses "soft" reflection since multiple planes or regions of changeable propagation constant reflect the incident light to form the return light.

Figure 44:
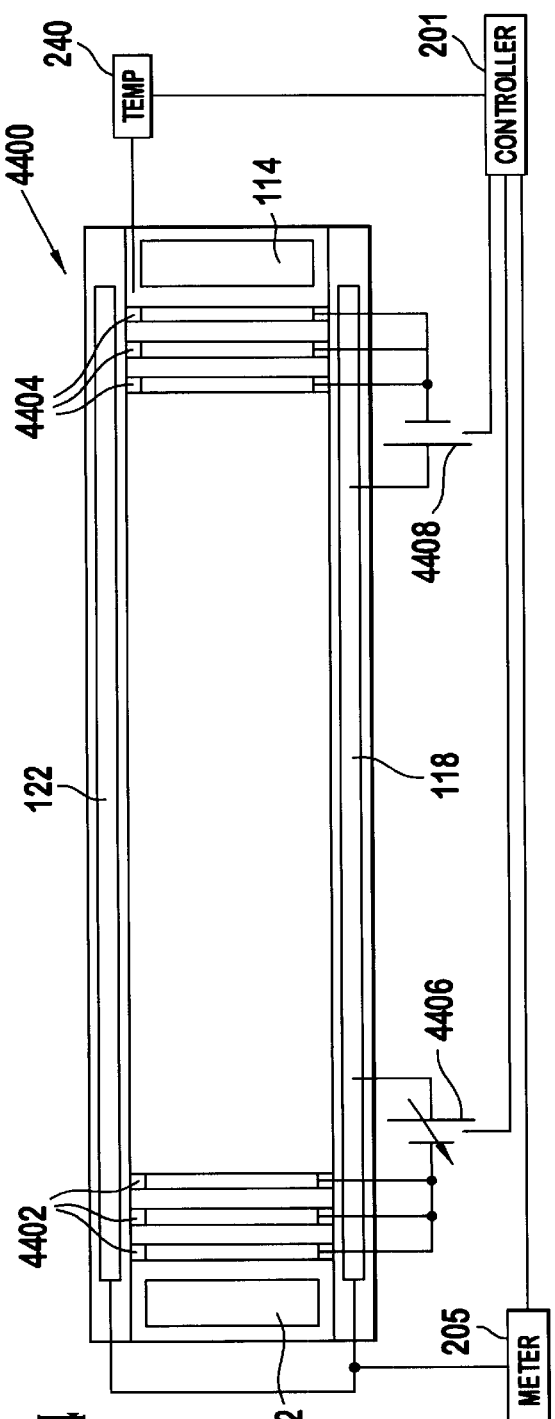
FIG. 44 shows a top view of one embodiment of an optical resonator that includes a plurality of optical waveguide devices that act as optical mirrors.

Optical resonators are used to contain light within a chamber (e.g. the channel waveguide) by having the light reflect between optical mirrors located at the end of that waveguide. The FIG. 44 embodiment of resonator 4400 is configured as a channel waveguide so the light is constrained within two orthogonal axes due to the total internal reflectance (TIR) of the channel waveguide. Light is also constrained along the third axis due to the positioning of TIR mirrors at each longitudinal end of the waveguide. The optical resonator 4400 forms a type of Fabry-Perot resonator. Resonators, also known as optical cavities, can be integrated in such structures as lasers.

Figure 45:
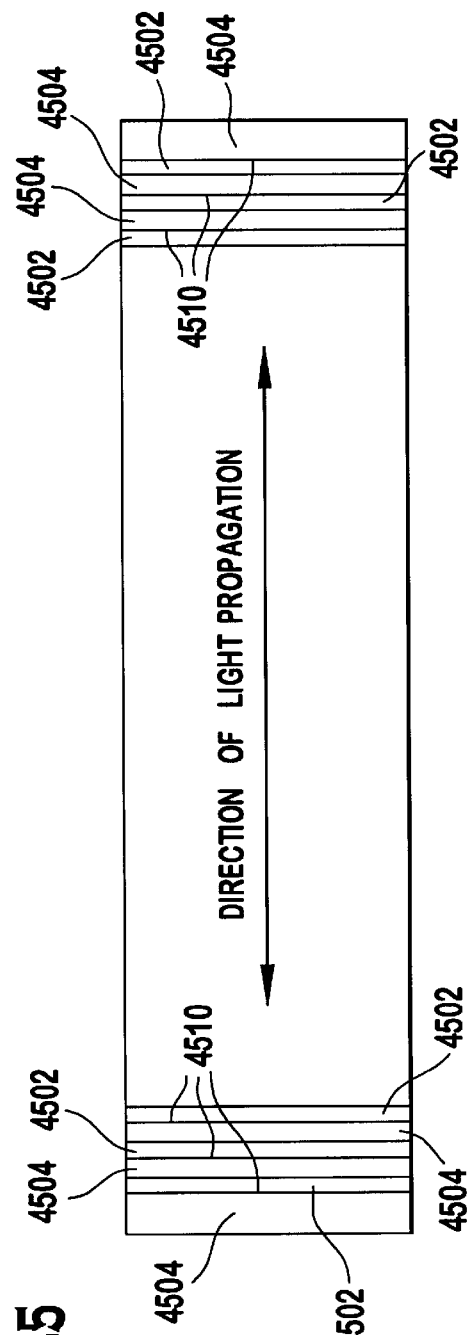
FIG. 45 shows a top cross sectional view taken through the waveguide of the optical resonator shown in FIG. 44.

The resonator 4400 includes a optical waveguide of the channel type, one or more input mirror gate electrodes 4402, one or more output mirror gate electrodes 4404, and controllable voltage sources 4406 and 4408 that apply voltages to the input mirror gate electrodes 4402 and the output mirror gate electrodes 4404, respectively. FIG. 45 shows a top view of the channel waveguide of the resonator 4400 of FIG. 44. The channel waveguide includes, when the voltage sources 4406 and/or 4408 are actuated, an alternating series of high propagation constant bands 4502 and low propagation constant bands 4504.

The high propagation constant bands 4502 correspond to the location of the input mirror gate electrodes 4402 or the output mirror gate electrodes 4404. The low propagation constant bands 4504 correspond to the bands between the input mirror gate electrodes 4402 or the output mirror gate electrodes 4404. The high propagation constant bands 4502 and the low propagation constant bands 4504 extend vertically through the waveguide. The input mirror gate electrodes 4402 and the output mirror gate electrodes 4404 can be shaped to provide, e.g., a concave mirror surface if desired. Additionally, deactuation of the input mirror gate electrodes 4402 or the output mirror gate electrodes 4404 removes any effect of the high propagation constant bands 4502 and low propagation constant bands 4504 from the waveguide of the resonator 4400. Such effects are removed since the propagation constant approaches a uniform level corresponding to 0 volts applied to the gate electrodes 4502, 4504.

As light travels axially within the waveguide of the resonator 4400, some percentage of the light will reflect off any one of one or more junctions 4510 between each high propagation constant band 4502 and the adjacent low propagation constant band 4504, due to the reduced propagation constant. Reflection off the junctions 4510 between high index areas and low index areas forms the basis for much of thin film optical technology. The junction 4510 between each high propagation constant band 4502 and the adjacent low propagation constant band 4504 can be considered analogous to Bragg gratings. The greater the number of, and the greater the strength of, such junctions 4510, the more light that will be reflected from the respective input mirror gate electrodes 4402 or the output mirror gate electrodes 4404. Additionally, the greater the voltage applied from the controllable voltage sources 4406 and 4408 to the respective input mirror gate electrodes 4402 or the output mirror gate electrodes 4404, the greater the difference in propagation constant between the high propagation constant band 4502 and the adjacent low propagation constant band 4504 for the respective input mirror gate electrodes 4402 or the output mirror gate electrodes 4404.

Figure 46:
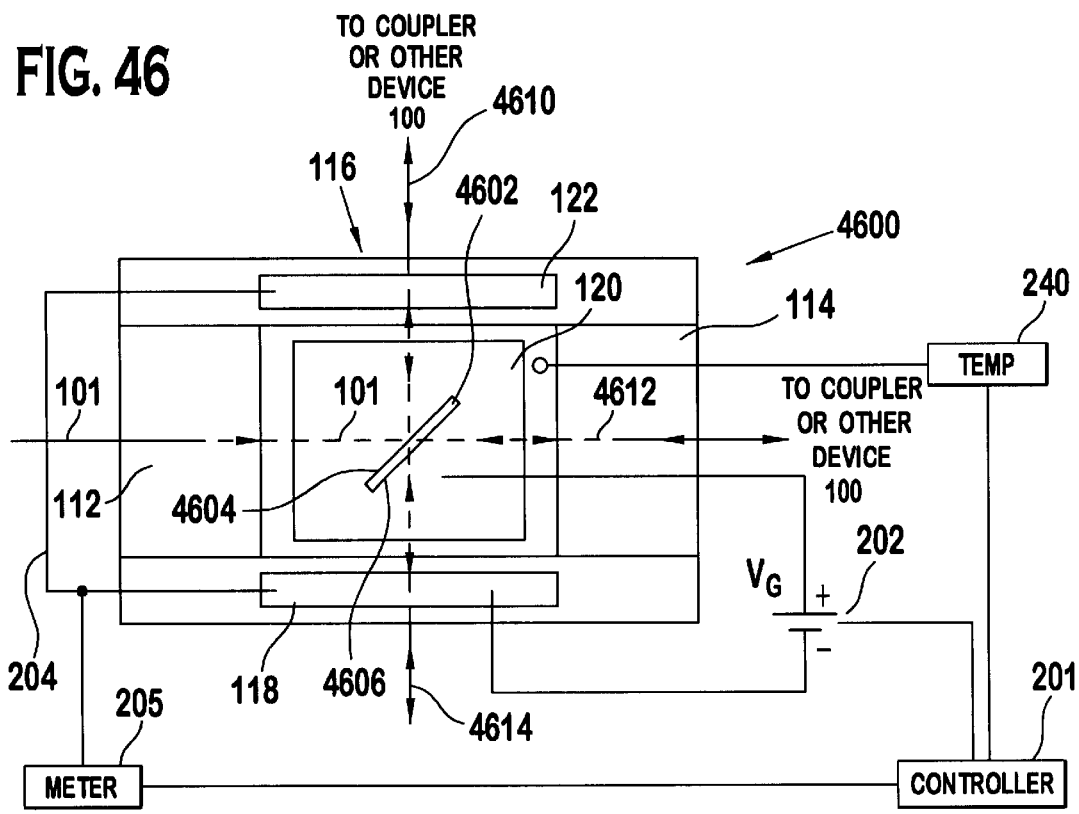
FIG. 46 shows a top view of one embodiment of an optical waveguide device configured as a beamsplitter.

FIG. 46 shows a top view of one embodiment of beamsplitter 4600 that is formed by modifying the optical waveguide device 100 shown in FIG. 46. The beamsplitter includes an input mirror 4602 having a first face 4604 and a second face 4606. The mirror 4602 may be established in the waveguide in a similar manner to a single raised land to provide a varied electrical field at the insulator/semiconductor interface in one of the embodiments of Bragg gratings shown in FIGS. 20 to 22. The voltage level applied to the gate electrode 120 is sufficient to establish a relative propagation constant level in the region of changeable propagation constant to reflect a desired percentage of light following incident path 101 to follow path 4610. The region of changeable propagation constant takes the form of the mirror 4602. Light following incident path 101 that is not reflected along path 4610 continues through the mirror 4602 to follow the path 4612. Such mirrors 4602 also reflect a certain percentage of return light from path 4612 to follow either paths 4614 or 101. Return light on path 4610 that encounters mirror 4602 will either follow path 101 or 4614. Return light on path 4614 that encounters mirror 4602 will either follow path 4612 or path 4610. The strength of the voltage applied to the gate electrode 120 and the resulting propagation constant level of the region of changeable propagation constant in the waveguide, in addition to the shape and size of the mirror 4602 determine the percentage of light that is reflected by the mirror along the different paths 101, 4610, 4612, and 4614.

3H. Optical Application Specific Integrated Circuits (OASICS)

Slight modifications to the optical functions and devices such as described in FIGS. 16 to 25, taken in combination with free-carrier based active optics, can lead to profound changes in optical design techniques. Such modifications may only involve minor changes to the structure of the gate electrode.

The optical waveguide device may be configured as a variable optical attenuator that changes voltage between the gate electrode, the first body contact electrode, and the second body contact electrode, such that a variable voltage is produced across the width of the waveguide. This configuration results in a variable attenuation of the light flowing through the waveguide across the width of the waveguide.

If a magnetic field is applied to the 2DEG, then the free-carriers exhibit birefringence. The degree of birefringence depends on the magnitude of the magnetic field, the free-carrier or 2DEG density, and the direction of propagation of the optical field relative to the magnetic field. The magnetic field may be generated by tarditional means, i.e. from passing of current or from a permanent magnet. The magnetic field induced birefringence can be harnessed to make various optical components including polarization retarders, mode couplers, and isolators.

IV. Integrated Optical Circuits Including Optical Waveguide Devices

4A. Introduction to Integrated Optical Circuits

The optical functions of the optical waveguide devices described above can be incorporated onto one (or more) chip(s) in much the same way as one currently designs application specific integrated circuits (ASICS) and other specialized electronics, e.g., using standard libraries and spice files from a foundry. The optical functions of the optical waveguide devices described herein can be synthesized and designed in much the same way as electronic functions are, using ASICS. One may use an arithmetic logic unit (ALU) in a similar manner that ASICS are fabricated. This level of abstraction allowed in the design of optical circuits by the use of optical waveguide devices improves the capability of circuit designers to create and fabricate such large scale and innovative designs as have been responsible for many of the semiconductor improvements in the past.

Ad discussed above, different devices can be constructed by modifying the basic structure described in FIG. 1 by, e.g. changing the shape, configuration, or thickness of the gate electrode. These modified devices can provide the building blocks for more complex circuits, in a similar manner that semiconductor devices form the basic building blocks for more complex integrated circuit structures.

The disclosure now describes a variety of integrated optical circuits that can be constructed using a plurality of optical waveguide devices of the type described above. The integrated optical circuits described are illustrative in nature, and not intended to be limiting in scope. Following this description, it becomes evident that the majority of functions that are presently performed by using current integrated circuits can also be formed using integrated optical circuits. The advantages are potential improvement in operating circuit capability, cost, and power consumption. It is to be understood that certain ones of the functions shown as being performed by an active optical waveguide device in the following integrated optical circuits may also be performed using a passive device. For example, devices 4708 and 4712 in the embodiment shown in FIG. 47 may be performed by either active devices or passive devices. The embodiment of beamsplitter 4600 shown in FIG. 46 can either be an active or passive device. The selection of whether to use an active or passive device depends, e.g., on the operation of the integrated optical circuit with respect to each particular optical waveguide device, and the availability of each optical waveguide device in active or passive forms.

It is emphasized that the multiple optical waveguide devices of the types described above relative to FIGS. 1–3, 4, or 5 may be combined in different ways to form the following described integrated optical circuits shown, for example, in the embodiments of FIGS. 18, 19, 34, 36, 38–45, and 47–49. For example, the different integrated optical circuit embodiments may be formed using a plurality of optical waveguide devices formed on a single substrate. More particularly, the different embodiments of integrated optical circuits may comprise multiple optical waveguide devices attached to different portions of a single waveguide. Alternatively, the different embodiments of integrated optical circuits including multiple optical waveguide devices may be formed on a plurality of discrete optical waveguide devices.

4B. Dynamic Gain Equalizer

FIG. 39 shows one embodiment of a dynamic gain equalizer 3900 comprising a plurality of optical waveguide devices. The dynamic gain equalizer 3900 comprises a wavelength separator 3902 (that may be, e.g. an arrayed waveguide or an Echelle grating), a beam splitter 3904, a monitor 3906, the controller 201, a variable optical attenuator bank 3910, a wave length combiner 3912, and an amplifier 3914. Dynamic gain equalizers are commonly used to equalize the strength of each one of a plurality of signals that is being transmitted over relatively long distances. For example, dynamic gain equalizers are commonly used in long distance optical telephone cables and a considerable portion of the signal strength is attenuated due to the long transmission distances between, e.g., states or countries.

The wavelength separator 3902 acts to filter or modulate the wavelength of an incoming signal over waveguide 3916 into a plurality of light signals. Each of these light signals has a different frequency. Each of a plurality of waveguides 3918a to 3918d contain a light signal of different wavelength $\lambda_1$ to $\lambda_n$, the wavelength of each signal corresponds to a prescribed limited bandwidth. For example, waveguide 3918a carries light having a color corresponding to wavelength $\lambda_1$, while waveguide 3918 carries a light having a color corresponding to wavelength $\lambda_2$, etc.

Each of the waveguides 3918a to 3918d is input into the beam splitter 3904. The beam splitter outputs a portion of its light into a variable optical attenuator 3910, and also deflects a portion of its light to the monitor 3906. The monitor 3906 senses the proportional signal strength that is being carried over waveguide 3918a to 3918d. Both the monitor 3906 and the beam splitter 3904 may be constructed using the techniques for the optical waveguide devices described above. The controller 201 receives a signal from the monitor that indicates the signal strength of each monitored wavelength of light being carried over waveguides 3918a to 3918d.

The controller monitors the ratios of the signal strengths of the different wavelength bands of light carried by waveguides 3918a to 3918d, and causes a corresponding change in the operation of the variable optical attenuator bank 3910. The variable optical attenuator bank 3910 includes a plurality of variable optical attenuators 3930a, 3930b, 3930c and 3930d that are arranged in series. Each VOA selectively attenuates light that originally passed through one of the respective waveguides 3918a to 3918d. The number of variable optical attenuators 3930a to 3930d in the variable optical attenuator bank 3910, corresponds to the number of light bands that are being monitored over the waveguides 3918a to 3918d. If the signal strength of one certain light band is stronger than another light band, e.g., assume that the light signal travelling through waveguide 3918a is stronger than the light signal travelling through 3918b, then the stronger optical signals will be attenuated by the desired attenuation level by the corresponding attenuator. Such attenuation makes the strength of each optical signal substantially uniform.

As such, all of the signal strengths on the downstream side of the variable optical attenuators 3930a, 3930b, 3930c and 3930d should be substantially equal, and are fed into a wavelength signal combiner 3912, where all the signals are recombined into a single signal. The optical signal downstream of the wavelength combiner 3912, therefore, is gain equalized (and may be considered as gain flattened). The signal downstream of the wavelength combiner 3912 may still be relatively weak due to a faint original signal or the relative attenuation of each wavelength by the variable optical attenuator. Therefore, the signal is input into the amplifier 3914. The amplifier, that is one embodiment is an Erbium Doped Fiber Amplifier (EDFA), amplifies the strength of the signal uniformly across the different bandwidths (at least from $\lambda_1$ to $\lambda_n$) to a level where it can be transmitted to the next dynamic gain equalizer some distance down output waveguide 3932. Using this embodiment, optical signals can be modulated without being converted into, and from, corresponding electrical signals. The variable optical attenuators 3930a to 3930d and the wave length combiner 3912 can be produced and operated using the techniques described above relating to the optical waveguide devices.

FIG. 40 shows another embodiment of a dynamic gain equalizer 4000. The beam splitter 4003 and the monitor 4006 are components in the FIG. 40 embodiment of dynamic gain equalizer 4000 that are located differently than in the FIG. 39 embodiment of dynamic gain equalizer 3900. The beam splitter 4004 is located between the variable optical attenuator (VOA) bank 3910 and the wavelength combiner 3912. The wavelength combiner 3912 may be fashioned as an arrayed waveguide (AWG) as shown in the embodiment of FIG. 34 (in a wavelength multiplexing orientation). The beam splitter 4004 is preferably configured to reflect a relatively small amount of light from each of the respective VOAs 3930a, 3930b, 3930c, and 3930d. The beam splitter 4004 is configured to reflect a prescribed percentage of the light it receives from each of the VOAs 3930a to 3930d to be transmitted to the monitor 4006. The monitor 4006 converts the received light signals which relate to the strength of the individual light outputs from the VOAs 3930a to 3930d into a signal which is input to the controller 201. The controller 201, which preferably is configured as a digital computer, an application specific integrated-circuit, or perhaps even an on chip controller, determines the strengths of the output signals from each of the respective VOAs 3930a to 3930d and balances the signal strengths by selective attenuation. For example, assume that the output signal of VOA2 3930b is stronger than that of VOA3 3930c, as well as the rest of the VOAs. A signal attenuator would be actuated to attenuate the VOA2 3930b signal appropriately. As such, the controller 201 selectively controls the attenuation levels of the individual VOAs 3930a to 3930d.

Each output light beam from VOAs 3930a to 3930d that continues straight through the beam splitter 4004 is received by the wavelength combiner 3912, and is combined into a light signal that contains all the different wavelength signals from the combined VOAs 3930a to 3930d. The output of the wavelength 3912 is input into the amplifier, and the amplifier amplifies the signal uniformly to a level wherein it can be transmitted along a transmission waveguide to, for example, the next dynamic gain equalizer 4000.

4C. Self Aligning Modulator

Figure 47:
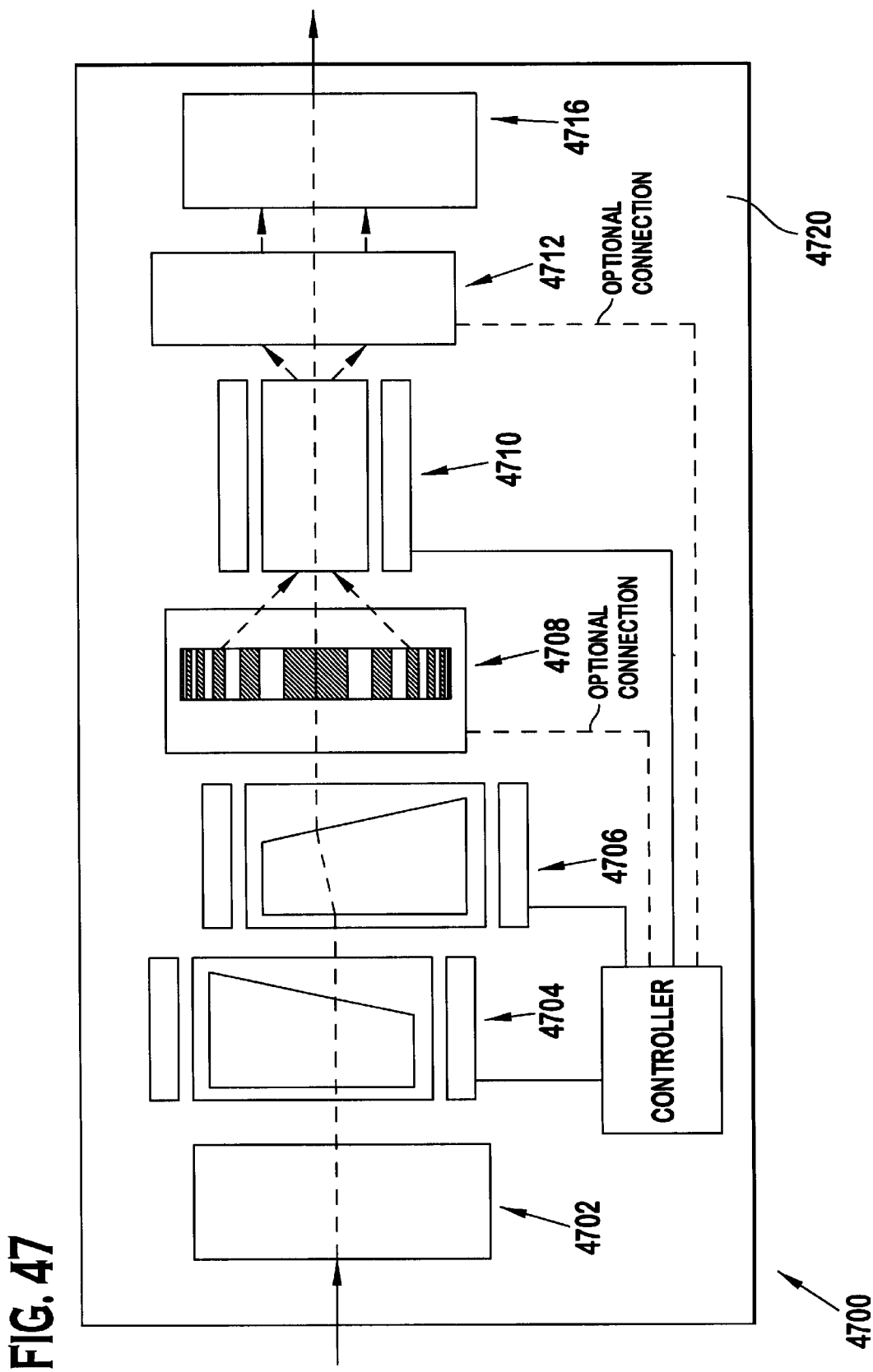
FIG. 47 shows a top view of one embodiment of a self aligning modulator including a plurality of optical waveguide devices.

The FIG. 47 embodiment of self-aligning modulator 4700 is another system that performs an optical function that may include a plurality of optical waveguide devices. The self-aligning modulator 4700 includes an input light coupler 4702, a first deflector 4704, a second deflector 4706, an input two dimensional lens 4708 (shown as a Bragg grating type lens), a modulator 4710, an output two dimensional lens 4712 (shown as a Bragg grating type lens), an output light coupler 4716, and the controller 201.

The input light coupler 4702 acts to receive input light that is to be modulated by the self-aligning modulator 4700, and may be provided by any type of optical coupler such as an optical prism. The first deflector 4704 and the second deflector 4706 are directed to operate in opposed lateral directions relative to the flow of light through the self-aligning modulator 4700. The input two dimensional lens 4708 acts to focus light that it receives from the deflectors 4704 and 4706 so the light can be directed at the modulator 4710. The modulator 4710 modulates light in the same manner as described above. The modulator may be formed as one of the optical waveguide devices shown in FIGS. 1–3, 4, and 5. The deflected light applied to the modulator 4710 is both aligned with the modulator and focused. The output two-dimensional lens 4712 receives light output from the modulator 4710, and focuses the light into a substantially parallel path so that non-dispersed light can be directed to the output prism 4716. The output light coupler 4716 receives light from the output two-dimensional lens 4712, and transfers the light to the outside of the self-aligning modulator 4700. The controller 201 may be, e.g., a microprocessor formed on a substrate 4720. The controller 201 controls the operation of all the active optical waveguide devices 4704, 4706, 4708, 4710, and 4712 included on the self-aligning modulator 4700.

While the modulator 4710 and the two-dimensional lenses 4008, 4012 are shown as active optical waveguide devices, it is envisioned that one or more passive devices may be substituted while remaining within the scope of the present invention. The two-dimensional lenses 4008, 4012 are optional, and the self-aligning modulator will operate with one or none of these lenses. During operation, the first deflector 4704 and the second deflector 4706 are adjusted to get the maximum output light strength through the output prism 4716.

Figure 48:
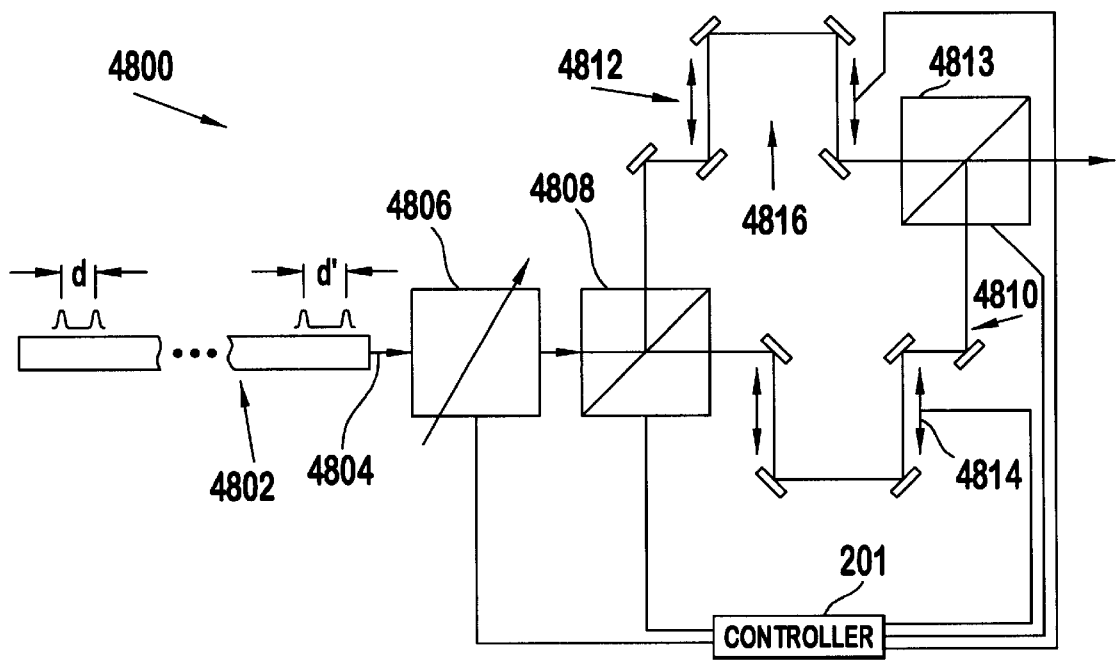
FIG. 48 shows a top view of one embodiment of a polarizing controller including one or more programmable delay generators of the type shown in FIGS. 42 and 43.
Figure 49:
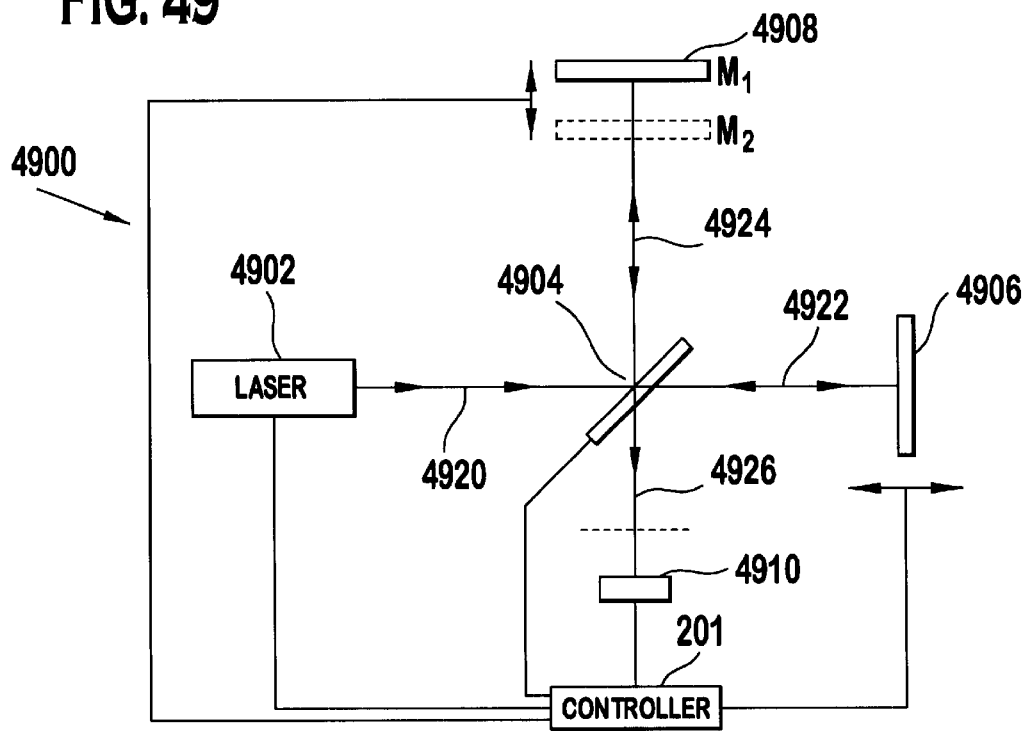
FIG. 49 shows a top view of one embodiment of an interferometer including one or more programmable delay generators of the type shown in FIGS. 42 and 43.

The self-aligning modulator 4700 ensures that a maximum, or specified level, amount of light applied to the input prism 4702 is modulated by the modulator 4710 and released to the output prism 4716. The performance of the self-aligning modulator system 4700 can also be checked simultaneously. For instance, if light exiting from the output prism is reduced, the deflectors, the lenses, and the monitor may each be individually varied to determine whether it causes any improvement in operation. Other suitable control techniques and algorithms may be used to derive an optimal operation. FIGS. 47, 48, and 49 further demonstrate how a variety of optical waveguide devices may be located on a single substrate or chip.

One or more optical waveguide devices may be configured as a multi-function optical bench that facilitates alignments of a laser to the fiber. In the optical bench configuration, that is structured similarly to the FIG. 47 embodiment of the self-aligning modulator 4700, a plurality of the FIGS. 1 to 3, 4, or 5 embodiments of optical waveguide devices are integrated on the substrate. For example, a waveguide can be formed in the substrate so that only the gate electrode, the first body contact electrode, the second body contact electrode, and the electrical insulator layer have to be affixed to the substrate to form the FET portion. The corresponding FET portions are attached to the substrate (the substrate includes the waveguide). As such, it is very easy to produce a wide variety of optical waveguide devices.

4D. Optical Systems Using Delay Components

FIGS. 48 and 49 show several embodiments of systems that my be constructed using one or more of the embodiments of programmable delay generator 4200 shown in FIGS. 42 and 43. FIG. 48 shows one embodiment of a polarization controller. FIG. 49 shows one embodiment of interferometer.

Polarization control is a method used to limit interference between a plurality of different polarizations that occur, for example, when light is transmitted in a fiber for a large distance such as 3,000 kilometers or more. Light that is to be transmitted over the fiber is often split into two polarizations, referred to as P polarization and S polarization. The polarization is received at the other end of the fiber in some arbitrary polarization state since the fiber may encounter different propagation constants for the P polarization signal and the S polarization signal. Therefore, the P polarization signal and the S polarization signal may be modulated within the fiber differently, and may travel at different rates, and may be attenuated differently. For example, the duration between a first polarization and a second polarization may extend from a duration indicated as d to a longer duration shown as d' as the signal is transmitted over a long transmission fiber. When multiple data bits are transmitted, the P polarization signal and the S polarization signal for adjacent bits may overlap due to the different velocities of the polarizations. For example, one polarization of the previous bit is overlapping with the other polarization of the next bit. If a network exceeds a hundred picoseconds at 10 gigahertz, there is a large potential for such overlap. An example of such a network is Network Simplement, next generation network presently under development in France.

The embodiment of polarization controller 4800 shown in FIG. 48 comprises a transmission fiber 4802, an output 4804, an adjustable polarizer 4806, a beamsplitter 4808, a first path 4810, a second path 4812, and a combiner 4813 that combines the first path and the second path. The first path 4810 includes a programmable delay generator 4814. The second path 4812 comprises a programmable delay generator 4816. The transmission fiber 4802 may be fashioned as a channel waveguide or optical fiber. The adjustable polarizer 4806 may be fashioned as a slab waveguide. The beamsplitter 4808 may be fashioned as the beamsplitter 4600 shown and described relative to FIG. 46. The combiner 4813 may be fashioned as the arrayed waveguide (AWG) shown and described relative to FIG. 34 configured as a multiplexer. The programmable delayed generators 4814 and 4816 may be fashioned as the embodiment of programmable delay generator 4200 shown and described relative to FIG. 42.

During operation, light travelling down the transmission fiber 4802 may be formed from a plurality of temporarily spaced data bits, with each data bit having a P polarization and an S polarization. The temporal separation between a first polarization and a second polarization may separate from a distance shown as d to a distance shown as d'. Approximately every couple thousand miles, or as determined suitable for that particular transmission system, one polarization controller 4800 can be located within the transmission system to limit any adverse overlapping of polarizations.

The polarization controller 4800 acts to adjust the temporal spacing of each signal, and therefor limits the potential that the time between adjacent polarizations from adjacent signals is reduced to the polarizations are in danger of overlapping. As such, as the optical signal is received at the output 4804 of the transmission fiber 4802, it encounters the polarizer 4806 that separates the polarized signals. After the polarized signals are cleanly separated, the signal continues on to the beamsplitter. The beamsplitter 4808 splits the signal into two polarizations, such that a first polarization follows the first path 4810 and the second polarization follows a second path 4812. The programmable delay generators 4814 and 4816 are included respectively in the first path 4810 and the second path 4812 to temporally space the respective first polarization (of the P or S variety) and the second polarization (of the opposed variety) by a desired and controllable period. Providing a temporal delay in the suitable programmable delay generator 4814, 4816 allows the controller 201 to adjust the temporal spacing between the P polarization and the S polarization by a prescribed time period, as dictated by the operating conditions of the network. It is common in long data transmission system to have the P polarization and the S polarization temporally separate further apart. The polarization controller 4800 readjusts the time between the S polarization and the P polarization. As such, the S polarization or the P polarization will not overlap with the polarizations from adjacent signals.

For a given fiber, each color has its own polarization controller 4800. There might be 80 colors being used in a typical optical fiber, so there have to be a large number of distinct polarization controllers to handle all the colors in a fiber. A central office for a telephone network may be terminating a large number of fibers (e.g., 100). As such, a central office may need 8000 polarization controllers at a central office to deal with the dispersion problem on all of their fibers. As such, expense and effectiveness of operation of each polarization controller are important.

Figure 50:
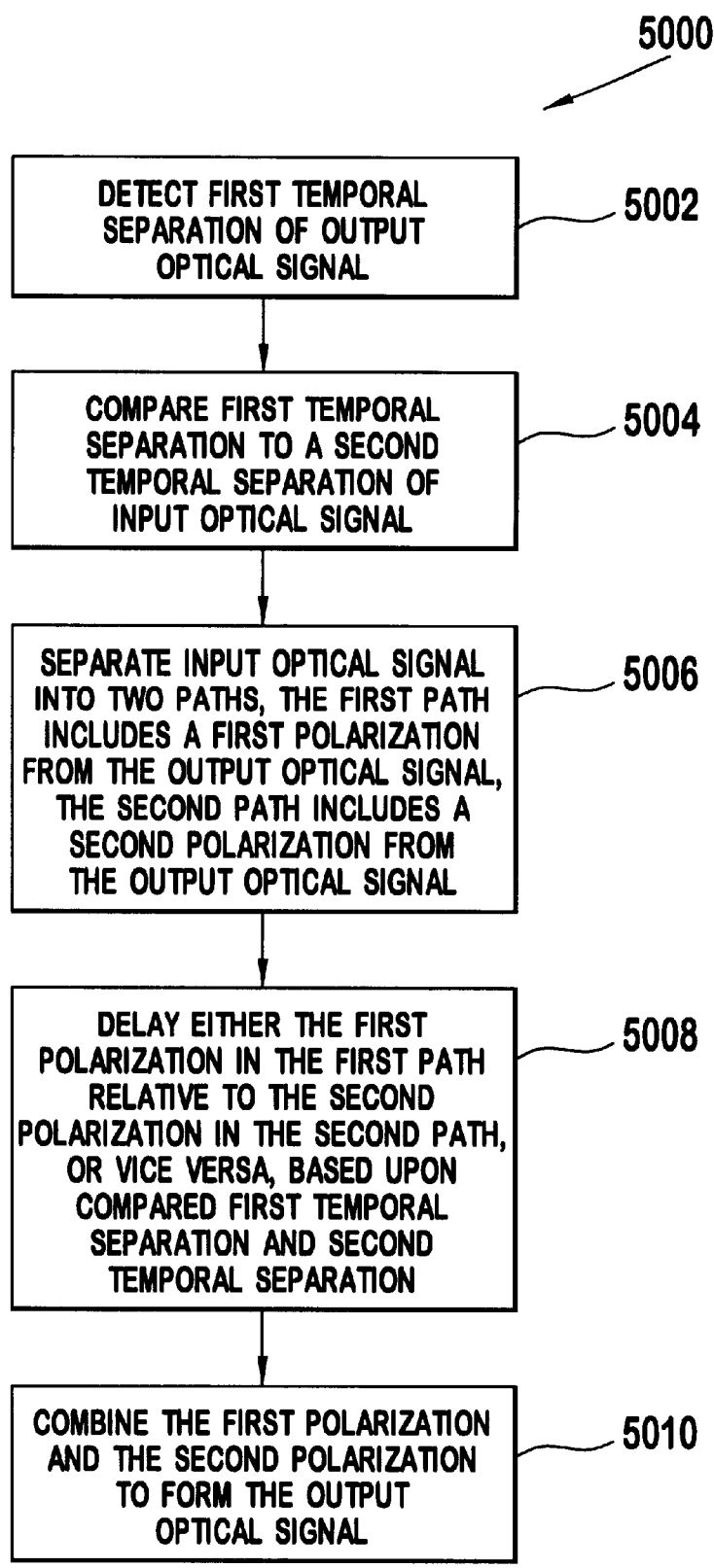
FIG. 50 shows a flow chart of method performed by the polarization controller shown in FIG. 48.

FIG. 50 shows one embodiment of a method 5000 that can performed by the controller 201 in maintaining the temporal separation of a first polarization and a second polarization between and input optical signal and an output optical system. The method 5000 starts with block 5002 in which the controller detects the first temporal separation of a first polarization and a second polarization in the output optical signal. The output optical signal may be considered to be that signal which is applied to the input 4804 in FIG. 48, as referenced by the character d'.

The method 5000 continues to block 5004 in which the controller 201 compares the first temporal separation of the output optical signal to a second temporal separation of an input optical signal. The input optical signal is that signal which is initially applied to the transmission fiber, and is indicated by the referenced character d in FIG. 48. The controller 201 typically stores, or can determine, the value of the second temporal separation between the first polarization and the second polarization. For example, a transmitter, or transmission system, that generates the signal using two polarizations may typically provide a fixed delay d between all first polarizations and the corresponding second polarizations in the input optical signal. Alternatively, the controller 201 may sense whether the temporal separation distance d' between first polarization and the second polarization of the output optical signal are becoming too far apart. In both cases it is desired to reduce the second temporal separation.

The method 5000 continues to step 5006 in which the controller 201 separates the input optical signal into two paths, indicated as the first path 4810 and the second path 4812 in FIG. 48. The separated first polarization from the output optical signal is transmitted along the first path 4810. The separated second polarization from the output optical signal is transmitted along the second path 4812.

The method continues to step 5008 in which the controller, using either the first programmable delay generator 4814 or the second programmable delay generator 4816 that are located respectively in the first path 4810 and the second path 4812, delay the light flowing through their respective paths. Such a delay of the light along each respective path 4810, 4812 corresponds to the respective first polarization or the second polarization travelling through each respective path. One embodiment of the delay of the light in the respective programmable delay generators 4814, 4816 is provided in a similar matter to as described in the embodiments of programmable delay generator 4200 shown in FIGS. 42 and 43. The method 5000 continues to block 5010 in which the first polarization that travels over the first path 4810 and the second polarization that travels over the second path 4812 are combined (and include the respective delays for each polarization). Combining these signals form an output optical signal having its temporal spacing between the first polarization and the second polarization modified. This output optical signal having modified temporal spacing may be input as an input optical signal to a new length of transmission fiber, or may be transmitted to the end user.

FIG. 49 shows one embodiment of an interferometer that may be constructed using optical waveguide devices, including one or more programmable delay generators 4200. The interferometer 4900 (e.g., a Michelson interferometer) comprises a laser 4902, a beamsplitter 4904, a first programmable delay generator 4906, a second programmable delay generator 4908, and an interference detector 4910. In the interferometer 4900, one or both of the first programmable delay generator 4906 and the second programmable delay generator 4908 must be provided. If only one of the two programmable delay generators is provided, then a mirror is substituted at the location of the missing programmable delay generator.

During operation, coherent light is applied from the laser 4902. The coherent light, follows path 4920 and encounters the beamsplitter 4904. The beamsplitter splits the coherent light from the laser into to follow either path 4922 or path 4924. Light following path 4922 will encounter the first programmable delay generator 4906 and will be reflected back toward the beamsplitter. Light following path 4924 will encounter the second programmable delay generator 4908 and will be reflected back toward the beamsplitter 4904. As a return path of light from travelling along path 4924 and 4922 encounters the beamsplitter, a certain proportion of the return light following both paths 4924 and 4922 will be reflected to follow path 4926.

Based upon the position of the first and second programmable delay generators 4906, 4908, the light travelling along paths 4922 and 4924 will travel a different distance (the distances traveled include the original path and the return path from the programmable delay generator). These differences in distances will be indicated by the interference pattern in the signal following path 4926. Depending on the wavelength of light used in the Michelson interferometer, the Michelson interferometer may be used to measure differences in distance between path 4922 and 4924. In one embodiment, one or more of the programmable delay generator shown as 4906, 4908 is replaced by a mirror or a like device. For example, a modified Michelson interferometer may be used as in optical interference topography in which the position of the retina, relative to the eye, is measured to determine the state of the eye. The retina acts as a mirror, and focuses some of the light out of the eye. Therefore, an interferometer, or more specifically an optical interference topography device can detect light reflected off the retina. As such, in the Michelson interferometer, one of the programmable delay generators 4906 or 4908 can be replaced by the eye of the examined patient. The other one of the programmable delay generators 4908, 4906 can be used to measure distances within the eye.

The embodiment of the methods shown in FIGS. 7 and 8 may be used to adjust or calibrate the voltage applied to an electrode of an optical waveguide devices based on variations in such parameters as device age and temperature. These methods rely on such inputs as the temperature sensor 240 measuring the temperature of the optical waveguide device and the meter 205 measuring the resistance of the gate electrode, as well as the controller 201 controlling the operation of the optical waveguide device and controlling the methods performed by FIGS. 7 and 8. The methods may be applied to systems including a large number of optical waveguide devices as well as to a single optical waveguide device. As such, the optical waveguide system, in general, is highly stable and highly scalable.

While the principles of the invention have been described above in connection with the specific apparatus and associated method, it is to be clearly understood that this description is made only by way of example and not as a limitation on the scope of the invention.

What is claimed is:

1. A self-aligned optical modulator that modulates an input optical signal in order to generate a modulated output optical signal, comprising:

an optical modulator device including a waveguide, a first modulating electrode, a second modulating electrode, and a two-dimensional electron (hole) gas (2DEG) proximate the first modulating electrode, the waveguide includes an input port wherein the input optical signal is introduced into the waveguide, an output port wherein the modulated output optical signal exits the waveguide, and a region of modulating propagation constant disposed along a first length of the waveguide and between the input port and the output port, wherein the input optical signal is guided by total internal reflection in the waveguide, and the waveguide is formed at least in part from an active semiconductor; the first modulating electrode is positioned proximate a first surface of the region of modulating propagation constant and electrically separated from an active semiconductor; the second modulating electrode is in electrical contact with the active semiconductor and disposed on a first side of the region of modulating propagation constant; the two-dimensional electron (hole) gas (2DEG) proximate the first modulating electrode has a free carrier distribution that is formed on the first surface when a modulating voltage is applied between the first modulating electrode and the second modulating electrode, wherein modulation of the voltage by the optical modulation device causes a corresponding modulation of the free carrier distribution which, in turn, causes corresponding modulation of a propagation constant level in the region of modulating propagation constant;

a first deflector that deflects light in a first lateral direction within the waveguide;

a second deflector configured to deflect light in a second lateral direction towards the waveguide wherein the deflection of the first deflector or the second deflector acts to direct light approaching the region of modulating propagation constant towards the region of modulating propagation constant.

2. The self-aligned optical modulator of claim 1, wherein said first deflector adjustably deflects light by a first deflection angle and comprises:

a first deflecting electrode;

a second deflecting electrode;

a two-dimensional electron (hole) gas (2DEG) proximate the first deflecting electrode and having a free carrier distribution that is formed when a first deflecting voltage is applied between the first and second deflecting electrodes;

wherein variation of the first deflecting voltage causes a corresponding change in the free carrier distribution of the 2DEG proximate the first deflectig electrode and an adjustment of the first deflection angle.

3. The self-aligned optical modulator of claim 2, wherein said second deflector adjustably deflects light by a second deflection angle and comprises:

a third deflecting electrode;

a fourth deflecting electrode;

a two-dimensional electron (hole) gas (2DEG) proximate the third deflecting electrode and having a free carrier distribution that is formed when a second deflecting voltage is applied between the third and fourth deflecting electrodes;

wherein variation of the second deflecting voltage causes a corresponding change in the free carrier distribution of the 2DEG proximate the third deflecting electrode and an adjustment of the second deflection angle.

4. The self-aligned optical modulator or claim 3, wherein said first deflector further comprises a first region of deflecting propagation constant, wherein variation of the first deflecting voltage causes a corresponding adjustment of a propagation constant level in the first region of deflecting propagation constant.

5. The self-aligned optical modulator of claim 4, wherein said second deflector further comprises a second region of deflecting propagation constant, wherein variation of the second deflecting voltage causes a corresponding adjustment of a propagation constant level in the second region of deflecting propagation constant.

6. The self-aligned optical modulator of claim 5, wherein the first region of deflecting propagation constant is disposed along a second length f the waveguide between the input and the output port.

7. The self-aligned optical modulator of claim 6, wherein the second region of deflecting propagation constant is disposed along a third length of the waveguide and between the first and second lengths.

8. The self-aligned optical modulator of claim 7, wherein the waveguide is a slab waveguide.

9. The self-aligned optical modulator of claim 1, 2 or 3, wherein said optical modulator device, said first deflector and said second deflector are disposed on a common semiconductor substrate.

10. The self-aligned optical modulator of claim 1, further comprising a third modulating electrode in electrical contact with the active semiconductor disposed on a second side of the region of modulating propagation constant opposite the first side; wherein the second and third modulating electrodes are electrically coupled to a common potential.

11. The self-aligned optical modulator of claim 10, further comprising a field effect transistor (FET) portion that includes the first, second, and third electrodes.

12. The self-aligned optical modulator of claim 11, wherein the FET portion is from one of the group of metal-oxide-semiconductor FET (MOSFET), metal-electrical insulator-semiconductor FET (MISFET), a metal semiconductor field effect transistor (MESFET), a high electron mobility transistor (HEMT), or a modulation doped FET (MODFET).

13. The self-aligned optical modulator of claim 1, wherein said modulation of the propagation constant level phase modulates the input optical signal.

14. The self-aligned optical modulator of claim 1, wherein said modulation of the propagation constant level amplitude modulates the input optical signal.

15. The self-aligned optical modulator of claim 14, wherein said modulation of the propagation constant level attenuates the input optical signal.

16. The self-aligned optical modulator of claim 1 or 10, wherein the 2DEG is oriented in a plane that is substantially parallel to said length.

17. The self-aligned optical modulator of claim 1, further comprising a metal oxide semiconductor capacitor (MOSCAP) portion.

18. The self-aligned optical modulator of claim 1, further comprising a lens that focuses light passing through the first deflector and the second deflector towards the optical modulator device.

19. The self-aligned optical modulator of claim 1, further comprising a lens that focuses light flowing from the optical modulator device to the output port.

20. The self-aligned optical modulator of claim 18 or 19, wherein said lens comprises:

a first focusing electrode;

a second focusing electrode;

a two-dimensional electron (hole) gas (2DEG) proximate the first focusing electrode and having a free carrier distribution that is formed when a focusing voltage is applied between the first and second focusing electrodes;

wherein variation of the focusing voltage causes a corresponding change in the free carrier distribution of the 2DEG proximate the first focusing electrode and an adjustment of focusing characteristics of the lens.

21. The self-aligned optical modulator of claim 20, wherein said optical modulator device and said lens are disposed on a common semiconductor substrate.

22. The self-aligned optical modulator of claim 21, wherein said lens further comprises a region of focusing propagation constant, wherein variation of the focusing voltage causes a corresponding adjustment of a propagation constant level in the region of focusing propagation constant.

23. The self-aligned optical modulator of claim 22, wherein the region of focusing propagation constant is disposed along a second length of the waveguide between the input port and the output port.

24. The self-aligned optical modulator of claim 23, wherein the waveguide is a slab waveguide.

25. The self-aligned optical modulator of claim 1, wherein the free-carrier distribution of the 2DEG layer is varied by changing the modulating voltage applied to the first modulating electrode, and wherein light flowing through the waveguide is controllably attenuated in response to the voltage applied to the first modulating electrode.

26. A self-aligned optical modulator for modulating the propagation constant level of an optical modulating region of a waveguide, comprising:
- an optical modulator device including a waveguide, a gate electrode, and a voltage source, the gate electrode having a prescribed electrode shape positioned proximate the waveguide;
- a voltage source connected to the gate electrode for applying voltage to the gate electrode, wherein the voltage causes the gate electrode to project into the waveguide a region of modulating propagation constant, said region of modulating propagation constant corresponding generally in shape to the prescribed electrode shape and modulating light flowing through the waveguide;
- a first deflector configured to deflect light in a first lateral direction within the waveguide;
- a second deflector configured to deflect light in a second lateral direction within the waveguide wherein the deflection of the first deflector or the second deflector acts to direct light approaching the region of modulating propagation constant towards the region of modulating propagation constant; and
- a controller that controls a propagation constant level of the region of modulating propagation constant by varying the voltage applied to the gate electrode to modulate light flowing through the waveguide, the controller also controls operation of the first deflector and the second deflector.

27. The self-aligned optical modulator of claim 26, wherein said propagation constant level modulation phase modulates the input optical signal.

28. The self-aligned optical modulator of claim 26, wherein said propagation constant level modulation amplitude modulates the input optical signal.

29. The self-aligned optical modulator of claim 28, wherein said propagation constant level modulation attenuates the input optical signal.

30. The self-aligned optical modulator of claim 26, wherein a 2DEG is oriented in a plane that is substantially parallel to the region of modulating propagation constant.

31. The self-aligned optical modulator of claim 26, further comprising a field effect transistor (FET) portion including a source electrode and a drain electrode.

32. The self-aligned optical modulator of claim 31, wherein the FET is from one of the group of metal-oxide-semiconductor FET (MOSFET), metal-electrical insulator-semiconductor FET (MISFET), a metal semiconductor field effect transistor (MESFET), a high electron mobility transistor (HEMT), or a modulation doped FET (MODFET).

33. The self-aligned optical modulator of claim 26, further comprising one or more body contact electrode(s) positioned relative to the waveguide and electrically integrated with an active semiconductor.

34. The self-aligned optical modulator of claim 33, further comprising a metal oxide semiconductor capacitor (MOSCAP) portion that includes the body contact electrode.

35. The self-aligned optical modulator of claim 33, wherein the body contact electrode includes a first body contact electrode and a second body contact electrode, the first body contact electrode, the gate electrode, and the second body contact electrode are located above the waveguide.

36. The self-aligned optical modulator of claim 35, wherein the first body contact electrode is located on an opposed side of the gate electrode from the second body contact electrode, and wherein the waveguide comprises any group III or group V semiconductor.

37. The self-aligned optical modulator of claim 26, further comprising a lens that focuses light passing through the first deflector and the second deflector towards the optical modulator device.

38. The self-aligned optical modulator of claim 26, wherein a free-carrier distribution of a 2DEG layer is varied by changing the voltage applied to the gate electrode, and wherein light flowing through the waveguide is controllably attenuated in response to the voltage applied to the gate electrode.

39. The self-aligned optical modulator of claim 26, further comprising an optical device coupled with a variable coupling to the self-aligned optical modulator.

40. A method for self-aligned optical modulation comprising:
- positioning a planar electrode proximate a waveguide;
- projecting a region of modulating propagation constant into a waveguide that substantially corresponds in shape to a shape of the planar electrode, by applying a voltage to the planar electrode;
- providing for the deflection of light in a first lateral direction within the waveguide;
- providing for the deflection of light in a second lateral direction within the waveguide, wherein the deflection in the first lateral direction or the second lateral direction acts to direct light approaching the region of modulating propagation constant towards the region of modulating propagation constant; and
- controlling a propagation constant level of the region of modulating propagation constant by varying the voltage to control the modulation of light flowing through the waveguide, and controlling the deflection of light in the first lateral direction or the second lateral direction.

41. The method of claim 40, wherein said modulation of the propagation constant level phase modulates an input optical signal.

42. The method of claim 40, wherein said modulation of the propagation constant level amplitude modulates the input optical signal.

43. The method of claim 42, wherein said modulation of the propagation constant level attenuates the input optical signal.

44. The method of claim 40, further comprising a 2DEG located between the planar electrode and a body contact electrode, wherein the 2DEG is oriented in a plane that is substantially parallel to a length of the region of modulating propagation constant.

45. The method of claim 44, wherein the free-carrier distribution of the 2DEG layer is modulated by changing the voltage applied to the planar electrode, and wherein light flowing through the waveguide is controllably modulated in response to modulating the free-carrier distribution of the 2DEG layer.

46. The method of claim 40, further comprising a field effect transistor (FET) portion including a planar electrode.

47. The method of claim 46, wherein the FET is from one of the group of metal-oxide-semiconductor FET (MOSFET), metal-electrical insulator-semiconductor FET (MISFET), a metal semiconductor field effect transistor (MESFET), a high electron mobility transistor (HEMT), or a modulation doped FET (MODFET).

48. The method of claim 40, further comprising one or more body contact electrode(s) positioned relative to the waveguide and electrically integrated with the active semiconductor.

49. The method of claim 48, further comprising a metal oxide semiconductor capacitor (MOSCAP) portion including the body contact electrode.

50. The method of claim 48, wherein the body contact electrode is positioned below the waveguide.

51. The method of claim 48, wherein the body contact electrode includes a first body contact electrode and a second body contact electrode, the first body contact electrode, the planar electrode, and the second body contact electrode are located above the waveguide; and the first body contact electrode is located on an opposed side of the planar electrode from the second body contact electrode.

52. The method of claim 40, wherein the waveguide comprises any group III or group V semiconductor.

53. The method of claim 40, further comprising an optical device coupled with a variable coupling to the self-aligned optical modulator.

54. A computer readable medium containing software that controls a planar electrode having a prescribed shape positioned proximate a waveguide, said software when executed by a processor causes the processor to perform the steps of:
project a region of modulating propagation constant into the waveguide that corresponds in shape to a shape of an electrode, by applying a voltage to the electrode; and
providing for the deflection of light in a first lateral direction within the waveguide;
providing for the deflection of light in a second lateral direction within the waveguide, wherein the deflection in the first lateral direction or the second lateral direction acts to direct light approaching the region of modulating propagation constant towards the region of modulating propagation constant; and
controlling a propagation constant level of the region of modulating propagation constant by varying the voltage to control the modulation of light flowing through the waveguide, and controlling the deflection of light in the first lateral direction or the second lateral direction.

55. The computer readable medium of claim 54, wherein said modulation of the propagation constant level phase modulates the input optical signal.

56. A self-aligned optical modulator for modulating light flowing through a waveguide by modulation of a propagation constant level of the waveguide, the self-aligned optical modulator comprising:
a region of modulating propagation constant disposed along a length of the waveguide and defining a region where light is modulated, wherein light is guided within the waveguide by total internal reflection, and the waveguide is formed at least in part from an active semiconductor;
a Field Effect Transistor portion (FET portion) including a gate electrode, a source electrode, and a drain electrode; the gate electrode is mounted to, but electrically insulated from, the active semiconductor, the drain electrode and the source electrode are held at a substantially common voltage, wherein the gate electrode, the source electrode, and the drain electrode are positioned substantially above the waveguide, the source electrode is located on a substantially opposed side of the gate electrode from the drain electrode;
a two-dimensional electron (hole) gas (2DEG) having a free carrier distribution that is formed on the first surface when a voltage is applied between the gate electrode and the common voltage;
a voltage source connected to the gate electrode for applying the voltage to the gate electrode, wherein the gate electrode projects the region of modulating propagation constant into the waveguide;
a first deflector configured to deflect light in a first lateral direction within the waveguide;
a second deflector configured to deflect light in a second lateral direction within the waveguide wherein the deflection of the first deflector or the second deflector acts to direct light approaching the region of modulating propagation constant towards the region of modulating propagation constant; and
a controller that controls the propagation constant level of the region of modulating propagation constant by varying the voltage applied to the gate electrode to modulate light flowing through the waveguide, the controller also controls the operation of the first deflector and the second deflector.

57. An apparatus for modulating an input optical signal in order to generate a modulated output optical signal, comprising:
a planar electrode positioned proximate the waveguide;
means for modulating a region of modulating propagation constant in the waveguide that substantially corresponds in shape to a shape of the planar electrode, by applying a voltage to the planar electrode; and
means for providing for the deflection of light in a first lateral direction within the waveguide;
means for providing for the deflection of light in a second lateral direction within the waveguide, wherein the deflection in the first lateral direction or the second lateral direction acts to direct light approaching the region of modulating propagation constant towards the region of modulating propagation constant; and
means for controlling a propagation constant level of the region of modulating propagation constant by varying the voltage to control the modulation of light flowing through the waveguide, and controlling the deflection of light in the first lateral direction or the second lateral direction.

* * * * *